United States Patent
Lochtefeld

(10) Patent No.: US 9,231,073 B2
(45) Date of Patent: Jan. 5, 2016

(54) DIODE-BASED DEVICES AND METHODS FOR MAKING THE SAME

(71) Applicant: Taiwan Semiconductor Manufacturing Company, Ltd., Hsin-Chu (TW)

(72) Inventor: Anthony J. Lochtefeld, Ipswich, MA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/675,277

(22) Filed: Mar. 31, 2015

(65) Prior Publication Data

US 2015/0255566 A1    Sep. 10, 2015

Related U.S. Application Data

(62) Division of application No. 13/554,516, filed on Jul. 20, 2012, now Pat. No. 9,040,331, which is a division of application No. 12/684,797, filed on Jan. 8, 2010, now Pat. No. 8,237,151.

(60) Provisional application No. 61/143,589, filed on Jan. 9, 2009.

(51) Int. Cl.
  *H01L 33/40* (2010.01)
  *H01L 29/66* (2006.01)

(52) U.S. Cl.
  CPC .................... *H01L 29/6609* (2013.01)

(58) Field of Classification Search
  CPC ............ H01L 21/02381; H01L 21/02647; H01L 21/8252; H01L 21/76224; H01L 33/16
  USPC ........ 257/97, 103, 190, 617, 14, 431; 438/44, 438/143
  See application file for complete search history.

(56) References Cited

U.S. PATENT DOCUMENTS 4,307,510 A   12/1981  Sawyer et al.
4,322,253 A    3/1982  Pankove et al.
(Continued)

FOREIGN PATENT DOCUMENTS

CN    2550906     5/2003
DE   10017137   10/2000
(Continued)

OTHER PUBLICATIONS

Kwok K. Ng, "Resonant-Tunneling Diode," Complete Guide to Semiconductor Devices, Chapter 10. Nov. 3, 2010, pp. 75-83.
(Continued)

*Primary Examiner* — Kenneth Parker
*Assistant Examiner* — Bo Fan
(74) *Attorney, Agent, or Firm* — Slater & Matsil, L.L.P.

(57) ABSTRACT

In accordance with an embodiment, a diode comprises a substrate, a dielectric material including an opening that exposes a portion of the substrate, the opening having an aspect ratio of at least 1, a bottom diode material including a lower region disposed at least partly in the opening and an upper region extending above the opening, the bottom diode material comprising a semiconductor material that is lattice mismatched to the substrate, a top diode material proximate the upper region of the bottom diode material, and an active diode region between the top and bottom diode materials, the active diode region including a surface extending away from the top surface of the substrate.

20 Claims, 39 Drawing Sheets

(56) References Cited

U.S. PATENT DOCUMENTS

| | | |
|---|---|---|
| 4,370,510 A | 1/1983 | Stirn |
| 4,545,109 A | 10/1985 | Reichert |
| 4,551,394 A | 11/1985 | Betsch et al. |
| 4,651,179 A | 3/1987 | Reichert |
| 4,727,047 A | 2/1988 | Bozler et al. |
| 4,774,205 A | 9/1988 | Choi et al. |
| 4,789,643 A | 12/1988 | Kajikawa |
| 4,826,784 A | 5/1989 | Salerno et al. |
| 4,860,081 A | 8/1989 | Cogan |
| 4,876,210 A | 10/1989 | Barnett et al. |
| 4,948,456 A | 8/1990 | Schubert |
| 4,963,508 A | 10/1990 | Umeno et al. |
| 5,032,893 A | 7/1991 | Fitzgerald, Jr. et al. |
| 5,034,337 A | 7/1991 | Mosher et al. |
| 5,061,644 A | 10/1991 | Yue et al. |
| 5,079,616 A | 1/1992 | Yacobi et al. |
| 5,091,333 A | 2/1992 | Fan et al. |
| 5,091,767 A | 2/1992 | Bean et al. |
| 5,093,699 A | 3/1992 | Weichold et al. |
| 5,098,850 A | 3/1992 | Nishida et al. |
| 5,105,247 A | 4/1992 | Cavanaugh |
| 5,108,947 A | 4/1992 | Demeester et al. |
| 5,156,995 A | 10/1992 | Fitzgerald, Jr. et al. |
| 5,159,413 A | 10/1992 | Calviello et al. |
| 5,164,359 A | 11/1992 | Calviello et al. |
| 5,166,767 A | 11/1992 | Kapoor et al. |
| 5,223,043 A | 6/1993 | Olson et al. |
| 5,236,546 A | 8/1993 | Mizutani |
| 5,238,869 A | 8/1993 | Shichijo et al. |
| 5,256,594 A | 10/1993 | Wu et al. |
| 5,269,852 A | 12/1993 | Nishida |
| 5,269,876 A | 12/1993 | Mizutani |
| 5,272,105 A | 12/1993 | Yacobi et al. |
| 5,281,283 A | 1/1994 | Tokunaga et al. |
| 5,285,086 A | 2/1994 | Fitzgerald, Jr. |
| 5,295,150 A | 3/1994 | Vangieson et al. |
| 5,356,831 A | 10/1994 | Calviello et al. |
| 5,403,751 A | 4/1995 | Nishida et al. |
| 5,405,453 A | 4/1995 | Ho et al. |
| 5,407,491 A | 4/1995 | Freundlich et al. |
| 5,410,167 A | 4/1995 | Saito |
| 5,417,180 A | 5/1995 | Nakamura |
| 5,427,976 A | 6/1995 | Koh et al. |
| 5,432,120 A | 7/1995 | Meister et al. |
| 5,438,018 A | 8/1995 | Mori et al. |
| 5,461,243 A | 10/1995 | Ek et al. |
| 5,518,953 A | 5/1996 | Takasu |
| 5,528,209 A | 6/1996 | MacDonald et al. |
| 5,545,586 A | 8/1996 | Koh |
| 5,548,129 A | 8/1996 | Kubena |
| 5,589,696 A | 12/1996 | Baba |
| 5,621,227 A | 4/1997 | Joshi |
| 5,622,891 A | 4/1997 | Saito |
| 5,640,022 A | 6/1997 | Inai |
| 5,710,436 A | 1/1998 | Tanamoto et al. |
| 5,717,709 A | 2/1998 | Sasaki et al. |
| 5,792,679 A | 8/1998 | Nakato |
| 5,825,049 A | 10/1998 | Simmons et al. |
| 5,825,240 A | 10/1998 | Geis et al. |
| 5,849,077 A | 12/1998 | Kenney |
| 5,853,497 A | 12/1998 | Lillington et al. |
| 5,869,845 A | 2/1999 | Vander Wagt et al. |
| 5,883,549 A | 3/1999 | De Los Santos |
| 5,886,385 A | 3/1999 | Arisumi et al. |
| 5,903,170 A | 5/1999 | Kulkarni et al. |
| 5,953,361 A | 9/1999 | Borchert et al. |
| 5,959,308 A | 9/1999 | Shichijo et al. |
| 5,966,620 A | 10/1999 | Sakaguchi et al. |
| 5,998,781 A | 12/1999 | Vawter et al. |
| 6,011,271 A | 1/2000 | Sakuma et al. |
| 6,015,979 A | 1/2000 | Sugiura et al. |
| 6,049,098 A | 4/2000 | Sato |
| 6,083,598 A | 7/2000 | Ohkubo et al. |
| 6,100,106 A | 8/2000 | Yamaguchi et al. |
| 6,110,813 A | 8/2000 | Ota et al. |
| 6,111,288 A | 8/2000 | Watanabe et al. |
| 6,121,542 A | 9/2000 | Shiotsuka et al. |
| 6,150,242 A | 11/2000 | Van de Wagt et al. |
| 6,153,010 A | 11/2000 | Kiyoku et al. |
| 6,191,432 B1 | 2/2001 | Sugiyama et al. |
| 6,225,650 B1 | 5/2001 | Tadatomo et al. |
| 6,228,691 B1 | 5/2001 | Doyle |
| 6,229,153 B1 | 5/2001 | Botez et al. |
| 6,235,547 B1 | 5/2001 | Sakuma et al. |
| 6,252,261 B1 | 6/2001 | Usui et al. |
| 6,252,287 B1 | 6/2001 | Kurtz et al. |
| 6,271,551 B1 | 8/2001 | Schmitz et al. |
| 6,274,889 B1 | 8/2001 | Ota et al. |
| 6,300,650 B1 | 10/2001 | Sato |
| 6,320,220 B1 | 11/2001 | Watanabe et al. |
| 6,325,850 B1 | 12/2001 | Beaumont et al. |
| 6,339,232 B1 | 1/2002 | Takagi |
| 6,342,404 B1 | 1/2002 | Shibata et al. |
| 6,348,096 B1 | 2/2002 | Sunakawa et al. |
| 6,352,942 B1 | 3/2002 | Luan et al. |
| 6,362,071 B1 | 3/2002 | Nguyen et al. |
| 6,380,051 B1 | 4/2002 | Yuasa et al. |
| 6,380,590 B1 | 4/2002 | Yu |
| 6,403,451 B1 | 6/2002 | Linthicum et al. |
| 6,407,425 B1 | 6/2002 | Babcock et al. |
| 6,456,214 B1 | 9/2002 | van de Wagt |
| 6,458,614 B1 | 10/2002 | Nanishi et al. |
| 6,475,869 B1 | 11/2002 | Yu |
| 6,492,216 B1 | 12/2002 | Yeo et al. |
| 6,500,257 B1 | 12/2002 | Wang et al. |
| 6,503,610 B2 | 1/2003 | Hiramatsu et al. |
| 6,512,252 B1 | 1/2003 | Takagi et al. |
| 6,521,514 B1 | 2/2003 | Gehrke et al. |
| 6,552,259 B1 | 4/2003 | Hosomi et al. |
| 6,566,284 B2 | 5/2003 | Thomas, III et al. |
| 6,576,532 B1 | 6/2003 | Jones et al. |
| 6,579,463 B1 | 6/2003 | Winningham et al. |
| 6,603,172 B1 | 8/2003 | Segawa et al. |
| 6,606,335 B1 | 8/2003 | Kuramata et al. |
| 6,617,643 B1 | 9/2003 | Goodwin-Johansson |
| 6,635,110 B1 | 10/2003 | Luan et al. |
| 6,645,295 B1 | 11/2003 | Koike et al. |
| 6,645,797 B1 | 11/2003 | Buynoski et al. |
| 6,686,245 B1 | 2/2004 | Mathew et al. |
| 6,703,253 B2 | 3/2004 | Koide |
| 6,709,982 B1 | 3/2004 | Buynoski et al. |
| 6,710,368 B2 | 3/2004 | Fisher et al. |
| 6,720,196 B2 | 4/2004 | Kunisato et al. |
| 6,727,523 B2 | 4/2004 | Morita |
| 6,753,555 B2 | 6/2004 | Takagi et al. |
| 6,756,611 B2 | 6/2004 | Kiyoku et al. |
| 6,762,483 B1 | 7/2004 | Krivokapic et al. |
| 6,767,793 B2 | 7/2004 | Clark et al. |
| 6,784,074 B2 | 8/2004 | Shchukin et al. |
| 6,787,864 B2 | 9/2004 | Paton et al. |
| 6,794,718 B2 | 9/2004 | Nowak et al. |
| 6,800,910 B2 | 10/2004 | Lin et al. |
| 6,803,598 B1 | 10/2004 | Berger et al. |
| 6,809,351 B2 | 10/2004 | Kuramoto et al. |
| 6,812,053 B1 | 11/2004 | Kong et al. |
| 6,812,495 B2 | 11/2004 | Wada et al. |
| 6,815,241 B2 | 11/2004 | Wang |
| 6,815,738 B2 | 11/2004 | Rim |
| 6,825,534 B2 | 11/2004 | Chen et al. |
| 6,831,350 B1 | 12/2004 | Liu et al. |
| 6,835,246 B2 | 12/2004 | Zaidi |
| 6,835,618 B1 | 12/2004 | Dakshina-Murthy et al. |
| 6,838,322 B2 | 1/2005 | Pham et al. |
| 6,841,410 B2 | 1/2005 | Sasaoka |
| 6,841,808 B2 | 1/2005 | Shibata et al. |
| 6,849,077 B2 | 2/2005 | Ricci |
| 6,849,487 B2 | 2/2005 | Taylor, Jr. et al. |
| 6,849,884 B2 | 2/2005 | Clark et al. |
| 6,855,583 B1 | 2/2005 | Krivokapic et al. |
| 6,855,982 B1 | 2/2005 | Xiang et al. |
| 6,855,990 B2 | 2/2005 | Yeo et al. |
| 6,867,433 B2 | 3/2005 | Yeo et al. |
| 6,873,009 B2 | 3/2005 | Hisamoto et al. |
| 6,882,051 B2 | 4/2005 | Majumdar et al. |

(56) References Cited

U.S. PATENT DOCUMENTS

| | | | |
|---|---|---|---|
| 6,887,773 | B2 | 5/2005 | Gunn, III et al. |
| 6,888,181 | B1 | 5/2005 | Liao et al. |
| 6,900,070 | B2 | 5/2005 | Craven et al. |
| 6,900,502 | B2 | 5/2005 | Ge et al. |
| 6,902,965 | B2 | 6/2005 | Ge et al. |
| 6,902,991 | B2 | 6/2005 | Xiang et al. |
| 6,909,186 | B2 | 6/2005 | Chu |
| 6,917,068 | B1 | 7/2005 | Krivokapic |
| 6,919,258 | B2 | 7/2005 | Grant et al. |
| 6,920,159 | B2 | 7/2005 | Sidorin et al. |
| 6,921,673 | B2 | 7/2005 | Kobayashi et al. |
| 6,921,963 | B2 | 7/2005 | Krivokapic et al. |
| 6,921,982 | B2 | 7/2005 | Joshi et al. |
| 6,936,875 | B2 | 8/2005 | Sugii et al. |
| 6,943,407 | B2 | 9/2005 | Ouyang et al. |
| 6,946,683 | B2 | 9/2005 | Sano et al. |
| 6,949,769 | B2 | 9/2005 | Hu et al. |
| 6,951,819 | B2 | 10/2005 | Iles et al. |
| 6,955,969 | B2 | 10/2005 | Djomehri et al. |
| 6,955,977 | B2 | 10/2005 | Kong et al. |
| 6,958,254 | B2 | 10/2005 | Seifert |
| 6,960,781 | B2 | 11/2005 | Currie et al. |
| 6,974,733 | B2 | 12/2005 | Boyanov et al. |
| 6,977,194 | B2 | 12/2005 | Belyansky et al. |
| 6,982,204 | B2 | 1/2006 | Saxler et al. |
| 6,982,435 | B2 | 1/2006 | Shibata et al. |
| 6,984,571 | B1 | 1/2006 | Enquist |
| 6,991,998 | B2 | 1/2006 | Bedell et al. |
| 6,994,751 | B2 | 2/2006 | Hata et al. |
| 6,995,430 | B2 | 2/2006 | Langdo et al. |
| 6,995,456 | B2 | 2/2006 | Nowak |
| 6,996,147 | B2 | 2/2006 | Majumdar et al. |
| 6,998,684 | B2 | 2/2006 | Anderson et al. |
| 7,001,804 | B2 | 2/2006 | Dietz et al. |
| 7,002,175 | B1 | 2/2006 | Singh et al. |
| 7,012,298 | B1 | 3/2006 | Krivokapic |
| 7,012,314 | B2 | 3/2006 | Bude et al. |
| 7,015,497 | B1 | 3/2006 | Berger |
| 7,015,517 | B2 | 3/2006 | Grant et al. |
| 7,033,436 | B2 | 4/2006 | Biwa et al. |
| 7,033,936 | B1 | 4/2006 | Green |
| 7,041,178 | B2 | 5/2006 | Tong et al. |
| 7,045,401 | B2 | 5/2006 | Lee et al. |
| 7,049,627 | B2 | 5/2006 | Vineis et al. |
| 7,061,065 | B2 | 6/2006 | Horng et al. |
| 7,074,623 | B2 | 7/2006 | Lochtefeld et al. |
| 7,078,299 | B2 | 7/2006 | Maszara et al. |
| 7,078,731 | B2 | 7/2006 | D'Evelyn et al. |
| 7,084,051 | B2 | 8/2006 | Ueda |
| 7,084,441 | B2 | 8/2006 | Saxler |
| 7,087,965 | B2 | 8/2006 | Chan et al. |
| 7,088,143 | B2 | 8/2006 | Ding et al. |
| 7,091,561 | B2 | 8/2006 | Matsushita et al. |
| 7,095,043 | B2 | 8/2006 | Oda et al. |
| 7,098,508 | B2 | 8/2006 | Ieong et al. |
| 7,101,444 | B2 | 9/2006 | Shchukin et al. |
| 7,109,516 | B2 | 9/2006 | Langdo et al. |
| 7,118,987 | B2 | 10/2006 | Fu et al. |
| 7,119,402 | B2 | 10/2006 | Kinoshita et al. |
| 7,122,733 | B2 | 10/2006 | Narayanan et al. |
| 7,125,785 | B2 | 10/2006 | Cohen et al. |
| 7,128,846 | B2 | 10/2006 | Nishijima et al. |
| 7,132,691 | B1 | 11/2006 | Tanabe et al. |
| 7,138,292 | B2 | 11/2006 | Mirabedini et al. |
| 7,138,302 | B2 | 11/2006 | Xiang et al. |
| 7,145,167 | B1 | 12/2006 | Chu |
| 7,154,118 | B2 | 12/2006 | Lindert et al. |
| 7,160,753 | B2 | 1/2007 | Williams, Jr. |
| 7,164,183 | B2 | 1/2007 | Sakaguchi et al. |
| 7,176,522 | B2 | 2/2007 | Cheng et al. |
| 7,179,727 | B2 | 2/2007 | Capewell et al. |
| 7,180,134 | B2 | 2/2007 | Yang et al. |
| 7,195,993 | B2 | 3/2007 | Zheleva et al. |
| 7,198,995 | B2 | 4/2007 | Chidambarrao et al. |
| 7,205,586 | B2 | 4/2007 | Takagi et al. |
| 7,205,604 | B2 | 4/2007 | Ouyang et al. |
| 7,211,864 | B2 | 5/2007 | Seliskar |
| 7,217,882 | B2 | 5/2007 | Walukiewicz et al. |
| 7,224,033 | B2 | 5/2007 | Zhu et al. |
| 7,244,958 | B2 | 7/2007 | Shang et al. |
| 7,247,534 | B2 | 7/2007 | Chidambarrao et al. |
| 7,247,912 | B2 | 7/2007 | Zhu et al. |
| 7,250,359 | B2 | 7/2007 | Fitzgerald |
| 7,262,117 | B1 | 8/2007 | Gunn, III et al. |
| 7,268,058 | B2 | 9/2007 | Chau et al. |
| 7,297,569 | B2 | 11/2007 | Bude et al. |
| 7,344,942 | B2 | 3/2008 | Korber |
| 7,361,576 | B2 | 4/2008 | Imer et al. |
| 7,372,066 | B2 | 5/2008 | Sato et al. |
| 7,420,201 | B2 | 9/2008 | Langdo et al. |
| 7,449,379 | B2 | 11/2008 | Ochimizu et al. |
| 7,582,498 | B2 | 9/2009 | D'Evelyn et al. |
| 7,626,246 | B2 | 12/2009 | Lochtefeld et al. |
| 7,638,842 | B2 | 12/2009 | Currie et al. |
| 7,655,960 | B2 | 2/2010 | Nakahata et al. |
| 7,777,250 | B2 | 8/2010 | Lochtefeld |
| 7,799,592 | B2 | 9/2010 | Lochtefeld |
| 7,825,328 | B2 | 11/2010 | Li |
| 7,875,958 | B2 | 1/2011 | Cheng et al. |
| 8,034,697 | B2 | 10/2011 | Fiorenza et al. |
| 2001/0006249 | A1 | 7/2001 | Fitzgerald |
| 2001/0045604 | A1 | 11/2001 | Oda et al. |
| 2002/0011612 | A1 | 1/2002 | Hieda |
| 2002/0017642 | A1 | 2/2002 | Mizushima et al. |
| 2002/0022290 | A1 | 2/2002 | Kong et al. |
| 2002/0030246 | A1 | 3/2002 | Eisenbeiser et al. |
| 2002/0036290 | A1 | 3/2002 | Inaba et al. |
| 2002/0046693 | A1 | 4/2002 | Kiyoku et al. |
| 2002/0047155 | A1 | 4/2002 | Babcock et al. |
| 2002/0066403 | A1 | 6/2002 | Sunakawa et al. |
| 2002/0070383 | A1 | 6/2002 | Shibata et al. |
| 2002/0084000 | A1 | 7/2002 | Fitzgerald |
| 2002/0127427 | A1 | 9/2002 | Young et al. |
| 2002/0168802 | A1 | 11/2002 | Hsu et al. |
| 2002/0168844 | A1 | 11/2002 | Kuramoto et al. |
| 2002/0179005 | A1 | 12/2002 | Koike et al. |
| 2003/0030117 | A1 | 2/2003 | Iwasaki et al. |
| 2003/0045017 | A1 | 3/2003 | Hiramatsu et al. |
| 2003/0057486 | A1 | 3/2003 | Gambino et al. |
| 2003/0064535 | A1 | 4/2003 | Kub et al. |
| 2003/0070707 | A1 | 4/2003 | King et al. |
| 2003/0087462 | A1 | 5/2003 | Koide et al. |
| 2003/0089899 | A1 | 5/2003 | Lieber et al. |
| 2003/0155586 | A1 | 8/2003 | Koide et al. |
| 2003/0168002 | A1 | 9/2003 | Zaidi |
| 2003/0178677 | A1 | 9/2003 | Clark et al. |
| 2003/0178681 | A1 | 9/2003 | Clark et al. |
| 2003/0183827 | A1 | 10/2003 | Kawaguchi et al. |
| 2003/0203531 | A1 | 10/2003 | Shchukin et al. |
| 2003/0207518 | A1 | 11/2003 | Kong et al. |
| 2003/0227036 | A1 | 12/2003 | Sugiyama et al. |
| 2003/0230759 | A1 | 12/2003 | Thomas, III et al. |
| 2004/0005740 | A1 | 1/2004 | Lochtefeld et al. |
| 2004/0012037 | A1 | 1/2004 | Venkatesan et al. |
| 2004/0016921 | A1 | 1/2004 | Botez et al. |
| 2004/0031979 | A1 | 2/2004 | Lochtefeld et al. |
| 2004/0041932 | A1 | 3/2004 | Chao et al. |
| 2004/0043584 | A1 | 3/2004 | Thomas et al. |
| 2004/0072410 | A1 | 4/2004 | Motoki et al. |
| 2004/0075105 | A1 | 4/2004 | Leitz et al. |
| 2004/0075464 | A1 | 4/2004 | Samuelson et al. |
| 2004/0082150 | A1 | 4/2004 | Kong et al. |
| 2004/0087051 | A1 | 5/2004 | Furuya et al. |
| 2004/0092060 | A1 | 5/2004 | Gambino et al. |
| 2004/0118451 | A1 | 6/2004 | Walukiewicz et al. |
| 2004/0121507 | A1 | 6/2004 | Bude et al. |
| 2004/0123796 | A1 | 7/2004 | Nagai et al. |
| 2004/0142503 | A1 | 7/2004 | Lee et al. |
| 2004/0150001 | A1 | 8/2004 | Shchukin et al. |
| 2004/0155249 | A1 | 8/2004 | Narui et al. |
| 2004/0173812 | A1 | 9/2004 | Currie et al. |
| 2004/0183078 | A1 | 9/2004 | Wang |
| 2004/0185665 | A1 | 9/2004 | Kishimoto et al. |
| 2004/0188791 | A1 | 9/2004 | Horng et al. |

(56) References Cited

U.S. PATENT DOCUMENTS

| | | |
|---|---|---|
| 2004/0195624 A1 | 10/2004 | Liu et al. |
| 2004/0227187 A1 | 11/2004 | Cheng et al. |
| 2004/0247218 A1 | 12/2004 | Ironside et al. |
| 2004/0256613 A1 | 12/2004 | Oda et al. |
| 2004/0256647 A1 | 12/2004 | Lee et al. |
| 2004/0262617 A1 | 12/2004 | Hahm et al. |
| 2005/0001216 A1 | 1/2005 | Adkisson et al. |
| 2005/0003572 A1 | 1/2005 | Hahn et al. |
| 2005/0009304 A1 | 1/2005 | Zheleva et al. |
| 2005/0017351 A1 | 1/2005 | Ravi |
| 2005/0035410 A1 | 2/2005 | Yeo et al. |
| 2005/0040444 A1 | 2/2005 | Cohen |
| 2005/0045983 A1 | 3/2005 | Noda et al. |
| 2005/0054164 A1 | 3/2005 | Xiang |
| 2005/0054180 A1 | 3/2005 | Han et al. |
| 2005/0056827 A1 | 3/2005 | Li et al. |
| 2005/0056892 A1 | 3/2005 | Seliskar |
| 2005/0072995 A1 | 4/2005 | Anthony |
| 2005/0073028 A1 | 4/2005 | Grant et al. |
| 2005/0093021 A1 | 5/2005 | Ouyang et al. |
| 2005/0093154 A1 | 5/2005 | Kottantharayil et al. |
| 2005/0098789 A1* | 5/2005 | Kozaki ............... 257/97 |
| 2005/0104152 A1 | 5/2005 | Snyder et al. |
| 2005/0104156 A1 | 5/2005 | Wasshuber |
| 2005/0118793 A1 | 6/2005 | Snyder et al. |
| 2005/0118825 A1 | 6/2005 | Nishijima et al. |
| 2005/0121688 A1 | 6/2005 | Nagai et al. |
| 2005/0127451 A1 | 6/2005 | Tsuchiya et al. |
| 2005/0136626 A1 | 6/2005 | Morse |
| 2005/0139860 A1 | 6/2005 | Snyder et al. |
| 2005/0145941 A1 | 7/2005 | Bedell et al. |
| 2005/0145954 A1 | 7/2005 | Zhu et al. |
| 2005/0148161 A1 | 7/2005 | Chen et al. |
| 2005/0156169 A1 | 7/2005 | Chu |
| 2005/0156202 A1 | 7/2005 | Rhee et al. |
| 2005/0161711 A1 | 7/2005 | Chu |
| 2005/0164475 A1 | 7/2005 | Peckerar et al. |
| 2005/0181549 A1 | 8/2005 | Barr et al. |
| 2005/0184302 A1 | 8/2005 | Kobayashi et al. |
| 2005/0205859 A1 | 9/2005 | Currie et al. |
| 2005/0205932 A1 | 9/2005 | Cohen |
| 2005/0211291 A1 | 9/2005 | Bianchi |
| 2005/0212051 A1 | 9/2005 | Jozwiak et al. |
| 2005/0217565 A1 | 10/2005 | Lahreche et al. |
| 2005/0245095 A1 | 11/2005 | Haskell et al. |
| 2005/0263751 A1 | 12/2005 | Hall et al. |
| 2005/0274409 A1 | 12/2005 | Fetzer et al. |
| 2005/0280103 A1 | 12/2005 | Langdo et al. |
| 2006/0009012 A1 | 1/2006 | Leitz et al. |
| 2006/0019462 A1 | 1/2006 | Cheng et al. |
| 2006/0049409 A1 | 3/2006 | Rafferty et al. |
| 2006/0057825 A1 | 3/2006 | Bude et al. |
| 2006/0073681 A1 | 4/2006 | Han |
| 2006/0105533 A1 | 5/2006 | Chong et al. |
| 2006/0112986 A1 | 6/2006 | Atwater, Jr. et al. |
| 2006/0113603 A1 | 6/2006 | Currie |
| 2006/0128124 A1 | 6/2006 | Haskell et al. |
| 2006/0131606 A1 | 6/2006 | Cheng |
| 2006/0144435 A1 | 7/2006 | Wanlass |
| 2006/0145264 A1 | 7/2006 | Chidambarrao et al. |
| 2006/0160291 A1 | 7/2006 | Lee et al. |
| 2006/0162768 A1 | 7/2006 | Wanlass et al. |
| 2006/0166437 A1 | 7/2006 | Korber |
| 2006/0169987 A1 | 8/2006 | Miura et al. |
| 2006/0175601 A1 | 8/2006 | Lieber et al. |
| 2006/0186510 A1 | 8/2006 | Lochtefeld et al. |
| 2006/0189056 A1 | 8/2006 | Ko et al. |
| 2006/0197123 A1 | 9/2006 | Lochtefeld et al. |
| 2006/0197124 A1 | 9/2006 | Lochtefeld et al. |
| 2006/0197126 A1 | 9/2006 | Lochtefeld et al. |
| 2006/0202276 A1 | 9/2006 | Kato |
| 2006/0205197 A1 | 9/2006 | Yi et al. |
| 2006/0211210 A1 | 9/2006 | Bhat et al. |
| 2006/0266281 A1 | 11/2006 | Beaumont et al. |
| 2006/0267047 A1 | 11/2006 | Murayama |
| 2006/0292719 A1 | 12/2006 | Lochtefeld et al. |
| 2007/0025670 A1 | 2/2007 | Pan et al. |
| 2007/0029643 A1 | 2/2007 | Johnson et al. |
| 2007/0054465 A1 | 3/2007 | Currie et al. |
| 2007/0054467 A1 | 3/2007 | Currie et al. |
| 2007/0099315 A1 | 5/2007 | Maa et al. |
| 2007/0099329 A1 | 5/2007 | Maa et al. |
| 2007/0102721 A1 | 5/2007 | DenBaars et al. |
| 2007/0105256 A1 | 5/2007 | Fitzgerald |
| 2007/0105274 A1 | 5/2007 | Fitzgerald |
| 2007/0105335 A1 | 5/2007 | Fitzgerald |
| 2007/0181977 A1 | 8/2007 | Lochtefeld et al. |
| 2007/0187668 A1 | 8/2007 | Noguchi et al. |
| 2007/0187796 A1 | 8/2007 | Rafferty et al. |
| 2007/0196987 A1 | 8/2007 | Chidambarrao et al. |
| 2007/0248132 A1 | 10/2007 | Kikuchi et al. |
| 2007/0267722 A1 | 11/2007 | Lochtefeld et al. |
| 2008/0001169 A1* | 1/2008 | Lochtefeld ............... 257/190 |
| 2008/0070355 A1 | 3/2008 | Lochtefeld et al. |
| 2008/0073641 A1 | 3/2008 | Cheng et al. |
| 2008/0073667 A1 | 3/2008 | Lochtefeld |
| 2008/0093622 A1* | 4/2008 | Li et al. ............... 257/103 |
| 2008/0099785 A1 | 5/2008 | Bai et al. |
| 2008/0154197 A1 | 6/2008 | Derrico et al. |
| 2008/0187018 A1 | 8/2008 | Li |
| 2008/0194078 A1 | 8/2008 | Akiyama et al. |
| 2008/0245400 A1 | 10/2008 | Li |
| 2008/0257409 A1 | 10/2008 | Li et al. |
| 2008/0286957 A1 | 11/2008 | Lee et al. |
| 2009/0039361 A1 | 2/2009 | Li et al. |
| 2009/0042344 A1 | 2/2009 | Ye et al. |
| 2009/0065047 A1 | 3/2009 | Fiorenza et al. |
| 2009/0072284 A1 | 3/2009 | King et al. |
| 2009/0110898 A1 | 4/2009 | Levy et al. |
| 2009/0321882 A1 | 12/2009 | Park |
| 2010/0012976 A1 | 1/2010 | Hydrick et al. |
| 2010/0025683 A1 | 2/2010 | Cheng |
| 2010/0072515 A1 | 3/2010 | Park et al. |
| 2010/0078680 A1 | 4/2010 | Cheng et al. |
| 2010/0176371 A1 | 7/2010 | Lochtefeld |
| 2010/0176375 A1 | 7/2010 | Lochtefeld |
| 2010/0213511 A1 | 8/2010 | Lochtefeld |
| 2010/0216277 A1 | 8/2010 | Fiorenza et al. |
| 2010/0252861 A1 | 10/2010 | Lochtefeld |
| 2010/0308376 A1 | 12/2010 | Takada et al. |
| 2011/0011438 A1 | 1/2011 | Li |
| 2011/0049568 A1 | 3/2011 | Lochtefeld et al. |
| 2011/0062453 A1 | 3/2011 | Armitage |
| 2011/0086498 A1 | 4/2011 | Cheng et al. |

FOREIGN PATENT DOCUMENTS

| | | |
|---|---|---|
| DE | 10320160 | 8/2004 |
| EP | 0352472 | 6/1989 |
| EP | 0600276 | 6/1994 |
| EP | 0817096 | 1/1998 |
| EP | 1551063 | 7/2005 |
| EP | 1796180 | 6/2007 |
| GB | 2215514 | 9/1989 |
| JP | 2062090 | 3/1990 |
| JP | 7230952 | 8/1995 |
| JP | 10126010 | 5/1998 |
| JP | 10284436 | 10/1998 |
| JP | 10284507 | 10/1998 |
| JP | 11251684 | 9/1999 |
| JP | 11307866 | 11/1999 |
| JP | 2000021789 | 1/2000 |
| JP | 2000216432 | 8/2000 |
| JP | 2000286449 | 10/2000 |
| JP | 2000299532 | 10/2000 |
| JP | 2001007447 | 1/2001 |
| JP | 2001102678 | 4/2001 |
| JP | 3202223 | 8/2001 |
| JP | 2001257351 | 9/2001 |
| JP | 2002118255 | 4/2002 |
| JP | 2002141553 | 5/2002 |
| JP | 2002241192 | 8/2002 |
| JP | 2002293698 | 10/2002 |
| JP | 2003163370 | 6/2003 |

(56) References Cited

FOREIGN PATENT DOCUMENTS

| JP | 3515974 | 4/2004 |
|---|---|---|
| JP | 2004200375 | 7/2004 |
| JP | 2009177167 | 8/2009 |
| KR | 20030065631 | 8/2003 |
| KR | 20090010284 | 1/2009 |
| TW | 544930 | 8/2003 |
| WO | WO0072383 | 11/2000 |
| WO | WO0101465 | 1/2001 |
| WO | WO0209187 | 1/2002 |
| WO | WO02086952 | 10/2002 |
| WO | WO02088834 | 11/2002 |
| WO | WO03073517 | 9/2003 |
| WO | WO2004004927 | 1/2004 |
| WO | WO2004023536 | 3/2004 |
| WO | WO2005013375 | 2/2005 |
| WO | WO2005048330 | 5/2005 |
| WO | WO2005098963 | 10/2005 |
| WO | WO2005122267 | 12/2005 |
| WO | WO2006025407 | 3/2006 |
| WO | WO2006125040 | 11/2006 |
| WO | WO2008124154 | 10/2008 |

OTHER PUBLICATIONS

"Communication pursuant to Article 94(3) EPC," Application No. 06 770 525.1-2203, Applicant: Taiwan Semiconductor Company, Ltd., Feb. 17, 2011, 4 pages.
68 Applied Physics Letters 7, 1999, pp. 774-779 (trans. of relevant portions attached).
Ames, "Intel Says More Efficient Chips are Coming," PC World, available at: http://www.pcworld.com/printable/article/id,126044/printable.html (Jun. 12, 2006); 4 pages.
Asano et al., "AlGaInN laser diodes grown on an ELO-GaN substrate vs. on a sapphire substrate," Semiconductor Laser Conference (2000) Conference Digest, IEEE 17$^{th}$ International, 2000, pp. 109-110.
Asaoka, et al., "Observation of 1 f $^x$/noise of GaInP/GaAs triple barrier resonant tunneling diodes," AIP Conf. Proc., vol. 780, Issue 1, 2005, pp. 492-495.
Ashby, et al., "Low-dislocation-density GaN from a single growth on a textured substrate," Applied Physics Letters, vol. 77, No. 20, Nov. 13, 2000, pp. 3233-3235.
Ashley, et al., "Heternogeneous InSb Quantum Well Transistors on Silicon for Ultra-High Speed, Low Power Logic Applications," 43 Electronics Letters Jul. 14, 2007, 2 pages.
Bai et al., "Study of the Defect Elimination Mechanisms in Aspect Ratio Trapping Ge Growth," Applied Physics Letters, vol. 90, 2007, 3 pages.
Bakkers et al., "Epitaxial Growth on InP Nanowires on Germanium," Nature Materials, vol. 3, Nov. 2004, pp. 769-773.
Baron et al., "Chemical Vapor Deposition of Ge Nanocrystals on SiO$_2$," Applied Physics Letters, vol. 83, No. 7, Aug. 18, 2003, pp. 1444-1446.
Bean et al., "Ge$_x$Si$_{1-x}$/Si strained-later Superlattice grown by molecular beam Epitaxy," Journal of Vacuum Science Technology A2 (2), Jun. 1984, pp. 436-440.
Beckett et al., "Towards a reconfigurable nanocomputer platform," ACM International Conference Proceeding Series, vol. 19, 2002, pp. 141-150.
Beltz et al., "A Theoretical Model for Threading Dislocation Reduction During Selective Area Growth," Materials Science and Engineering, A234-236, 1997, pp. 794-797.
Belyaev, et al., "Resonance and current instabilities in Aln/GaN resonant tunneling diodes," 21 Physica E 2-4, 2004, pp. 752-755.
Berg, J., "Electrical Characterization of Silicon Nanogaps," Doktorsavhandlingar vid Chalmers Tekniska Hagskola, 2005, No. 2355, 2 pages.
Bergman et al., "RTD/CMOS Nanoelectronic Circuits: Thin-Film InP-based Resonant Tunneling Diodes Integrated with CMOS circuits," 20 Electron Device Letters 3, 1999, pp. 119-122.

Blakeslee, "The Use of Superlattices to Block the Propagation of Dislocations in Semiconductors," Mat. Res. Soc. Symposium Proceedings 148, 1989, pp. 217-227.
Bogumilowicz et al., "Chemical Vapour Etching of Si, SiGe and Ge with HCL: Applications to the Formation of Thin Relaxed SiGe Buffers and to the Revelation of Threading Dislocations," 20 Semicond. Sci. Tech. 2005, pp. 127-134.
Borland, "Novel Device structures by selective epitaxial growth (SEG)," Electron Devices Meeting, vol. 33, 1987, pp. 12-15.
Bryskiewicz, "Dislocation filtering in SiGe and InGaAs buffer layers grown by selective lateral overgrowth method," Applied Physics Letters, vol. 66, No. 10, Mar. 6, 1995, pp. 1237-1239.
Burenkov et al., "Corner Effect in Double and Triple Gate FinFET5" European solid-state device research, 33rd Conference on Essderc '03 Sep. 16-18, 2003, Piscataway, NJ, USA, IEEE, vol. 16, pp. 135-138, XPo10676716.
Bushroa et al., "Lateral epitaxial overgrowth and reduction in defect density of 3C-SiC on patterned Si substrates," Journal of Crystal Growth, vol. 271, No. 1-2, Oct. 15, 2004, pp. 200-206.
Calado, et al., "Modeling of a resonant tunneling diode optical modulator," University of Algarve, Department of Electronics and Electrical Engineering, 2005, pp. 96-99.
Campo et al., "Comparison of Etching Processes of Silicon and Germanium in SF6-O2 Radio-Frequency Plasma," 13 Journal of Vac. Sci. Tech., B-2, 1995, pp. 235-241.
Cannon et al., "Monolithic Si-based Technology for Optical Receiver Circuits," Proceedings of SPIE, vol. 4999, 2003, pp. 145-155.
Chan et al., "Influence of Metalorganic Sources on the Composition Uniformity of Selectively Grown Ga$_x$In$_{1-x}$P," Japan. Journal of Applied Physics, vol. 33, 1994, pp. 4812-4819.
Chang et al. "3-D simulation of strained Si/SiGe heterojunction FinFET5" Semiconductor Device Research Symposium, Dec. 10-12, 2003, pp. 176-177.
Chang et al., "Effect of growth temperature on epitaxial lateral overgrowth of GaAs on Si substrate," Journal of Crystal Growth, vol. 174, No. 1-4, Apr. 1997, pp. 630-634.
Chang et al., "Epitaxial Lateral Overgrowth of Wide Dislocation-Free GaAs on Si Substrates," Electrochemical Society Proceedings, vol. 97-21, May 13, 1998, pp. 196-200.
Chau et al., Opportunities and Challenges of III-V Nanoelectronics for Future High-Speed, Low Power Logic Applications, IEEE CSIC Digest, 2005, pp. 17-20.
Chen et al., "Dislocation reduction in GaN thin films via lateral overgrowth from trenches," Applied Physics Letters, vol. 75, No. 14, Oct. 4 1999, pp. 2062-2063.
Chengrong, et al., "DBRTD with a high PVCR and a peak current density at room temperature," Chinese Journal of Semiconductors vol. 26, No. 10, Oct. 2005, pp. 1871-1874.
Choi et al., "Monolithic Integration GaAs/AlGaAs LED and Si Driver Circuit," 9 Electron Device Letters 10, Oct. 1988, 3 pages.
Choi et al., "Monolithic Integration of GaAs/AlGaAs Double-Heterostructure LEDs and Si MOSFETs," Electron Device Letters, vol. EDL-7, No. 9, Sep. 1986, 3 pages.
Choi et al., "Monolithic Integration of Si MOSFETs and GaAs MESFET5," Electron Device Letters, vol. EDL-7, No. 4, Apr. 1986, 3 pages.
Choi, et al., "Low-voltage low-power K-band balanced RTD-based MMIC VCO," 2006 IEEE, Department of EECS, Korea Advanced Institute of Science and Technology, 2006, pp. 743-746.
Cloutier et al., "Optical gain and stimulated emission in periodic nanopatterned crystalline silicon," Nature Materials, Nov. 2005, 5 pages.
Currie et al., "Carrier Mobilities and Process Stability of Strained Si n- and p-MOSFETs on SiGe Virtual Substrates," J. Vacuum Science Technology, B, vol. 19, No. 6, 2001, pp. 2268-2279.
Dadgar et al., "MOVPE growth of GaN on Si (111) substrates," Journal of Crystal Growth, vol. 248, Feb. 1, 2003, pp. 556-562.
Datta et al., "Silicon and III-V Nanoelectronics," IEEE International Conference on Indium Phosphide & Related Materials, 2005, pp. 7-8.
Datta et al., "Ultrahigh-Speed 0.5 V Supply Voltage In0.7Ga0.3As Quantum-Well Transistors on Silicon Substrate," 28 Electron Device Letters 8, 2007, pp. 685-687.

(56) References Cited

OTHER PUBLICATIONS

Davis et al., "Lateral epitaxial overgrowth of and defect reduction in GaN thin films," Lasers and Electro-Optics Society Annual Meeting (1998) LEOS '98. IEEE, vol. 1, Dec. 1-4, 1998, pp. 360-361.

De Boeck et al., "The fabrication on a novel composite GaAs/$SiO_2$ nucleation layer on silicon for heteroepitaxial overgrowth by molecular beam Epitaxy," Material Science and Engineering, B9, 1991, pp. 137-141.

Donaton et al., "Design and Fabrication of MOSFETs with a Reverse Embedded SiGe (Rev. e-SiGe) Structure," 2006 IEDM, pp. 465-468.

Dong, Y., et al, "Selective area growth of InP through narrow openings by MOCVD and its application to InP HBT," 2003 International Conference on Indium Phosphide and Related Materials, May 12-16, 2003, pp. 389-392.

European Patent Office, Extended European Search Report and Search Opinion dated Jan. 26, 2011 in EP Patent Application No. 10003084.0-2203 (9 pages).

European Search Report issued by the European Patent Office on Dec. 15, 2010 in European Patent Application No. 10002884.4 (10 pages).

Examination Report in European Patent Application No. 06800414.2, mailed Mar. 5, 2009, 3 pages.

Fang et al., "Electrically pumped hybrid AlGaInAs—silicon evanescent laser," 14 Optics Express 20, 2006, pp. 9203-9210.

Feltin et al., "Epitaxial lateral overgrowth of GaN on Si (111)," Journal of Applied Physics, vol. 93, No. 1, Jan. 1, 2003, pp. 182-185.

Feng et al., "Integration of Germanium-on Insulator and Silicon Substrate," 27 Electron Device Letters 11, 2006, pp. 911-913.

Fiorenza et al., "Film Thickness Constraints for Manufacturable Strained Silicon CMOS," 19 Semiconductor Science Technology, 2004, p. L4.

Fischer et al., "Elastic stress relaxation in SiGe epilayers on patterned Si substrates," 75 Journal of Applied Physics 1, 1994, pp. 657-659.

Fischer et al., "State of stress and critical thickness of Strained small-area SiGe layers," Phys. Stat. Sol. (a) vol. 171, 1999, pp. 475-485.

Fitzgerald et al., "Elimination of Dislocations in Heteroepitaxial MBE and RTCVD $Ge_xSi_{1-x}$ Grown on Patterned Si Substrates," Journal of Electronic Materials, vol. 19, No. 9, 1990, pp. 949-955.

Fitzgerald et al., "Epitaxial Necking in GaAs Growth on Pre-patterned Si Substrates," Journal of Electronic Materials, vol. 20, No. 10, 1991, pp. 839-853.

Fitzgerald et al., "Nucleation Mechanisms and the Elimination of Misfit Dislocations at Mismatched Interfaces by Reduction in Growth Areas," Journal of Applied Physics, vol. 65, No. 6, Mar. 15, 1989, pp. 2220-2237.

Fitzgerald et al., "Structure and recombination in InGaAs/GaAs heterostructures," 63 Journal of Applied Physics, vol. 3, 1988, pp. 693-703.

Fitzgerald et al., "Totally relaxed $Ge_xSi_{1-x}$ layers with low threading dislocation densities grown on Si Substrates," vol. 59, Applied Physics Letters 7, 1991, pp. 811-813.

Fitzgerald, "The Effect of Substrate Growth Area on Misfit and Threading Dislocation Densities in Mismatched Heterostructures," Journal of Vacuum Science Technology, vol. 7, No. 4, Jul./Aug. 1989, pp. 782-788.

Gallagher et al., "Development of the magnetic tunnel junction MRAM at IBM: From first junctions to a 16-Mb MRAM demonstrator chip," 50 IBM J. Research & Dev. 1, Jan. 2006, pp. 5-23A.

Gallas et al., "Influence of Doping on Facet Formation at the $SiO_2$/Si Interface," Surface Sci. 440, 1999, pp. 41-48.

Geppert, "Quantum transistors: toward nanoelectronics," IEEE Spectrum, Sep. 2000, pp. 46-51.

Gibbon et al., "Selective-area low-pressure MOCVD of GaInAsP and related materials on planar InP substrates," Semicond. Sci. Tech. vol. 8, 1993, pp. 998-1010.

Glew et al., "New DFB grating structure using dopant-induced refractive index step," J. Crystal Growth 261, 2004, pp. 349-354.

Golka, et al., "Negative differential resistance in dislocation-free GaN/AlGan double-barrier diodes grown on bulk GaN," 88 Applied Physics Letters 17, Apr. 2006, pp. 172106-1-172106-3.

Goodnick, S.M., "Radiation Physics and Reliability Issues in III-V Compound Semiconductor Nanoscale Heterostructure Devices," Final Technical Report, Arizona State Univ. Dept. Electrical & Computer Eng, 80 pages, 1996-1999.

Gould et al., "Magnetic resonant tunneling diodes as voltage-controlled spin selectors," 241 Phys. Stat. Sol. (B), vol. 3, 2004, pp. 700-703.

Groenert et al., "Monolithic integration of room-temperature cw GaAs/AlGaAs lasers on Si substrates via relaxed graded GeSi buffer layers," 93 Journal of Applied Physics, No. 362, Jan. 2003, pp. 362-367.

Gruber, et al., "Semimagnetic Resonant Tunneling Diodes for Electron Spin Manipulation," Nanostructures: Physics & Technology, 8th International Symposium, 2000, pp. 483-486.

Gustafsson et al., "Cathodoluminescence from relaxed $Ge_xSi_{1-x}$ grown by heteroepitaxial lateral overgrowth," Journal of Crystal Growth 141, 1994, pp. 363-370.

Gustafsson et al., "Investigations of high quality $Ge_xSi_{1-x}$ grown by heteroepitaxial lateral overgrowth using cathodoluminescence," Inst. Phys. Conf. Ser., No. 134, Section 11, Apr. 1993, pp. 675-678.

Hammerschmidt, "Intel to Use Trigate Transistors from 2009 on," EETIMES Online, available at: http://www.eetimes.com/showArticle.jhtml?articleID=189400035 (Jun. 12, 2006). 1 page.

Hasegawa, et al., "Sensing Terahertz Signals with III-V Quantum Nanostructures," Quantum Sensing: Evolution and Revolution from Past to Future, SPIE 2003, pp. 96-105.

Hayafuji et al., Japan, Journal of Applied Physics, vol. 29, 1990, pp. 2371.

Hersee et al., "The Controlled Growth of GaN Nanowires," Nano Letters, vol. 6, No. 8, 2006, pp. 1808-1811.

Hiramatsu et al., "Fabrication and characterization of low defect density GaN using facet-controlled epitaxial lateral overgrowth (FACELO)," Journal of Crystal Growth, vol. 221, Dec. 2000, pp. 316-326.

Hollander et al., "Strain and Misfit Dislocation Density in Finite Lateral Size $Si_{1-x}Ge_x$/Si Films Grown by Selective Epitaxy," Thin Solid Films, vol. 292, 1997, pp. 213-217.

Hu et al., "Growth of Well-Aligned Carbon Nanotube arrays on Silicon Substrates Using Porous Alumina Film as a Nanotemplate," 79 Applied Physics Letters 19, 2001, 3 pages.

Yanlong, et al., "Monolithically fabricated OEICs using RTD and MSM," Chinese Journal Semiconductors vol. 27, No. 4, Apr. 2006, pp. 641-645.

Huang et al., "Electron and Hole Mobility Enhancement in Strained SOI by Wafer Bonding," 49 IEEE Transactions on Electron Devices 9, 2002, pp. 1566-1570.

Ying-Long, et al., "Resonant tunneling diodes and high electron mobility transistors integrated on GaAs substrates," Chinese Physics Letters 23, vol. 3, Mar. 2006, pp. 697-700.

Hydrick et al., "Chemical Mechanical Polishing of Epitaxial Germanium on $SiO_2$-patterned Si(001) Substrates," ECS Transactions, 16 (10), 2008, (pp. 237-248).

Intel Press Release, "Intel's Tri-Gate Transistor to Enable Next Era in Energy-Efficient Performance," Intel Corporation (Jun. 12, 2006). 2 pages.

Intel to Develop Tri-Gate Transistors Based Processors, available at: http://news.techwhack.com/3822/tri-gate-transistors/ (Jun. 13, 2006) 6 pages.

International Preliminary Report on Patentability for International Application No. PCT/US2006/019152 mailed Nov. 29, 2007, 2 pages.

International Preliminary Report on Patentability for International Application No. PCT/US2006/029247 mailed Feb. 7, 2008, 12 pages.

International Preliminary Report on Patentability for International Application No. PCT/US2006/033859 mailed Mar. 20, 2008, 14 pages.

International Preliminary Report on Patentability for International Application No. PCT/US2007/019568 mailed Mar. 19, 2009, 10 pages.

International Preliminary Report on Patentability for International Application No. PCT/US2007/020181 mailed Apr. 2, 2009, 9 pages.

(56) References Cited

OTHER PUBLICATIONS

International Preliminary Report on Patentability for International Application No. PCT/US2007/020777 mailed Apr. 9, 2009, 12 pages.
International Preliminary Report on Patentability for International Application No. PCT/US2007/021023 mailed Apr. 9, 2009, 8 pages.
International Preliminary Report on Patentability for International Application No. PCT/US2007/022392 mailed Apr. 30, 2009, 14 pages.
International Search Report and Written Opinion for International Application No. PCT/US2006/019152 mailed Oct. 19, 2006, 11 pages.
International Search Report and Written Opinion for International Application No. PCT/US2006/029247 mailed May 7, 2007, 19 pages.
International Search Report and Written Opinion for International Application No. PCT/US2008/068377, mailed Jul. 6, 2009, 19 pages.
International Search Report and Written Opinion for International Application No. PCT/US2006/033859 mailed Sep. 12, 2007, 22 pages.
International Search Report and Written Opinion for International Application No. PCT/US2007/007373, dated Oct. 5, 2007, 13 pages.
International Search Report and Written Opinion for International Application No. PCT/US2007/019568 mailed Feb. 6, 2008, 13 pages.
International Search Report and Written Opinion for International Application No. PCT/US2007/020181 mailed Jan. 25, 2008, 15 pages.
International Search Report and Written Opinion for International Application No. PCT/US2007/020777 mailed Feb. 8, 2008, 18 pages.
International Search Report and Written Opinion for International Application No. PCT/US2007/021023 mailed Jun. 6, 2008, 10 pages.
International Search Report and Written Opinion for International Application No. PCT/US2007/022392 mailed Apr. 11, 2008, 20 pages.
International Search Report for International Application No. PCT/US2006/019152, mailed May 17, 2005. 11 pages.
International Technology Roadmap for Semiconductors—Front End Processes, pp. 1-62 (2005).
Ipri et al., "MONO/POLY technology for fabricating low-capacitance CMOS integrated circuits," Electron Devices, IEEE Transactions, vol. 35, No. 8, Aug. 1988 pp. 1382-1383.
Ishibashi, et al., "3rd Topical Workshop on Heterostructure Microelectronics for Information Systems Applications," Aug.-Sep. 1998, 115 pages.
Ishitani et al., "Facet Formation in Selective Silicon Epitaxial Growth," 24 Japan, Journal of Applied Physics, vol. 10, 1985, pp. 1267-1269.
Ismail et al., "High-quality GaAs on Sawtooth-patterned Si Substrates," 59 Applied Physics Letters 19, 1991, pp. 2418-2420.
Jain et al., "Stresses in strained GeSi stripes and quantum structures: calculation using the finite element method and determination using micro-Raman and other measurements," Thin Solid Films 292, 1997, pp. 218-226.
Jeong, et al., "Performance improvement of InP-based differential HBT VCO using the resonant tunneling diode," 2006 International Conf. on Indium Phosphide and Related Mat. Conf. Proc., pp. 42-45.
Ju et al., "Epitaxial lateral overgrowth of gallium nitride on silicon substrate," Journal of Crystal Growth, vol. 263, No. 1-4, Mar. 1, 2004, pp. 30-34.
Kamins et al., "Kinetics of Selective Epitaxial Deposition of $Si_{1-x}Ge_x$," Hewlett-Packard Company, Palo Alto, CA, Appl. Phys. Lett. 61 (6), Aug. 10, 1992 (pp. 669-671).
Kamiyama, et al., "UV laser diode with 350.9-nm-lasing wavelength grown by hetero-epitaxial-lateral overgrowth technology," Selected Topics in Quantum Electronics, IEEE Journal of Selected Topics in Quantum Electronics, vol. 11, No. 5, Sep.-Oct. 2005, pp. 1069-1073.
Kamiyama, et al., "UV light-emitting diode fabricated on hetero-ELO-grown $Al_{0.22}Ga_{0.78}N$ with low dislocation density," Physica Status Solidi A, vol. 192, No. 2, Aug. 2002, pp. 296-300.
Kawai, et al., "Epitaxial Growth of InN Films and InN Nano-Columns by RF-MBE," The Institute of Electronics, Information and Communication Engineers, Gijutsu Kenkyu, vol. 13, No. 343 (CPM2003 102-116), 2003, pp. 33-37.
Kazi et al., "Realization of GaAs/AlGaAs Lasers on Si Substrates Using Epitaxial Lateral Overgrowth by Metalorganic Chemical Vapor Deposition," Japan, Journal of Applied Physics, vol. 40, 2001, pp. 4903-4906.
Kidoguchi et al., "Air-bridged lateral epitaxial overgrowth of GaN thin Films," Applied Physics Letters, vol. 76, No. 25, Jun. 19, 2000, pp. 3768-3770.
Kim et al., "Silicon-Based Field-Induced Band-to-Band Tunneling Effect Transistor," IEEE Electron Device Letters, No. 25, No. 6, 2004, pp. 439-441.
Kim et al., "GaN nano epitaxial lateral overgrowth on holographically patterned substrates," School of Physics and Inter-University Semiconductor Research Center, Seoul National University, Aug. 25-27, 2003, pp. 27-28.
Kimura et al., "Vibronic Fine Structure Found in the Blue Luminescence from Silicon Nanocolloids," Japan, Journal of Applied Physics, vol. 38, 1999, pp. 609-612.
Klapper, "Generation and Propagation of Dislocations During Crystal Growth," Mat. Chem. and Phys. vol. 66, 2000, pp. 101-109.
Knall et al., "Threading Dislocations in GaAs Grown with Free Sidewalls on Si mesas," Journal of Vac. Sci. Technol. B, vol. 12, No. 6, Nov./Dec. 1994, pp. 3069-3074.
Kollonitsch, et al., "Improved Structure and Performance of the GaAsSb/InP Interface in a Resonant Tunneling Diode," Journal of Crystal Growth, vol. 287, 2006, pp. 536-540.
Krishnamurthy, et al., "I-V characteristics in resonant tunneling devices: Difference Equation Method," Journal of Applied Physics, vol. 84, Issue 9, Condensed Matter: Electrical and Magnetic Properties (PACS 71-76), 1998, 9 pages.
Krost et al., "GaN-based Optoelectronics on Silicon Substrates," Materials Science & Engineering, B93, 2002, pp. 77-84.
Sudirgo et al., "Si-Based Resonant Interband Tunnel Diode/CMOS Integrated Memory Circuits," Rochester Institute of Technology, IEEE, 2006, pp. 109-112.
Kusakabe, K. et al., Characterization of Overgrown GaN layers on Nano-Columns Grown by RF-Molecular Beam Epitaxy, Japan, Journal of Applied Physics, Part 2, vol. 40, No. 3A, 2001, pp. L192-L194.
Kushida et al., "Epitaxial growth of $PbTiO_3$ films on $SrTiO_3$ by RF magnetron sputtering," Ultrasonics, Ferroelectrics and Frequency Control, IEEE Transactions on Ultrasonics Ferroelectrics and Frequency Control, vol. 38, No. 6, Nov. 1991, pp. 656-662.
Kwok, "Barrier-Injection Transit Time Diode," Complete Guide to Semiconductor Devices, $2^{nd}$ ed., Chapter 18, 2002, pp. 137-144.
Lammers, "Trigate and High-k stack up vs. planar," EETIMES Online, available at: http://www.eetimes.com/showArticle.jhtml?articleID=188703323&pgno=2&printable=true (Jun. 12, 2006). 2 pages.
Langdo et al., "High Quality Ge on Si by Epitaxial Necking," Applied Physics Letters, vol. 76, No. 25, Jun. 19, 2000, pp. 3700-3702.
Langdo, "Selective SiGe Nanostructures," PhD Thesis, Massachusetts Institute of Technology, Jun. 2001, 215 pages.
Lee et al., "Growth of GaN on a nanoscale periodic faceted Si substrate by metal organic vapor phase epitaxy," Compound Semiconductors: Post-Conference Proceedings, Aug. 25-27, 2003, pp. 15-21.
Lee et al., "Strain-relieved, Dislocation-free $In_xGa_{1-x}As/GaAs(001)$ Heterostructure by Nanoscale-patterned Growth," Applied Physics Letters, vol. 85, No. 18, Nov. 1, 2004, pp. 4181-4183.
Li et al., "Defect Reduction of GasAs Epitaxy on Si (001) Using Selective Aspect Ratio Trapping," 91 Applied Physics Letters, 2007, pp. 021114-1-021114-3.
Li et al., "Heteroepitaxy of High-quality Ge on Si by Nanoscale Ge seeds Grown through a Thin Layer of $SiO_2$," Applied Physics Letters, vol. 85, No. 11, Sep. 13, 2004, pp. 1928-1930.
Li et al., "Monolithic Integration of GaAs/InGaAs Lasers on Virtual Ge Substrates via Aspect-Ratio Trapping," Journal of The Electrochemical Society, vol. 156, No. 7, 2009, pp. H574-H578.

(56) References Cited

OTHER PUBLICATIONS

Li et al., "Morphological Evolution and Strain Relaxation of Ge Islands Grown on Chemically Oxidized Si (100) by Molecular-Beam Epitaxy," Journal of Applied Physics, vol. 98, 2005, pp. 073504-1-073504-8.

Li et al., "Selective Growth of Ge on Si (100) through Vias of $Si_{02}$ Nanotemplate Using Solid Source Molecular Beam Epitaxy," Applied Physics Letters, vol. 83, No. 24, Dec. 15, 2003, pp. 5032-5034.

Liang et al., "Critical Thickness enhancement of Epitaxial SiGe films Grown on Small Structures," Journal of Applied Physics, vol. 97, 2005, pp. 043519-1-043519-7.

Lim et al., "Facet Evolution in Selective Epitaxial Growth of Si by cold-wall ultrahigh vacuum chemical vapor deposition," Journal of Vac. Sci. Tech., vol. B 22, No. 2, 2004, pp. 682.

Liu et al., "High Quality Single-crystal Ge on Insulator by Liquid-phase Epitaxy on Si Substrates," Applied Physics Letters, vol. 84, No. 14, Apr. 4, 2004, pp. 2563-2565.

Liu et al., "Rapid Melt Growth of Germanium Crystals with Self Aligned Microcrucibles on Si Substrates," Journal of the Electrochemical Society, vol. 152, No. 8, 2005, pp. G688-G693.

Loo et al., "Successful Selective Epitaxial $Si_{1-x}Ge_x$ Deposition Process for HBT-BiCMOS and High Mobility Heterojunction pMOS Applications," 150 Journal of Electrochemical Society 10, 2003, pp. G638-G647.

Lourdudoss et al., "Semi-insulating epitaxial layers for optoelectronic devices," Semiconducting and Insulating Materials Conference, SIMC-XL, 2000, pp. 171-178.

Luan et al., "High-quality Ge Epilayers on Si with Low Threading-dislocation Densities," Applied Physics Letters, vol. 75, No. 19, Nov. 8, 1999, pp. 2909-2911.

Luan, "Ge Photodetectors for Si Microphotonics," PhD Thesis, Massachusetts Institute of Technology, Department of Materials Science & Engineering, Jan. 12, 2001, 155 pages.

Lubnow et al., "Effect of III/V-Compound Epitaxy on Si Metal-Oxide-Semiconductor Circuits," Japan, Journal of Applied Physics, vol. 33, 1994, pp. 3628-3634.

Luo et al., Enhancement of (In,Ga)N Light-Emitting Diode Performance by Laser Liftoff and Transfer From Sapphire to Silicon, IEEE Photonics Technology Letters, vol. 14, No. 10, 2002, pp. 1400-1402.

Luryi et al., "New Approach to the High Quality Epitaxial Growth of Latticed-Mismatched Materials," Applied Physics Letters, vol. 49, No. 3, Jul. 21, 1986, pp. 140-142.

Ma, et al., "A small signal equivalent circuit model for resonant tunneling diode," Chinese Physics Letters, vol. 23, No. 8, Aug. 2006, pp. 2292-2295.

Ma, et al., "Fabrication of an AlAs/In0.53/Ga0.47/As/InAs resonant tunneling diode on InP substrate for high-speed circuit applications," 27 Chinese J. Semiconductors 6, Jun. 2006, pp. 959-962.

Maekawa, et al., "High PVCR Si/Si1-x/Gex DW RTD formed with a new triple-layer buffer," Materials Science in Semiconductor Processing, vol. 8, 2005, pp. 417-421.

Maezawa, et al., "Metamorphic resonant tunneling diodes and its application to chaos generator ICs,"44 Jap. J. Applied Physics, Part 1, No. 7A, Jul. 2005, pp. 4790-4794.

Maezawa, et al., "InP-based resonant tunneling diode/HEMT integrated circuits for ultrahigh-speed operation," IEEE Nagoya University, Institute for Advanced Research, 2006, pp. 252-257.

Martinez et al., "Characterization of GaAs Conformal Layers Grown by Hydride Vapour Phase Epitaxy on Si Substrates by Microphotoluminescence Cathodoluminescence and MicroRaman," Journal of Crystal Growth, vol. 210, 2000, pp. 198-202.

Matsunaga et al., "A New Way to Achieve Dislocation-Free Heteroepitaxial Growth by Molecular Beam Epitaxy: Vertical Microchannel Epitaxy," Journal of Crystal Growth, vol. 237-239, 2002, pp. 1460-1465.

Matthews et al., "Defects in Epitaxial Multilayers-Misfit Dislocations," Journal of Crystal Growth, vol. 27, 1974, pp. 118-125.

Monroy, et al., "High UV/visible Contrast Photodiodes Based on Epitaxial Lateral Overgrown GaN layers," Electronics Letters, vol. 35, No. 17, Aug. 19, 1999, pp. 1488-1489.

Nakano et al., "Epitaxial Lateral Overgrowth of AlN Layers on Patterned Sapphire Substrates," Source: Physica Status Solidi A, vol. 203, No. 7, May 2006, pp. 1632-1635.

Nam et al., "Lateral Epitaxy of Low Defect Density GaN Layers via Organometallic Vapor Phase Epitaxy," Applied Physics Letters, vol. 71, No. 18, Nov. 3, 1997, pp. 2638-2640.

Naoi et al., "Epitaxial Lateral Overgrowth of GaN on Selected-area Si (111) Substrate with Nitrided Si Mask," Journal of Crystal Growth, vol. 248, 2003, pp. 573-577.

Naritsuka et al., "InP Layer Grown on (001) Silicon Substrate by Epitaxial Lateral Overgrowth," Japan, Journal of Applied Physics, vol. 34, 1995, pp. L1432-L1435.

Naritsuka et al., "Vertical Cavity Surface Emitting Laser Fabricated on GaAs Laterally Grown on Si Substrate," Electrochemical Society Proceedings, vol. 97, No. 21, pp. 86-90.

Neudeck, et al., "Novel silicon Epitaxy for advanced MOSFET devices," Electron Devices Meeting, IEDM Technical Digest International, 2000, pp. 169-172.

Neumann et al., "Growth of III-V Resonant Tunneling Diode on Si Substrate with LP-MOVPE," Journal of Crystal Growth, vol. 248, 2003, pp. 380-383.

Noborisaka, J., et al., "Catalyst-free growth of GaAs nanowires by selective-area metalorganic vapor-phase epitaxy," Applied Physics Letters, vol. 86, May 16, 2005, pp. 213102-1-213102-3.

Noborisaka, J., et al., "Fabrication and characterization of freestanding GaAs/AlGaAs core-shell nanowires and AlGaAs nanotubes by suing selective-area metalorganic vapor phase epitaxy," Applied Physics Letters, vol. 87, Aug. 24, 2005, pp. 093109-1-093109-3.

Noda, et al., "Current-voltage characteristics in double-barrier resonant tunneling diodes with embedded GaAs quantum rings," Physica E 32, 2006, pp. 550-553.

Norman, et al., "Characterization of MOCVD Lateral Epitaxial Overgrown III-V Semiconductor Layers on GaAs Substrates," Compound Semiconductors, Aug. 25-27, 2003, pp. 45-46.

Notification of Transmittal of the International Search Report and the Written Opinion of the International Searching Authority for PCT/US2010/029552, Applicant: Taiwan Semiconductor Manufacturing Company, Ltd., May 26, 2010, 14 pages.

Oehrlein et al., "Studies of the Reactive Ion Etching of SiGe Alloys," J. Vac. Sci. Tech, A9, No. 3, May/Jun. 1991, pp. 768-774.

Orihashi, et al., "Experimental and theoretical characteristics of sub-terahertz and terahertz oscillations of resonant tunneling diodes integrated with slot antennas," 44 Jap. J. Applied Physics, Part 1, No. 11, Nov. 2005, pp. 7809-7815.

Parillaud et al., "High Quality InP on Si by Conformal Growth," Applied Physics Letters, vol. 68, No. 19, May 6, 1996, pp. 2654-2656.

Park et al., "Defect Reduction and its Mechanism of Selective Ge Epitaxy in Trenches on Si(001) Substrates Using Aspect Ratio Trapping," Mat. Res. Society Symp. Proc., vol. 994, 2007, 6 pages.

Park et al., "Fabrication of Low-Defectivity, Compressively Strained Geon $Si_{0.2}Ge^e{}_{0.8}$ Structures Using Aspect Ratio Trapping," Journal of the Electrochemical Society, vol. 156, No. 4, 2009, pp. H249-H254.

Park et al., "Growth of Ge Thick Layers on Si (001) Substrates Using Reduced Pressure Chemical Vapor Deposition," 45 Japan, Journal of Applied Physics, vol. 11 2006, pp. 8581-8585.

Park, J.-S., et al., "Defect reduction of selective Ge epitaxy in trenches on Si(001) substrates using aspect ratio trapping," Applied Physics Letters, vol. 90, Feb. 2, 2007, pp. 052113-1-052113-3.

Partial International Search for International Application No. PCT/US2006/033859 mailed Jun. 22, 2007, 7 pages.

Partial International Search Report for International Application No. PCT/US2008/004564 completed Jul. 22, 2009, mailed Oct. 16, 2009, 5 pages.

Partial International Search Report for International Application No. PCT/US2008/068377, completed Mar. 19, 2008, mailed Apr. 22, 2008, 3 pages.

PCT International Search Report of PCT/US2009/057493, from PCT/ISA/210, mailed Mar. 22, 2010, Applicant: Amberwave System Corporation et al., 2 pages.

(56) References Cited

OTHER PUBLICATIONS

Pidin et al., "MOSFET Current Drive Optimization Using Silicon Nitride Capping Layer for 65-nm Technology Node," Symposium on VLSI Technology, Dig. Tech. Papers, 2004, pp. 54-55.
Piffault et al., "Assessment of the Strain of InP Films on Si Obtained by HVPE Conformal Growth," Indium Phosphide and Related Materials, Conference Proceedings, Sixth International Conference on Mar. 27-31, 1994, pp. 155-158.
Pribat et al., "High Quality GaAs on Si by Conformal Growth," Applied Physics Letters, vol. 60, No. 17, Apr. 27, 1992, pp. 2144-2146.
Prost, ed. "QUDOS Technical Report," 2002-2004, 77 pages.
Prost, et al., "High-speed InP-based resonant tunneling diode on silicon substrate," Proceedings of the 31st European Solid-State Device Research Conf., 2005, pp. 257-260.
Radulovic, et al., "Transient Quantum Drift-Diffusion Modelling of Resonant Tunneling Heterostructure Nanodevices," Physics of Semiconductors: 27th International Conference on the Physics of Semiconductors—ICPS-27, Jun. 2005 AIP Conf. Proc., pp. 1485-1486.
Reed et al., "Realization of a Three-Terminal Resonant Tunneling Device: The Bipolar Quantum Resonant Tunneling Transistor," 54 Applied Physics Letters 11, 1989, p. 1034.
Ren et al., "Low-dislocation-density, Nonplanar GaN Templates for Buried Heterostructure Lasers Grown by Lateral Epitaxial Overgrowth," Applied Physics Letters, vol. 86, No. 11, Mar. 14, 2005, pp. 111901-1-3.
Rim et al., "Enhanced Hole Mobilities in Surface-Channel Strained-Si p-MOSFETs," 1995 IEDM, pp. 517-520.
Rim et al., "Fabrication and Mobility Characteristics of Ultra-thin Strained Si Directly on Insulator (SSDOI) MOSFETs," IEDM Tech. Dig., 2003, pp. 49-52.
Ringel et al., "Single-junction InGaP/GaAs Solar Cells Grown on Si Substrates with SiGe Buffer Layers," Prog. Photovolt., Res. & Applied, vol. 10, 2002, pp. 417-426.
Rosenblad et al., "A Plasma Process for Ultrafast Deposition of SiGe Graded Buffer Layers," 76 Applied Physics Letters 4, 2000, pp. 427-429.
Sakai, "Defect Structure in Selectively Grown GaN Films with Low Threading Dislocation Density," Applied Physics Letters 71, vol. 16, 1997, pp. 2259-2261.
Sakai, "Transmission Electron Microscopy of Defects in GaN Films Formed by Epitaxial Lateral Overgrowth," 73 Applied Physics Letters 4, 1998, pp. 481-483.
Sakawa et al., "Effect of Si Doping on Epitaxial Lateral Overgrowth of GaAs on GaAs-Coated Si Substrate," Japan, Journal of Applied Physics, vol. 31, 1992, pp. L359-L361.
Pae, et al., "Multiple Layers of Silicon-on-Insulator Islands Fabrication by Selective Epitaxial Growth," Electron Device Letters, IEEE, vol. 20, No. 5, May 1999, pp. 194-196.
Sass, et al., "Strain in GaP/GaAs and GaAs/GaP resonant tunneling heterostructures," Journal of Crystal Growth, vol. 248, Feb. 2003, pp. 375-379.
Schaub, et al., "Resonant-Cavity-Enhanced High-Speed Si photodiode Grown by Epitaxial Lateral Overgrowth," Photonics Technology Letters, IEEE, vol. 11, No. 12, Dec. 1999, pp. 1647-1649.
Seabaugh et al., "Promise of Tunnel Diode Integrated Circuits," Tunnel Diode and CMOS/HBT Integration Workshop, Naval Research Laboratory, Dec. 9, 1999, 13 pages.
Shahidi, et al., "Fabrication of CMOS on Ultrathin SOI Obtained by Epitaxial Lateral Overgrowth and Chemical-Mechanical Polishing," Electron Devices Meeting, Technical Digest, International, Dec. 9-12, 1990, pp. 587-590.
Shichijo et al., "Co-Integration of GaAs MESFET & Si CMOS Circuits," 9 Elec. Device Letters 9, Sep. 1988, pp. 444-446.
Shubert, E.F., "Resonant tunneling diode (RTD) structures," Rensselear Polytechnic Institute, 2003, pp. 1-14.
Siekkinen, et al., "Selective Epitaxial Growth Silicon Bipolar Transistors for Material Characterization," Electron Devices, IEEE Transactions on Electron Devices, vol. 35, No. 10, Oct. 1988, pp. 1640-1644.
Su et al., "Catalytic Growth of Group III-nitride Nanowires and Nanostructures by Metalorganic Chemical Vapor Deposition," Applied Physics Letters, vol. 86, 2005, pp. 013105-1-013105-3.
Su et al., "New Planar Self-Aligned Double-Gate Fully-depleted P-MOSFETs Using Epitaxial Lateral Overgrowth (ELO) and selectively grown source/drain (S/D)," 2000 IEEE Intl. SOI Conf., pp. 110-111.
Suhara, et al, "Characterization of argon fast atom beam source and its application to the fabrication of resonant tunneling diodes," 2005 International Microprocesses and Nanotechnology Conf. Di. of Papers, 2005, pp. 132-133.
Sun et al., Electron resonant tunneling through InAs/GaAs quantum dots embedded in a Schottky diode with an AlAs insertion layer, 153 J. Electrochemical Society 153, 2006, pp. G703-G706.
Sun et al., "Room-temperature observation of electron resonant tunneling through InAs/AlAs quantum dots," 9 Electrochemical and Solid-State Letters 5, May 2006, pp. G167-G170.
Sun et al., "InGaAsP Multi-Quantum Wells at 1.5 /splmu/m Wavelength Grown on Indium Phosphide Templates on Silicon," Indium Phosphide and Related Materials, May 12-16, 2003, pp. 277-280.
Sun et al., "Selective Area Growth of InP on InP Precoated Silicon Substrate by Hydride Vapor Phase epitaxy," Indium Phosphide and Related Materials Conference, IPRM. 14th, 2002, pp. 339-342.
Sun et al., "Sulfur Doped Indium Phosphide on Silicon Substrate Grown by Epitaxial Lateral Overgrowth," Indium Phosphide and Related Materials 16th IPRM, May 31-Jun. 4, 2004, pp. 334-337.
Sun et al., "Temporally Resolved Growth of InP in the Opening Off-Oriented from [110] Direction," Idium Phosphide and Related Materials, Conference Proceedings, 2000 International Conference, pp. 227-230.
Sun et al., "Thermal Strain in Indium Phosphide on Silicon Obtained by Epitaxial Lateral Overgrowth," 94 Journal of Applied Physics 4, 2003, pp. 2746-2748.
Suryanarayanan et al., "Microstructure of Lateral Epitaxial Overgrown InAs on (100) GaAs Substrates," Applied Physics Letters, vol. 83, No. 10, Sep. 8, 2003, pp. 1977-1979.
Suzuki, et al., "Mutual injection locking between sub-THz oscillating resonant tunneling diodes," Japan Science and Technology Agency, IEEE, Joint 30th International Conference on Infrared and Millimeter Waves & 13th International Conference on Terahertz Electronics, 2005, pp. 150-151.
Takasuka et al., "AlGaAs/InGaAs DFB Laser by One-Time Selective MOCVD Growth on a Grating Substrate," 43 Japan, Journal of Applied Physics, 4B, 2004, pp. 2019-2022.
Takasuka et al., "InGaAs/AlGaAs Quantum Wire DFB Buried HeteroStructure Laser Diode by One-Time Selective MOCVD on Ridge Substrate," 44 Japan, Journal of Applied Physics, 4B, 2005, pp. 2546-2548.
Tamura et al., "Heteroepitaxy on High-Quality GaAs on Si for Optical Interconnections on Si Chip," Proceedings of the SPIE, vol. 2400, 1995, pp. 128-139.
Tamura et al., "Threading Dislocations in GaAs on Pre-patterned Si and in Post-patterned GaAs on Si," Journal of Crystal Growth, vol. 147, 1995, pp. 264-273.
Tanaka et al., "Structural Characterization of GaN Lateral Overgrown on a (111) Si Substrate," Applied Physics Letters, vol. 79, No. 7, Aug. 13, 2001, pp. 955-957.
Thean et al., "Uniaxial-Biaxial Hybridization for Super-Critical Strained-Si Directly on Insulator (SC-SSOI) PMOS with Different Channel Orientations," IEEE, 2005, pp. 1-4.
Thelander, et al., "Heterostructures incorporated in one-dimensional semiconductor materials and devices," Physics of Semiconductors, vol. 171, 2002, 1 page. Abstract Only.
Thompson et al., "A Logic Nanotechnology Featuring Strained-Silicon," 25 IEEE Electron Device Letters 4, 2004, pp. 191-193.
Tomiya et al., "Dislocation Related Issues in the Degradation of GaN-Based Laser Diodes," Selected Topics in Quantum Electronics, IEEE Journal of Selected Topics in Quantum Electronics, vol. 10, No. 6, Nov./Dec. 2004, pp. 1277-1286.

(56) References Cited

OTHER PUBLICATIONS

Tomiya, "Dependency of crystallographic tilt and defect distribution of mask material in epitaxial lateral overgrown GaN layers," Applied Physics Letters vol. 77, No. 5, pp. 636-638.
Tran et al., "Growth and Characterization of InP on Silicon by MOCVD," Journal of Crystal Growth, vol. 121, 1992, pp. 365-372.
Tsai, et al., "InP/InGaAs resonant tunneling diode with six-route negative differential resistances," 13th European Gallium Arsenide and other Compound Semiconductors Application Symp., 2006, pp. 421-423.
Tsang et al., "The heteroepitaxial Ridge-Overgrown Distributed Feedback Laser," Quantum Electronics, IEEE Journal of Quantum Electronics, vol. 21, No. 6, Jun. 1985, pp. 519-526.
Tsaur, et al., "Low-Dislocation-Density GaAs epilayers Grown on Ge-Coated Si substrates by Means of Lateral Epitaxial Overgrowth," Applied Physics Letters, vol. 41, No. 15, Aug. 1982, pp. 347-349.
Tseng et al., "Effects of Isolation Materials on Facet Formation for Silicon Selective Epitaxial Growth," 71 Applied Physics Letters 16, 1997, pp. 2328.
Tsuji et al., Selective Epitaxial Growth of GaAs on Si with Strained Sort-period Superlattices by Molecular Beam Epitaxy under Atomic Hydrogen Irradiation, J. Vac. Sci. Technol. B, vol. 22, No. 3, May/Jun. 2004, pp. 1428-1431.
Ujiie, et al., Epitaxial Lateral Overgrowth of GaAs on a Si Substrate, 28, Japan, Journal of Applied Physics, vol. 3, Mar. 1989, pp. L337-L339.
Usuda et al., "Strain Relaxation of Strained-Si Layers on SiGe-on-Insulator (SGOI) Structures After Mesa Isolation," Applied Surface Science, vol. 224, 2004, pp. 113-116.
Usui et al., "Thick GaN Epitaxial Growth with Low Dislocation Density by Hydride Vapor Phase Epitaxy," vol. 36, Japan, Journal of Applied Physics, 1997, pp. L899-L902.
Vanamu et al., "Epitaxial Growth of High-Quality Ge Films on Nanostructured Silicon Substrates," Applied Physics Letters, vol. 88, 2006, pp. 204104.1-204-104.3.
Vanamu et al., "Growth of High Quality $Ge/Si_{1-x}Ge_x$ on Nano-scale Patterned Si Structures," J. Vac. Sci. Technology. B, vol. 23, No. 4, Jul./Aug. 2005, pp. 1622-1629.
Vanamu et al., "Heteroepitaxial Growth on Microscale Patterned Silicon Structures," Journal of Crystal Growth, vol. 280, 2005, pp. 66-74.
Vanamu et al., "Improving Ge $Si_xGe_{1-x}$ Film Quality through Growth onto Patterned Silicon Substrates," Advances in Electronics Manufacturing Technology, Nov. 8, 2004, pp. 1-4.
Vescan et al., "Lateral Confinement by Low Pressure Chemical Vapor Deposition-Based Selective Epitaxial Growth of $Si_{1-x}Ge_x/Si$ Nanostructures," No. 81, Journal of Applied Physics 10, 1997, pp. 6709-6715.
Vetury et al., "First Demonstration of AlGaN/GaN Heterostructure Field Effect Transistor on GaN Grown by Lateral Epitaxial Overgrowth (ELO)," Inst. Phys. Conf. Ser. No. 162: Ch. 5, Oct. 1998, pp. 177-183.
Walker, et al., "Magnetotunneling spectroscopy of ring-shaped (InGa)As quantum dots: Evidence of excited states with 2pz character," 32 Physica E 1-2, May 2006, pp. 57-60.
Wang et al, "Fabrication of Patterned Sapphire Substrate by Wet Chemical Etching for Maskless Lateral Overgrowth of GaN," Journal of Electrochemical Society, vol. 153, No. 3, Mar. 2006, pp. C182-C185.
Ting, et al., "Modeling Spin-Dependent Transport in InAS/GaSb/AlSb Resonant Tunneling Structures," 1 J. Computational Electronics, 2002, pp. 147-151.
Watanabe, et al., "Fluoride resonant tunneling diodes on Si substrates," IEEE International Semiconductor Device Research Symp. Dec. 2005, pp. 177-178.
Wernersson et al., "InAs Epitaxial Lateral Growth of W Marks," Journal of Crystal Growth, vol. 280, 2005, pp. 81-86.
Williams et al., "Etch Rates for Micromachining Processing—Part II," Journal of Microelectromechanical Systems, vol. 4, 1996, pp. 761-778.
Williams et al., "Etch Rates for Micromachining Processing—Part II," Journal of Microelectromechnical Systems, vol. 5, No. 4, Dec. 1996, pp. 256-269.
Wu et al., "Enhancement-mode InP n-channel metal-oxide-semiconductor field-effect-transistors with atomic-layer-deposited Al2O3 dielectrics," Applied Physics Letters 91, 022108-022110 (2007).
Wu et al., Gross-Sectional Scanning/Tunneling Microscopy Investigations of Cleaned 111-V Heterostructures, Technical report, Dec. 1996, 7 pages.
Wu et al., "Inversion-type enhancement-mode InP MOSFETs with ALD Al2O3, HfAlO nanolaminates as high-k gate dielectrics," Proceedings of the 65th Device Research Conf., 2007, pp. 49-52.
Wuu et al., "Defect Reduction and Efficiency Improvement of Near-Ultraviolet Emitters via Laterally Overgrown GaN on a GaN/Patterned Sapphire Template," Applied Physics Letters, vol. 89, No. 16, Oct. 16, 2006, pp. 161105-1-3.
Xie et al., "From Porous Si to Patterned Si Substrate: Can Misfit Strain Energy in a Continuous Heteroepitaxial Film Be Reduced?" Journal of Vacuum Science Technology, B, vol. 8, No. 2, Mar./Apr. 1990, pp. 227-231.
Xu et al., "Spin-Filter Devices Based on Resonant Tunneling Antisymmetrical Magnetic Semiconductor Hybrid Structures," vol. 84, Applied Physics Letters 11, 2004, pp. 1955-1957.
Yamaguchi et al., "Analysis for Dislocation Density Reduction in Selective Area Growth GaAs Films on Si Substrates," Applied Physics Letters, vol. 56, No. 1, Jan. 1, 1990, pp. 27-29.
Yamaguchi et al., "Defect Reduction Effects in GaAs on Si Substrates by Thermal Annealing," Applied Physics Letters vol. 53, No. 23, 1998, pp. 2293.
Yamaguchi et al., GaAs Solar Cells Grown on Si Substrates for Space Use: Prog. Photovolt.: Res. Appl., vol. 9, 2001; pp. 191-201.
Yamaguchi et al., "Super-High-Efficiency Multi-junction Solar Cells," Prog. Photovolt.: Res. Appl., vol. 13, 2005, pp. 125-132.
Yamamoto et al., "Optimization of InP/Si Heteroepitaxial Growth Conditions Using Organometallic Vapor Phase Epitaxy," Journal of Crystal Growth, vol. 96, 1989, pp. 369-377.
Yang et al., "High Performance CMOS Fabricated on Hybrid Substrate with Different Crystal Orientations," IEDM Tech. Dig., 2003, pp. 453-456.
Yang et al., "Selective Area Deposited Blue GaN—InGaN Multiple-quantum Well Light Emitting Diodes over Silicon Substrates," Applied Physics Letter, vol. 76, No. 3, Jan. 17, 2000, pp. 273-275.
Yili, et al., "Physics-based hydrodynamic simulation of direct current characteristics in DBRTD," 29 Chinese J. Electron Devices 2, Jun. 2006, pp. 365-368.
Yin et al., "Ultrathin Strained-SOI by Stress Balance on Compliant Substrates and FET Performance," 52 IEEE Trans. on Electron Devices 10, 2005, pp. 2207-2214.
Dong et al., "Selective area growth of InP through narrow openings by MOCVD and its application to inP HBT," Indium Phosphide and Related Materials, International Conference, May 12-16, 2003, pp. 389-392.
Yoon et al., "Selective Growth of Ge Islands on Nanometer-scale Patterned $SiO_2/Si$ Substrate by Molecular Beam Epitaxy," Applied Physics Letters, vol. 89, 2006, pp. 063107.1-063107.3.
Yoshizawa et al., "Growth of self-Organized GaN Nanostructures on Al 2O3 (0001) by RF-Radial Source Molecular Beam Epitaxy", Japan, Journal of Applied Physics, Part 2, vol. 36, No. 4B, 1997, pp. L459-L462.
Zamir et al., Thermal Microcrack Distribution Control in GaN Layers on Si Substrates by Lateral Confined Epitaxy, Applied Physics Letters, vol. 78, No. 3, Jan. 15, 2001, pp. 288-290.
Zang et al., "Nanoheteroepitaxial lateral overgrowth of GaN on nanoporous Si (111)," Applied Physics Letters, vol. 88, No. 14, Apr. 3, 2006, pp. 141925.
Zang et al., "Nanoscale lateral epitaxial overgrowth of GaN on Si (111)," Applied Physics Letters, vol. 87, No. 19 (Nov. 7, 2005) pp. 193106.1-193106.3.

(56) References Cited

OTHER PUBLICATIONS

Zela et al., "Single-crystalline Ge Grown Epitaxially on Oxidized and Reduced Ge/Si (100) Islands," Journal of Crystal Growth, vol. 263, 2004, pp. 90-93.

Zhang et al., "Removal of Threading Dislocations from Patterned Heteroepitaxial Semiconductors by Glide to Sidewalls," Journal of Electronic Materials, vol. 27, No. 11, 1998, pp. 1248-1253.

Zhang et al., "Strain Status of Self-Assembled InAs Quantum Dots," Applied Physics Letters, vol. 77, No. 9, Aug. 28, 2000, pp. 1295-1297.

Zheleva et al., "Lateral Epitaxy and Dislocation Density Reduction in Selectively Grown GaN Structures," Journal of Crystal Growth, vol. 222, No. 4, Feb. 4, 2001, pp. 706-718.

Zubia et al., "Initial Nanoheteroepitaxial Growth of GaAs on Si (100) by OMVPE," Journal of Electronic Materials, vol. 30, No. 7, 2001, pp. 812-816.

\* cited by examiner

DIODE-BASED DEVICES AND METHODS FOR MAKING THE SAME

This application is a divisional of U.S. patent application Ser. No. 13/554,516, filed on Jul. 20, 2012, entitled "DIODE-BASED DEVICES AND METHODS FOR MAKING THE SAME," which is a divisional of U.S. patent application Ser. No. 12/684,797, filed on Jan. 8, 2010, entitled "DIODE-BASED DEVICES AND METHODS FOR MAKING THE SAME," which claims the benefit of U.S. Provisional Application No. 61/143,589, filed on Jan. 9, 2009, entitled "DIODE-BASED DEVICES AND METHODS FOR MAKING THE SAME;" the above applications are hereby incorporated herein by reference in their entireties.

CROSS-REFERENCE TO RELATED APPLICATIONS

This application relates to the following co-pending and commonly assigned patent applications: U.S. patent application Ser. No. 12/100,131, filed Apr. 9, 2008, entitled "PHOTOVOLTAICS ON SILICON," which claims priority to U.S. Provisional Application No. 60/922,533, filed Apr. 9, 2007, entitled "PHOTOVOLTAICS ON SILICON," which applications are both hereby incorporated by reference in their entirety; and U.S. patent application Ser. No. 12/684,499, filed Jan. 8, 2010, entitled "Semiconductor Diodes Fabricated by Aspect Ratio Trapping with Coalesced Films," which claims priority to U.S. Provisional Application No. 61/143,602, filed Jan. 9, 2009, entitled "Semiconductor Diodes Fabricated by Aspect Ratio Trapping with Coalesced Films," which applications are hereby incorporated herein by reference in their entirety.

TECHNICAL FIELD

This patent application relates to semiconductor diodes made from compound semiconductors or other lattice mismatched semiconductors on silicon wafers, as well as methods of fabricating such semiconductor diodes, and more particularly, for photonic applications such as light emitting diodes (LEDs), lasers, photovoltaics, and other optoelectronic uses.

BACKGROUND

This section provides background information and introduces information related to various aspects of the disclosures that are described and/or claimed below. These background statements are not admissions of prior art.

The majority of chip manufacturing takes advantage of silicon processing on high-quality, large-area, low-cost silicon wafers. Commercial manufacturers of devices made from compound semiconductors such as gallium arsenide and indium phosphide generally have been unable to take advantage of silicon wafers. They typically build light emitting diodes (LEDs), multi junction solar cells, and other compound semiconductor devices on small, expensive wafers made of materials such as sapphire, germanium, gallium arsenide, or silicon carbide.

The challenge of making compound semiconductor devices on inexpensive substrates has widespread economic implications. Compound semiconductors are an important component of our communications infrastructure because they can emit and detect light. They are the materials in the lasers that transmit signals through optical fibers, the sensors that receive those signals, the amplifiers in cellular telephones, the amplifiers in cell phone base stations, and the circuits that transmit and receive microwave signals.

Light emitting diodes typically consist of gallium nitride films deposited onto sapphire or silicon carbide wafers. These exotic substrates contribute to the high cost of LEDs. A sapphire wafer 4 inches in diameter typically costs around $130, and a 2-inch silicon carbide wafer can cost about $2000. By contrast, an 8-inch silicon wafer, which provides four times as much surface area as a 4-inch wafer and 16 times as much surface area as a 2-inch wafer, typically costs less than $100.

High-efficiency multi junction solar cells typically contain layers of germanium, gallium arsenide, and indium gallium phosphide deposited onto germanium wafers. As is the case with wafers for LEDs, germanium wafers similarly are smaller and significantly more expensive than silicon wafers.

The ability to create compound semiconductor devices on silicon wafers facilitates market growth in several key industries.

Two key technical barriers have prevented the fabrication of compound semiconductor devices on silicon wafers: the mismatch of lattice constants and the mismatch of thermal expansion coefficients.

Lattice Mismatch:

In a crystal, the atoms sit in a regular periodic array known as a lattice. The distance between the atoms, known as the "lattice constant," is typically a few angstroms (1 angstrom=$10^{-10}$ meter). Silicon has a smaller lattice constant than many compound semiconductors. When compound semiconductors grow on silicon, crystalline imperfections known as misfit dislocations appear at the interface. The misfit dislocations create other crystalline defects known as threading dislocations, which propagate upward from the interface. Threading dislocations diminish the performance and the reliability of compound semiconductor devices such as lasers, solar cells, light-emitting diodes, etc.

Thermal Contraction Mismatch:

Compound semiconductors typically grow at high temperatures, which can exceed 1000° C. When the wafer cools, the compound semiconductor film may contract more than the silicon wafer. As a result, the wafer may bow in a concave manner, stressing and ultimately cracking the film.

Until recently, the most promising previous efforts to grow high-quality compound semiconductors onto silicon substrates have relied on three approaches: graded buffer layers, wafer bonding, or selective growth on mesas. None of these approaches has achieved commercial success.

In graded buffer layers, the composition of the material changes gradually from substantially pure silicon to a pure compound semiconductor. Since the lattice constant also changes gradually, crystalline defects are less likely to form at the interface. Unfortunately, the graded buffer layers have to be relatively thick (about ten microns for a 4% lattice mismatch). The thick buffer layer increases both the costs and the likelihood of cracking.

Wafer bonding involves growing devices on expensive substrates, then lifting off the devices and bonding them to a silicon wafer. This approach rules out modem silicon processing as a route to cost reduction. Furthermore, bonding typically requires temperatures above 300° C. When the materials cool, the compound semiconductors may crack because they contract more than the silicon wafer.

Selective growth on a mesa exploits the mobility of some dislocations. The strategy is to deposit compound semiconductors in small regions (10 to 100 microns in length), thereby providing a short path where mobile dislocations can glide to the edge of the region and remove themselves from the device. However, structures created by this technique typically have a high density of threading dislocations (more than 100 million per square centimeter). This technique cannot remove immobile dislocations, which predominate when the lattice mismatch exceeds 2%.

Aspect Ratio Trapping (J. S. Park et al., APL 90, 052113 (2007), hereby incorporated by reference in its entirety) is a recently developed technology that makes it possible to deposit high quality compound semiconductors, germanium or other lattice mismatched materials on silicon wafers. FIG. 1 illustrates the principle of Aspect Ratio Trapping (ART). A thin film of dielectric material 20 such as silicon dioxide ($SiO_2$) or silicon nitride ($SiN_x$) is deposited onto a silicon wafer 10. Those of skill in the art can select a variety of dielectric materials such as $SiO_xN_y$, and silicates or oxides of material such as Hf and Zr, such as HfO.

A trench is etched in the dielectric material, and then deposit a non-lattice-matched semiconductor 30 such as germanium or a compound semiconductor in the trench. The threading dislocations 40, shown as dotted lines, propagate upward, typically at approximately a 45 degree angle from the interface, then intersect the sidewalls of the trench, where they terminate. Threading dislocations 40 cannot propagate down the length of the trench because crystal facets guide them to the sidewalls. Reference is made to the region in the trench where the sidewalls trap threading dislocations as the "trapping region" 50. The upper region of the non-lattice-matched semiconductor 30, above the trapping region 50, is a relatively defect-free region 60.

ART addresses the issue of cracking caused from mismatch of thermal expansion coefficients for these reasons: (1) the stresses are small because the epitaxial layers are thin; (2) the material can elastically accommodate the stresses arising from thermal expansion mismatch because dimensions of the ART openings are small; and (3) the $SiO_2$ pedestals, which are more compliant than the semiconductor materials, may deform to accommodate the stress.

SUMMARY OF THE DISCLOSURE

In accordance with an embodiment, a diode comprises a substrate, a dielectric material including an opening that exposes a portion of the substrate, the opening having an aspect ratio of at least 1, a bottom diode material including a lower region disposed at least partly in the opening and an upper region extending above the opening, the bottom diode material comprising a semiconductor material that is lattice mismatched to the substrate, a top diode material proximate the upper region of the bottom diode material, and an active diode region between the top and bottom diode materials, the active diode region including a surface extending away from the top surface of the substrate.

In accordance with another embodiment, a diode comprises a substrate, a bottom diode material that is lattice mismatched to the substrate, the bottom diode material extending above a top surface of the substrate and including a bottom diode section having a width across the top surface and a height above the top surface, the height being greater than the width, a top diode material proximate the bottom diode material, and an active light emitting diode region between the top and bottom diode materials, the active diode region including a surface extending away from the top surface.

A further embodiment is a method of making a diode. The method comprises depositing a layer of a dielectric material on a substrate, patterning an opening in the dielectric material to expose a portion of the substrate, the opening having an aspect ratio of at least 1, forming a bottom diode region by growing a compound semiconductor material that is lattice mismatched to the substrate in and above the opening, forming an active diode region adjacent the bottom diode region, and forming a top diode region adjacent the active diode region.

BRIEF DESCRIPTION OF THE DRAWINGS

For a more complete understanding of embodiments, and the advantages thereof, reference is now made to the following descriptions taken in conjunction with the accompanying drawings, in which.

DETAILED DESCRIPTION

The making and using of the present embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The exemplary diode structures are generally discussed in the context of a single diode, although semiconductor engineers and others skilled in the art will understand that most applications require multiple diodes, typically integrated on a single chip.

Figure 1:
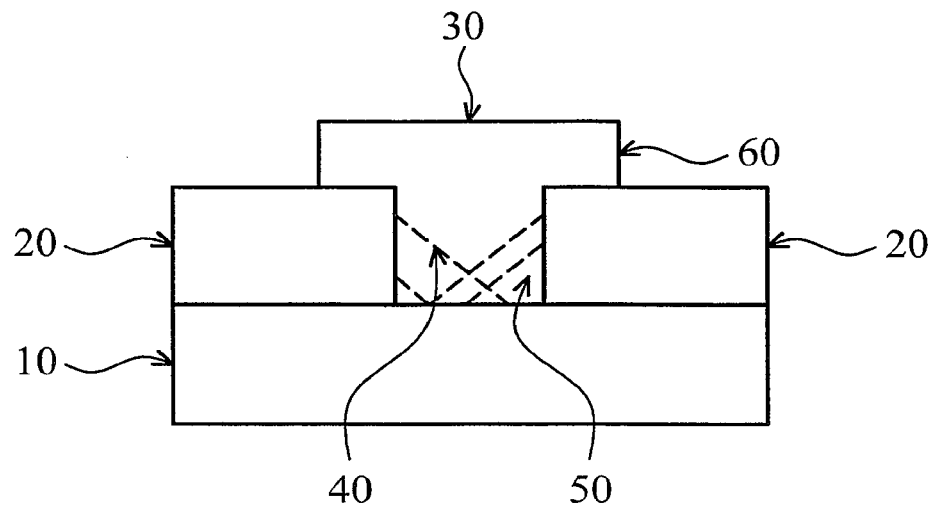
FIG. 1 illustrates the principle of Aspect Ratio Trapping (ART)
Figure 2:
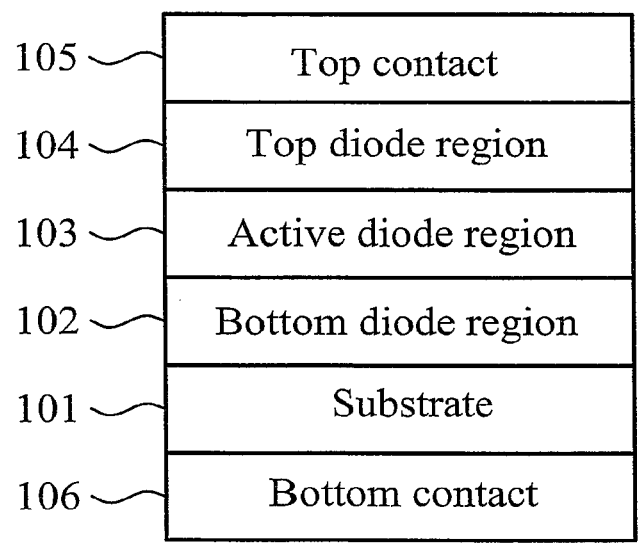
FIG. 2 shows the generic structure of semiconductor diodes according to embodiments.

In general, semiconductor diodes disclosed in this document have the generic structure illustrated in FIG. 2. The structure comprises a substrate 101, a bottom diode region 102, an active diode region 103, a top diode region 104, an electrical contact on the top of the device 105, and an electrical contact on the bottom of the device 106. Each region 102, 103, and 104 can contain multiple layers.

The bottom diode region 102 and the top diode region 104 have opposite doping types. For example, if the bottom diode region 102 is predominantly n-type doped (with an electron donor such phosphorous, arsenic, or antimony), then the top diode region 104 will be predominantly p-type doped (with an electron acceptor such as boron or aluminum), and vice versa. Heavy doping in both the bottom diode region 102 and the top diode region 104 provides a low-resistance pathway for current to enter and leave the device. Typical doping levels of the top and bottom regions would be in the range of $10^{17}$-$10^{20}$ cm$^{-3}$. Typical doping level of the active region would be below $10^{17}$ cm$^{-3}$. Note that the use of "top" and "bottom" for designating regions is a matter of convenience and in some frames of reference a top region can be located above a bottom region. For example, consider a diode formed above a substrate with its top region formed above its bottom region. If the diode is flip-chip bonded to a handle wafer and then the substrate is removed, the frame of reference for viewing the diode typically is flipped. In this case the top region will be viewed as being below the bottom region.

The substrate 101 is typically a silicon wafer, although in different embodiments a variety of other substrates including sapphire and silicon carbide are suitable. At least some portion of the substrate 101 will have the same predominant doping type (either n or p) as the bottom diode region 102. As a result, it will be possible to make good electrical contact between the bottom diode region 102 and the substrate 101.

The detailed structure of the active diode region 103 may depend upon numerous factors, including the intended application. In one form, the active diode region 103 is formed by the junction of the top diode region 104 and the bottom diode region 104. In this case, it can be desirable to vary the doping of the top and bottom regions near the junction. In an LED, the active diode region 103 may contain many layers that include both doped layers and thin undoped quantum wells where electrons and holes can recombine and generate photons. In another example of a solar cell, the active diode region 103 may consist of a single layer of moderately n-doped or moderately p-doped semiconductor material to absorb incident photons and generate an electron-hole pair.

The materials used to form the diode regions are well known to those of skill in the art. Typical examples of useful semiconductor materials are: Group IV materials, such as Si, C, or Ge, or alloys of these such as SiC or SiGe; Group II-VI compounds (including binary, ternary, and quaternary forms), e.g., compounds formed from Group II materials such as Zn, Mg, Be or Cd and Group VI materials such as Te, Se or S, such as ZnSe, ZnSTe, or ZnMgSTe; and Group III-V compounds (including binary, ternary, and quaternary forms), e.g., compounds formed from Group III materials such as In, Al, or Ga and group V materials such as As, P, Sb or N, such as InP, GaAs, GaN, InAlAs, AlGaN, InAlGaAs, etc. Examples of III-N compounds include aluminum nitride (AlN), gallium nitride (GaN), indium nitride (InN), and their ternary and quaternary compounds. Thus, the semiconductor material may include at least one of a group IV element or compound, a III-V or III-N compound, or a II-VI compound. Those of skill in the art understand how to select and process these materials based desired properties such as bandgaps, lattice constants, doping levels, etc.

Figure 3:
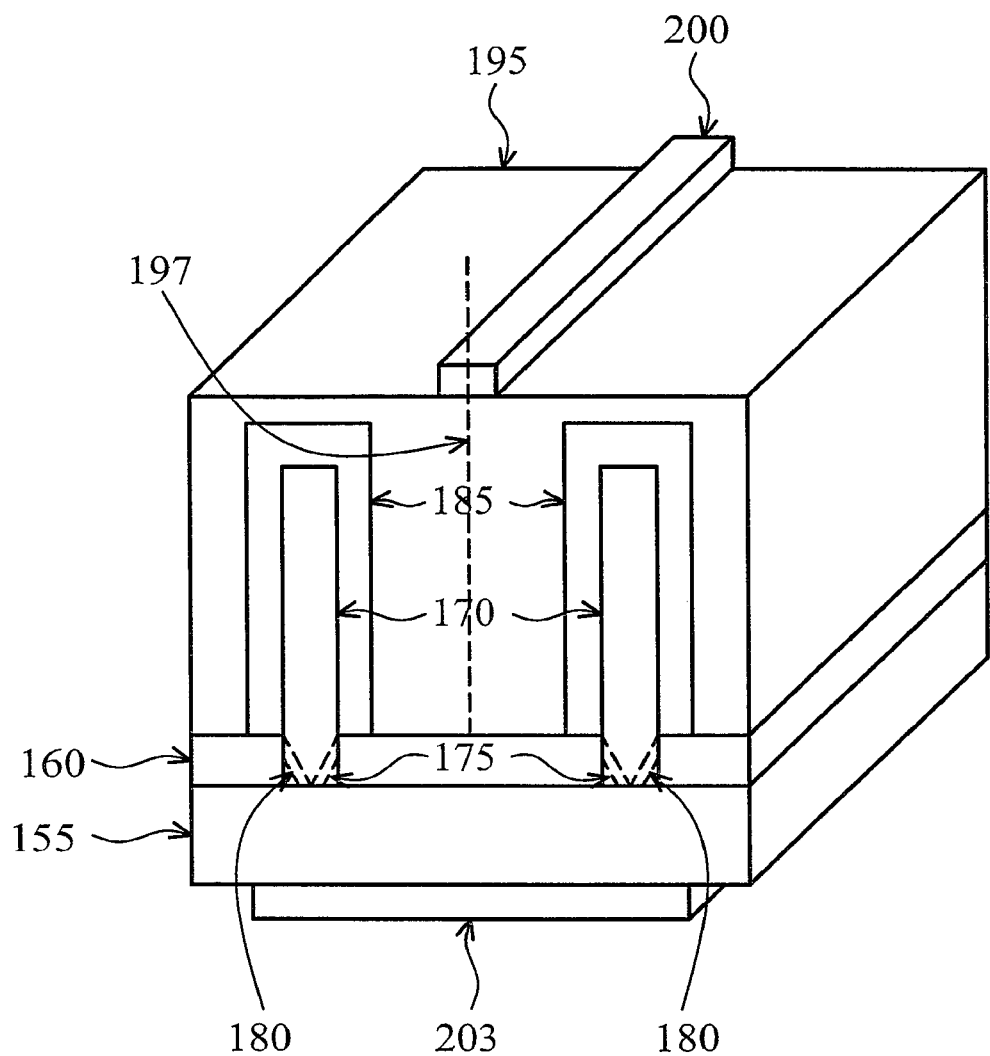
FIG. 3 is a first embodiment of a diode configured in the shape of a fin.
Figure 4:
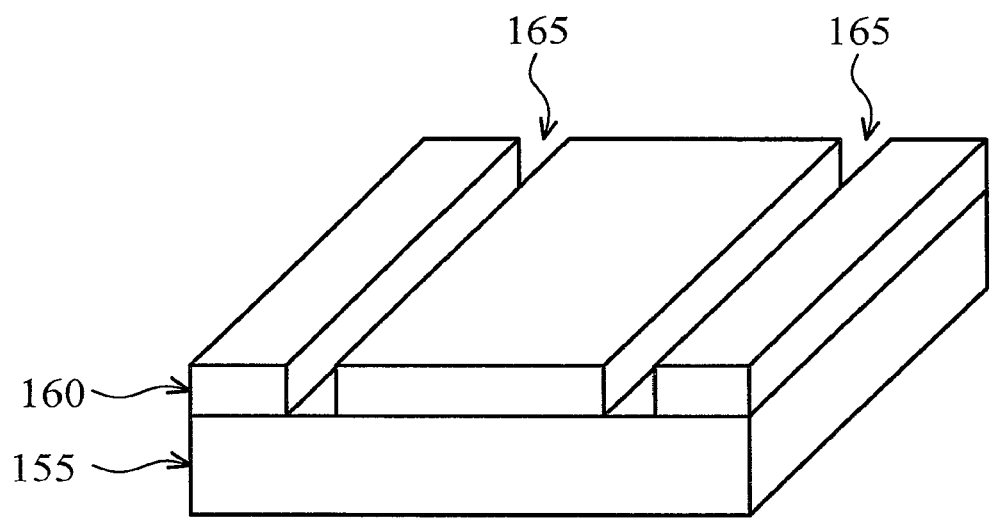
FIGS. 4 and 5 are exemplary stages in the formation of the embodiment of FIG. 3.

FIG. 3 shows a semiconductor diode according to a first exemplary embodiment. FIG. 4 shows an example physical foundation for FIG. 3, including a substrate 155, such as a silicon wafer, in which for many photonic applications such as LEDs or solar cells the surface often may have a (111) crystal orientation, although in other embodiments other orientations such as (100) are selected. The substrate 155 can be either n-doped or p-doped, depending on the configuration of the diode-based device. Other suitable substrates may include sapphire and silicon carbide.

To prepare the diode of FIG. 3, a first step is to deposit a layer of dielectric material 160, such as SiO$_2$ or silicon nitride onto the silicon substrate 155 by chemical vapor deposition (CVD) or another deposition technique. In devices where reflection of light from the dielectric layer may create a problem, silicon nitride is generally preferable because its index of refraction is closer to that of common semiconductor materials. The thickness of the dielectric film is typically 200 to 400 nm, but it can be thicker or thinner.

A trench or trenches 165 are patterned with substantially vertical sidewalls in the layer of dielectric material 160, thereby exposing a portion of the surface of the silicon substrate 155, as shown in FIG. 4. The number of trenches may be 1 or more than 1, such as 2, 3, 4, 5, 6, or even more depending upon the desired application. It is possible to pattern a trench by conventional photolithography or reactive ion etch techniques. As would be recognized by one skilled in the art based on the disclosure herein, the trench could be another shaped opening such as a hole, recess, or ring, for example. The width of the trench 165 is preferably equal to or less than the thickness of the dielectric material. This condition emerges from the requirements of Aspect Ratio Trapping: the ratio of the height of the trench 165 to the width of the trench 165 is preferably greater than or equal to 1 in order to trap substantially all threading dislocations. This technique is disclosed in earlier commonly assigned patent applications (e.g., U.S. patent application Ser. No. 11/436,198, filed on May 17, 2006, entitled "LATTICE-MISMATCHED SEMICONDUCTOR STRUCTURES WITH REDUCED DISLOCATION DEFECT DENSITIES AND RELATED METHODS FOR DEVICE FABRICATION;" U.S. patent application Ser. No. 12/180,254, filed on Jun. 25, 2008, entitled "LATTICE-MISMATCHED SEMICONDUCTOR STRUCTURES WITH REDUCED DISLOCATION DEFECT DENSITIES AND RELATED METHODS FOR DEVICE FABRICATION;" U.S. patent application Ser. No. 11/436,062, filed on May 17, 2006, entitled "LATTICE-MISMATCHED SEMICONDUCTOR STRUCTURES WITH REDUCED DISLOCATION DEFECT DENSITIES AND RELATED METHODS FOR DEVICE FABRICATION;" U.S. Provisional Application Ser. No. 60/842,771, filed on Sep. 7, 2006, entitled "DEFECT REDUCTION OF SELECTIVE Ge EPITAXY IN TRENCHES ON Si(001) SUBSTRATES USING ASPECT RATIO TRAPPING;" U.S. patent application Ser. No. 11/852,078, filed on Sep. 7, 2007, entitled "DEFECT REDUCTION USING ASPECT RATIO TRAPPING," which are all hereby incorporated in their entirety by reference) and in peer-reviewed journal articles (Park et al., APL 90, 052113 [2007], which is hereby incorporated in its entirety by reference).

In some cases, it may be advantageous to clean the surface of the silicon substrate 155 at the bottom of the trenches 165 by standard techniques to prepare for epitaxial growth of the bottom diode region. See, e.g., (Park et al., APL 90, 052113 [2007]).

Figure 5:
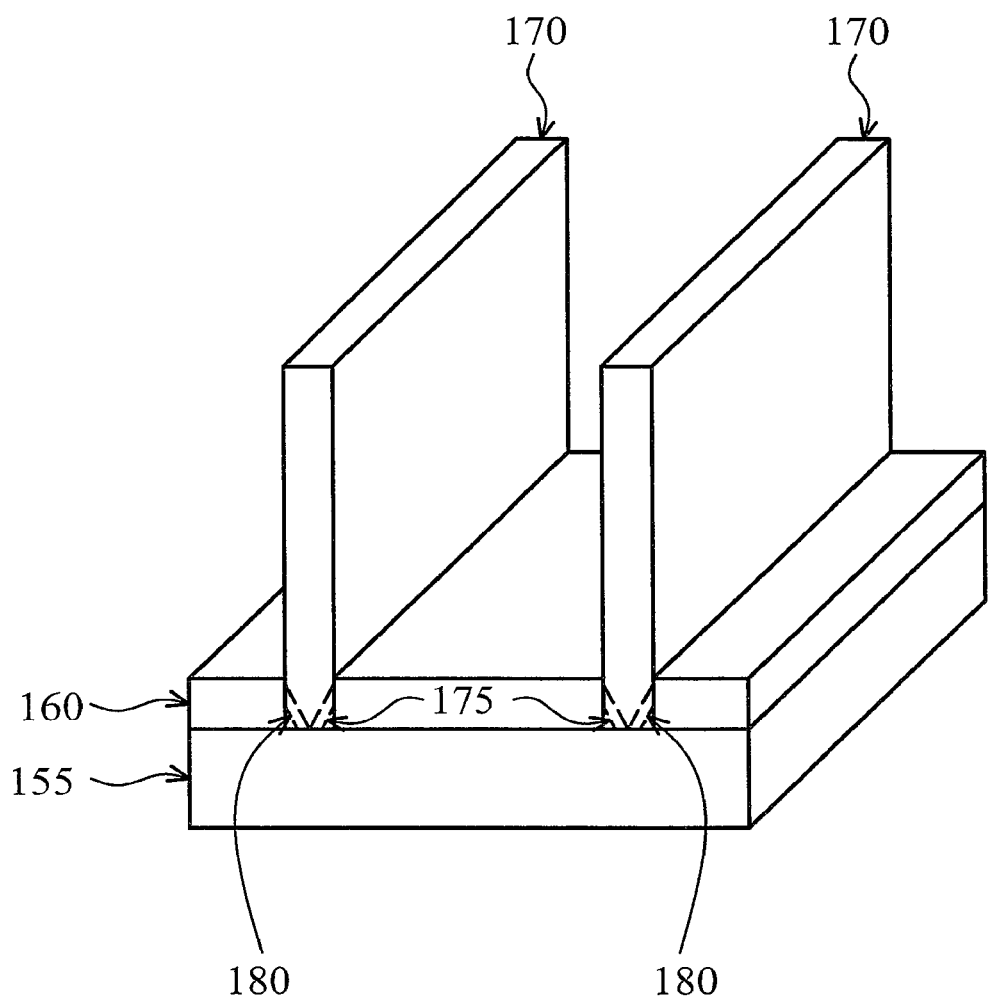

Another step is to grow the bottom diode region 170, thereby creating the structure shown in FIG. 5. The material for the bottom diode region 170 depends on the device. For a solar cell, the bottom diode region 170 can be, for example, indium gallium phosphide (InGaP). For a LED, the bottom diode region 170 can be, for example, GaN, AlN, InN, or binary, ternary, or quaternary compounds comprised of these. The bottom diode region 170 can also be made from many other semiconductor materials including compound semiconductor materials such as binary, ternary, and quaternary combinations of at least one group III element chosen from Ga, In, or Al, plus at least one group V element chosen from As, P, or Sb, which have useful properties for devices such as LEDs, lasers and resonant tunneling diodes.

It is possible to dope the bottom diode region 170 in situ during epitaxial growth or to dope it ex situ by ion implantation. (As a general matter, it is generally preferable to dope the bottom diode regions, active diode regions, and top diode regions mentioned in this disclosure, and it is possible to dope them either in situ during epitaxial growth or ex situ by ion implantation.)

In FIG. 5, the bottom diode region 170 has the configuration of a free-standing fin. Jinichiro Noborisaka and his colleagues at Hokkaido University have described methods of growing free-standing vertical structures such as nanowires by metal-organic vapor phase epitaxy (Noborisaka et al., Appl. Phys. Lett. 86, 213102 [2005]; Noborisaka et al., Appl. Phys. Lett. 87, 093109 [2005]), which are hereby incorporated by reference in their entirety. The Hokkaido group identified growth conditions in which the crystal phases which accumulate on the top of the structure grow much faster than the crystal phases which accumulate on its sides. In other words, these growth conditions favor growth perpendicular to the plane of the substrate while suppressing growth parallel to the plane of the substrate. To establish these growth conditions, the Hokkaido group adjusted variables such as the partial pressure of the gas precursors, the ratio of elements in the gas precursors, and the temperature of the substrate. These methods may be applied to grow the bottom diode region 170 in the form of a free-standing fin as shown in FIG. 5. Preferably, the dielectric sidewalls of the trenches will have a {110} crystal orientation so that the subsequent epitaxial fin has {110} sidewalls, which are stable and grow slowly or not at all under the growth conditions described by Noborisaka et al.

The lower region of the fin, which is surrounded by the vertical sidewalls of the dielectric material 160, may be called the "trapping region" 175 because it traps dislocations including the threading dislocations 180. Threading dislocations originate at the interface between the fin-shaped bottom diode region 170 and the substrate 155, and they propagate upward at angles of approximately 45 degrees. FIG. 5 shows the threading dislocations 180 as dashed lines. The portion of the bottom diode region 170 which lies above the trapping region 175 remains relatively free of defects. This low-defect region enables us to create high-quality compound semiconductor devices on high-quality, large-area, low-cost silicon wafers. For some materials, such as GaN, InN, AN, or ternary or quarternary combinations of these, a dislocation density of e.g. less than or equal to $10^8/cm^2$ is low enough to be useful for device applications. For some other materials, such as GaAs and InP, a somewhat lower dislocation density is typically required to be useful for devices, e.g. less than or equal to $10^6/cm^2$.

Figure 6:
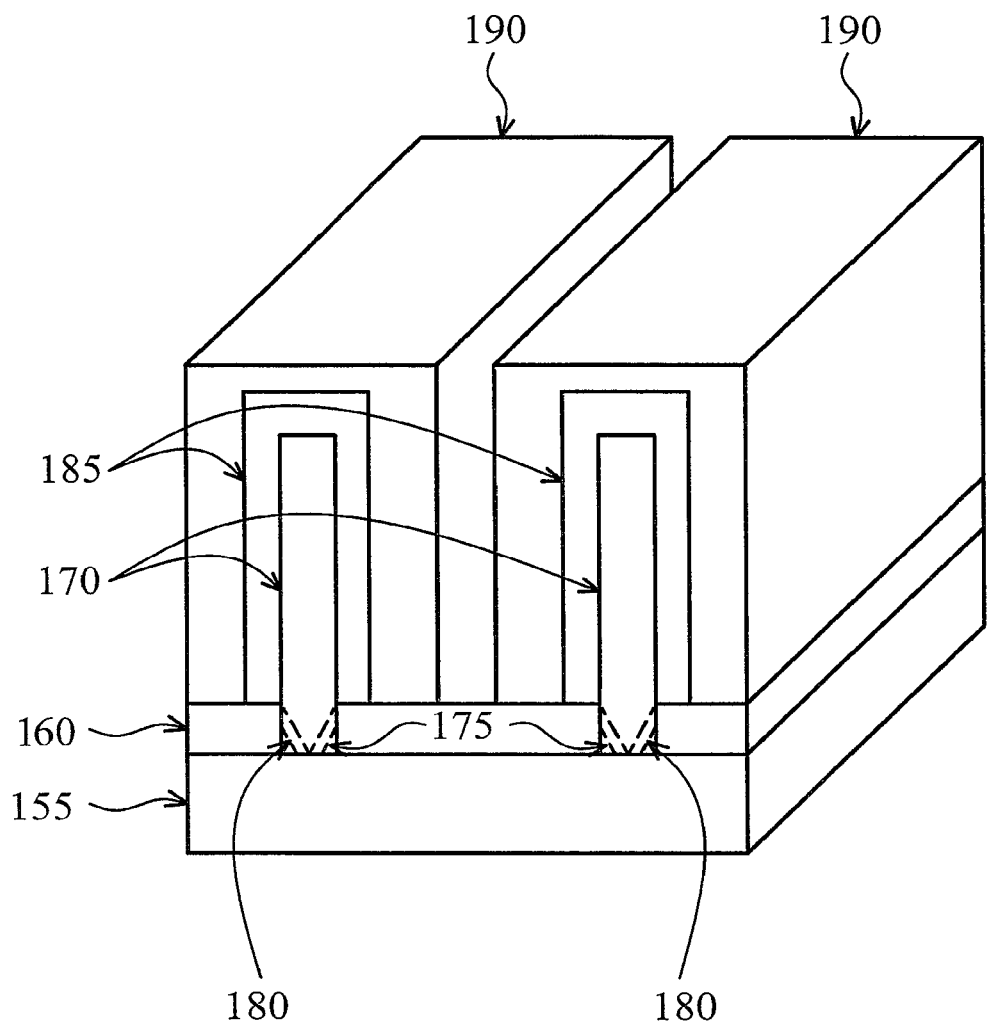
FIG. 6 is an alternate embodiment of the embodiment of FIG. 3.

FIG. 6 shows a step to grow the active diode region 185. The detailed structure of the active diode region 185 depends on the device; for example, it can include multiple quantum wells or a single layer of moderately doped semiconductor. Before growing the active device region 185, the growth conditions may be adjusted so that the crystal phases which accumulate on the sides of the bottom diode region 170 grow at approximately the same rate as the phases which accumulate on the top of the bottom diode region 170. As a result, the active diode region 185 can grow conformally around the outside of the bottom diode region 170. Noborisaka and his colleagues have described the growth conditions (Noborisaka et al., Appl. Phys. Lett. 87, 093109 [2005]).

In this embodiment and other embodiments, it is preferred that the active diode region 185 and the top diode region 190 have approximately the same lattice constants as the bottom diode region, although the lattice constants do not have to be approximately the same. As a result of having approximately the same lattice constants, few if any defects will form at the interfaces between the diode regions.

As is further shown in FIG. 6, the top diode region 190 is grown. The semiconductor material for the top diode region depends on the device. The doping of the top diode region 190 will be the opposite of the doping of the bottom diode region 170; if one is p-type, the other will be n-type, and vice versa.

In FIG. 6, the width of the top diode regions 190 is limited so that an opening remains between adjacent fins. This architecture is appropriate for a solar cell, where it is important to reduce or minimize the probability that the top diode region 190 will absorb the incoming light. Electron-hole pairs created in the top diode region 190 will not generate any useful electricity if they recombine before they reach the active diode region 185. The amount of material in the top diode region 190 may be reduced or minimized by leaving free space between the fins and by making the top diode region 190 as thin as possible. In this case, the top diode region could have a thickness in the range, e.g., of 10-500 nm.

When engineering a solar cell from the architecture shown in FIG. 6, efficiency can be increased by keeping the distance between adjacent active diode regions 185 smaller than the wavelength of the incident light. This strategy may prevent the incident light from entering the free space between the active regions 185 and reaching the silicon substrate 155, which can reduce the efficiency of the solar cell.

FIG. 3 shows an alternate approach, in which the top diode region 195 is further grown so that it fills the entire volume between adjacent fins. With this architecture, crystalline defects known as coalescence defects can form at the intersection 197 of the growth fronts, represented by the dotted line in FIG. 3. Since these defects reside far from the active region of the diode, any impairment of device performance may be reduced or minimized. When continuing to grow the top diode region 195, it can be useful to select growth conditions which favor growth parallel to the plane of the silicon substrate 155 and suppress growth perpendicular to the plane of the silicon substrate 155.

FIG. 3 also shows the structure after fabricating the top electrical contact 200 and the bottom electrical contact 203 by standard techniques. Those skilled in the art understand there are many suitable materials for the electrical contacts, such as a strip of conductive metal such as copper, silver, or aluminum, or a layer of relatively transparent conductive oxide such as indium tin oxide. For LEDs, the bottom electrical contact 203 is preferably a highly reflective conductive material such as silver, which can reflect the internally created light so it will exit the LED from another surface. Those skilled in the art understand there are many ways to couple the bottom electrical contact 203 to the bottom diode region 170 though the substrate 155 such as forming contact vias to make such an electrical connection. A single bottom electrical contact 203 may serve multiple diode elements.

One feature of the architecture shown in FIG. 3, in which the top diode region 195 fills up the entire volume between adjacent fins, is that a single top diode region 195 makes physical contact (and therefore electrical contact) with active diode regions 185 in multiple other diodes. This architecture is particularly advantageous for LEDs because it can reduce or minimize the area of the top electrical contacts 200, which can block emission of the light generated within the active diode region 185. With a common top diode region 195, each diode element may not need its own top electrical contact 200; a single top electrical contact 200 can serve multiple diode elements.

The additional semiconductor material in the common top diode region 195 of FIG. 3, compared with FIG. 6, does not impair the performance of an LED. The top diode region 195 generally will not absorb a significant number of or any emitted photons, provided that the bandgap of the semiconductor material in the top diode region is wider than the bandgap of the semiconductor material in the active diode region.

The structures shown in both FIGS. 3 and 6 may offer various performance advantages compared with conventional LEDs. For example, the preferred material for fabricating a blue LED on a substrate, such as a single crystal silicon substrate, is gallium nitride. Gallium nitride, which has a wurtzite crystal structure, naturally grows with its c-plane parallel to the silicon substrate 155 and with its m-planes and a-planes normal to the silicon substrate 155. In conventional LEDs, one factor limiting internal quantum efficiency is that the polar c-plane of gallium nitride faces the semiconductor diode. The structures shown in FIGS. 3 and 6 may deliver higher internal quantum efficiency because non-polar m-planes or a-planes of gallium nitride face the diode. In one preferred LED structure, the bottom diode region 170, active diode region 185, and top diode region 195 are made from gallium nitride and indium gallium nitride, m-plane or a-plane crystal surfaces of gallium nitride form the interface between the bottom diode region 170 and the active diode region 185, and m-plane or a-plane crystal surfaces of gallium nitride form the interface between the active diode 185 region and the top diode region 195.

Further, structures shown in both FIGS. 3 and 6 can also be used for LEDs based on cubic materials such as GaAs and AlGaAs.

The following are examples of process parameters to form the bottom, active, and top diode regions according to embodiments in this disclosure. First, a substrate and a patterned dielectric layer as known in the art are provided. Process parameters for bottom, active, and top diode regions, of a GaAs and AlGaAs-based LED, according to the first embodiment are as follows.

In this example, the bottom diode region can be a pillar or fm (central pillar or fin) of GaAs having height dimensions greater than width or radial dimensions (e.g., 1 micron in height and 100 nm in width). Growth conditions (e.g., CVD) include i) pressure: 0.1 atm ii) precursors: TMG (Trimethylgallium) and 20% $AsH_3$ (Arsine), diluted in $H_2$, iii) temperature: 750 C and iv) dopant: n-type. To make the bottom diode region N-type, one dopant is silicon. To highly enhance vertical growth, the partial pressure of $AsH_3$ may be relatively low for this step, compared to what would normally be used for GaAs growth as understood by those well versed in the art. For example, the partial pressure of $AsH_3$ could be 5-10× lower than normal. Because this is a reactor-dependent value, no absolute value is given here.

Further in this example, the active diode region can include a plurality of layers being a first confinement layer, a quantum well layer and a second confinement layer at the bottom diode layer.

Growth conditions for an AlGaAs layer for carrier confinement (e.g., 15 nm thick) include i) pressure: 0.1 atm, ii) precursors: TMG, TMA (Trimethylaluminium), and 20% arsine, diluted in $H_2$, iii) temperature: 850 C and iv) dopant: N-type dopant is silicon.

Growth conditions for a GaAs quantum well layer for emission (e.g., 10 nm thick) include i) pressure: 0.1 aim, ii) precursors: TMG and 20% arsine, diluted in $H_2$, iii) temperature: 720 C and iv) dopant: no doping.

Growth conditions for an AlGaAs layer for carrier confinement (e.g., 15 nm thick) include i) pressure: 0.1 atm, ii) precursors: TMG, TMA (Trimethylaluminium), and 20% arsine, diluted in $H_2$, iii) temperature: 850 C and iv) dopant: P-type dopant with zinc.

Continuing in this example, the top diode region is at or on the active diode layer (e.g., 0.5 micron thick). Growth conditions for a layer of GaAs include i) pressure: 0.1 atm, ii) precursors: TMG and 20% arsine, diluted in $H_2$, iii) temperature: 720 C and iv) dopant: P-type dopant is zinc.

The embodiment shown in FIG. 3 can comprise a semiconductor diode made from compound semiconductors or other lattice mismatched materials on a silicon substrate and may comprise a silicon substrate 155; a layer of dielectric material 160 covering the silicon substrate 155, the layer of dielectric material 160 containing a trench 165, which exposes the surface of the silicon substrate 155, the trench having substantially vertical sidewalls, and the ratio of the height of the trench to the width of the trench being greater to or equal to 1; a bottom diode region 170 of semiconductor material filling the trench and extending upward in the shape of a fin; a trapping region 175 in the lowest segment of the bottom diode region 170 wherein threading dislocations 180 intersect the sidewalls of the dielectric material 160 and terminate (e.g., at a reduced defect area); an active diode region 185 of semiconductor material grown conformally around the bottom diode region 170; a top diode region 195 of semiconductor material grown conformally around the active diode region; a top electrical contact 200; and a bottom electrical contact 203.

Figure 7:
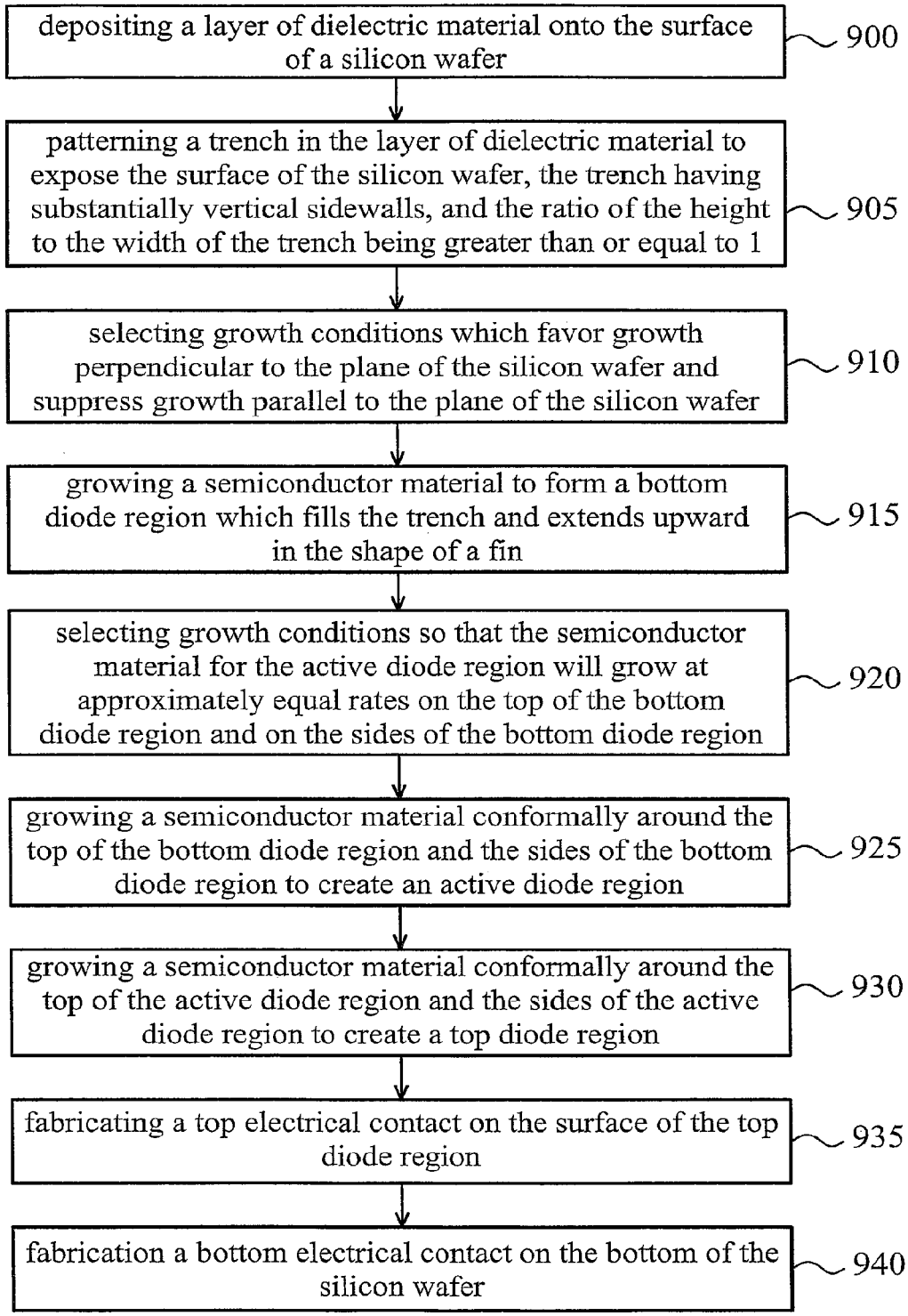
FIG. 7 summarizes a first method according to an embodiment for forming the embodiment of FIG. 3.

FIG. 7 summarizes a method of fabricating the semiconductor diode shown in FIG. 3—specifically, a method of fabricating a diode made from compound semiconductors or other lattice mismatched materials on a silicon substrate comprising the following steps. Step 900 includes depositing a layer of dielectric material, such as dielectric material 160, onto the surface of a silicon substrate, such as silicon substrate 155. Step 905 includes patterning a trench in the layer of dielectric material, such as trench 165 in dielectric material 160, to expose the surface of the silicon substrate, the trench having substantially vertical sidewalls, and the ratio of the height to the width of the trench being greater than or equal to 1. Step 910 includes selecting growth conditions which favor growth perpendicular to the plane of the silicon substrate and suppress growth parallel to the plane of the silicon substrate. Step 915 includes growing a semiconductor material to form a bottom diode region, such as bottom diode region 170, which fills the trench and extends upward in the shape of a fin. Step 920 includes selecting growth conditions so that the semiconductor material for the active diode region, such as active diode region 185, will grow at approximately equal rates on the top of the bottom diode region and on the sides of the bottom diode region. Step 925 includes growing a semiconductor material conformally around the top of the bottom diode region and the sides of the bottom diode region to create an active diode region, such as active diode region 185. Step 930 includes growing a semiconductor material conformally around the top of the active diode region and the sides of the active diode region to create a top diode region, such as top diode region 195. Step 935 includes fabricating a top electrical contact, such as top electrical contact 200, on the surface of the top diode region. Step 940 includes fabricating a bottom electrical contact, such as bottom electrical contact 203, on the bottom of the silicon substrate.

Figure 8:
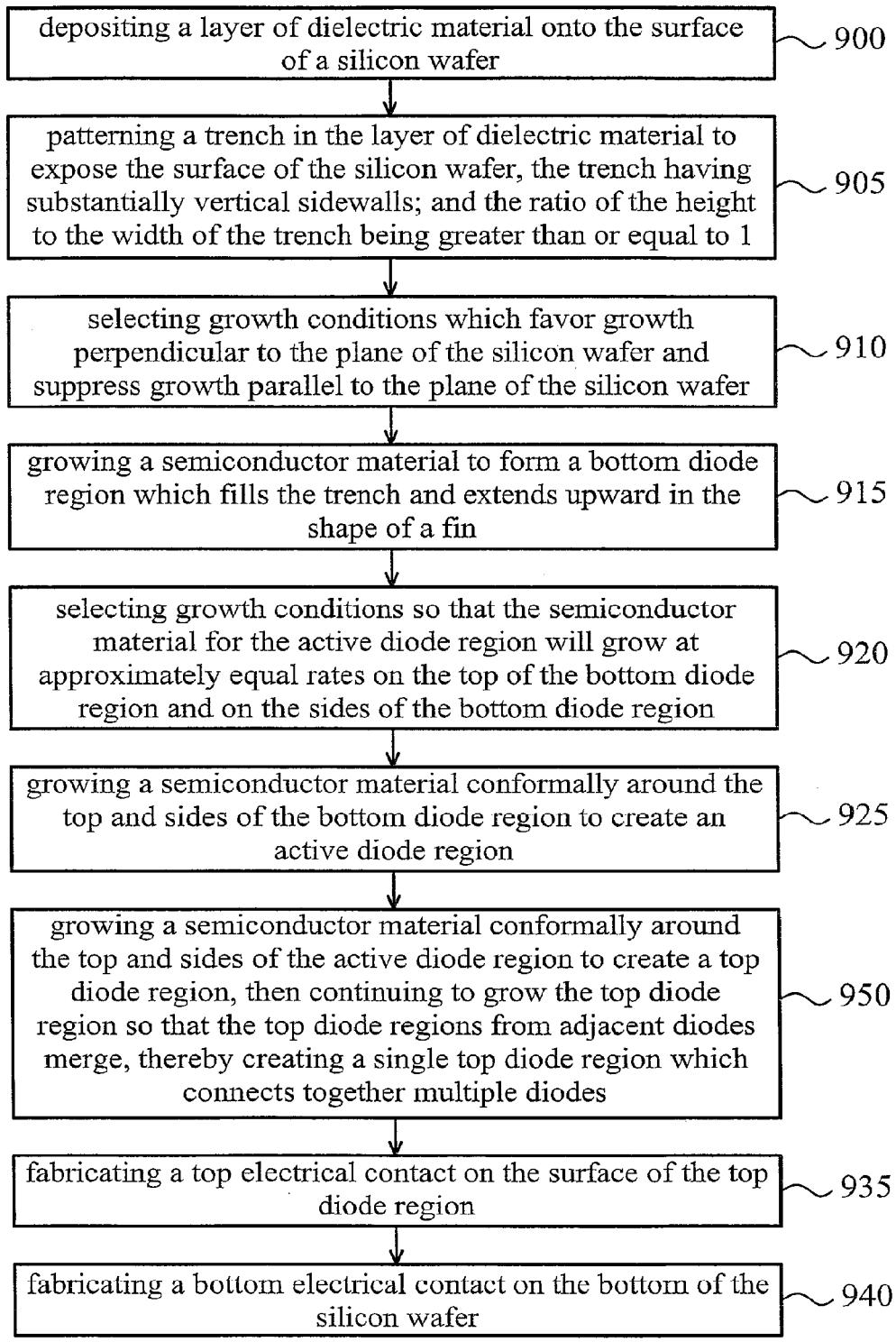
FIG. 8 summarizes a second method according to an embodiment for forming the embodiment of FIG. 3.

In another embodiment shown in FIG. 8, step 950 includes continuing to grow the top diode region so that the top diode regions from adjacent diodes merge, thereby creating a single top diode region which connects together multiple diodes.

In a further alternative embodiment, a method takes into consideration the fact that the technique for growing free-standing vertical structures as described by Noborisaka and his colleagues may not work under all conditions. For example, it will not generally be possible to grow free-standing vertical structures if the silicon substrate has a (100) crystal surface.

Figure 9:
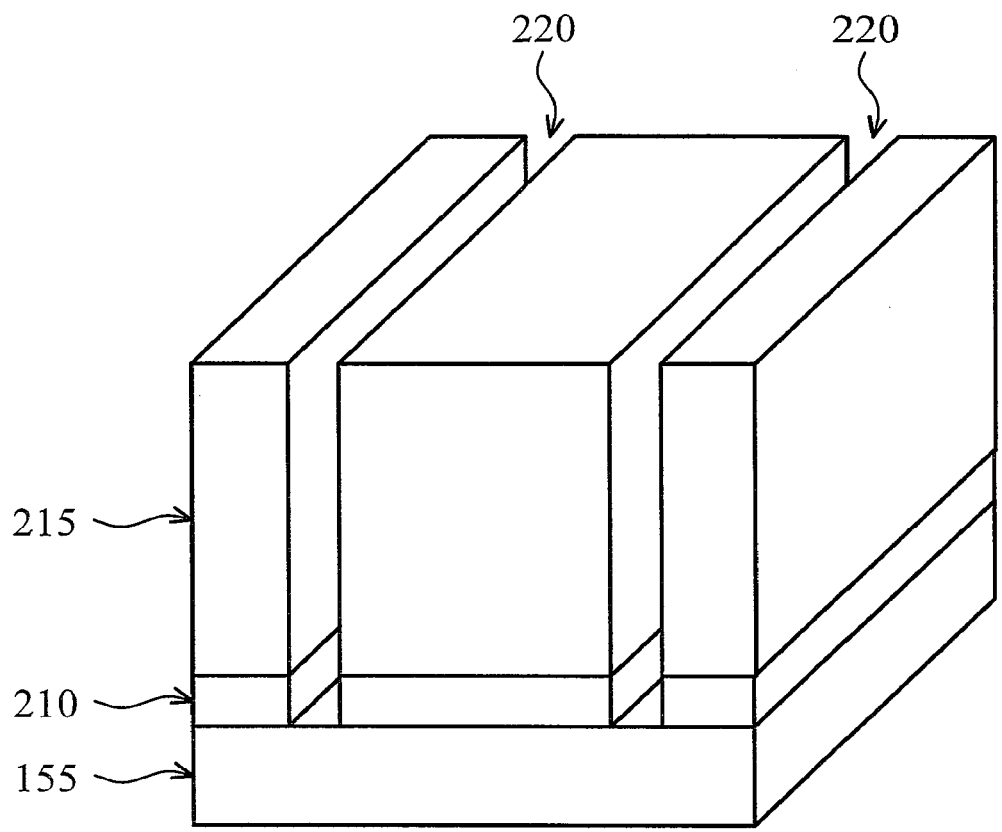
FIGS. 9 and 10 show alternate steps for fabricating the embodiment of FIG. 3.

This method begins with an appropriately doped silicon substrate 155, as shown in FIG. 9. A first layer of dielectric material 210 is grown on the surface of the silicon substrate 155. In some embodiments, the preferred material for the first dielectric layer 210 is silicon nitride. This first dielectric layer 210 should be thick enough to trap defects after creating trenches in it; e.g., the thickness of the first dielectric layer 210 should be equal to or greater than the width of the trenches.

A second dielectric layer 215 is grown on top of the first dielectric layer 210. In some embodiments, the preferred material for this second dielectric layer is silicon dioxide ($SiO_2$).

Trenches 220 are patterned with substantially vertical sidewalls through both dielectric layers 210 and 215, exposing a portion of the surface of the silicon substrate 155. An optional step is to clean the surface of the silicon substrate 155 at the bottom of the trenches 220, such as by the cleaning method described above.

Figure 10:
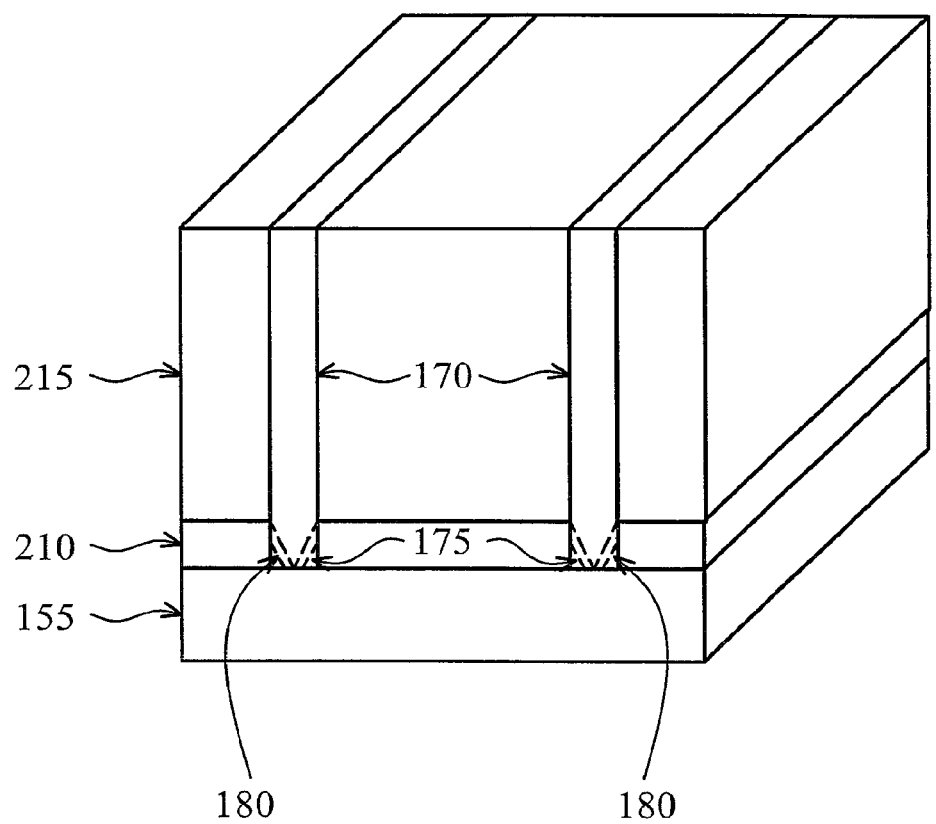

The bottom diode region 170 is grown by filling the trenches with a semiconductor material, as shown in FIG. 10. Because there is a lattice mismatch between silicon the bottom diode region semiconductor material, misfit dislocations may form at the interface between the silicon substrate 155 and the bottom diode region 170. Threading dislocations 180 may propagate upward at an angle, intersect the sidewalls of the first dielectric layer 210, and terminate within the trapping region 175. The segment of the bottom diode region 170 above the trapping region 175 may be relatively free of defects and suitable for high-performance devices. In this way, compound semiconductor devices on silicon substrates can be created.

The second dielectric layer 215 is removed with a process such as a wet etch with hydrofluoric acid and water. This process will selectively remove the second ($SiO_2$) dielectric layer 215 without attacking either the first ($SiN_x$) dielectric layer 210 or any of the semiconductor materials that may comprise the bottom diode region 225. The resultant structure appears in FIG. 5. Thus, this method describes a different way to fabricate the bottom diode region configured in the shape of a fin.

This method continues as described above and illustrated in FIGS. 3 and 6: deposit the active diode region 185, the top diode region 190, and the top and bottom electrical contacts 200 and 203.

Figure 11:
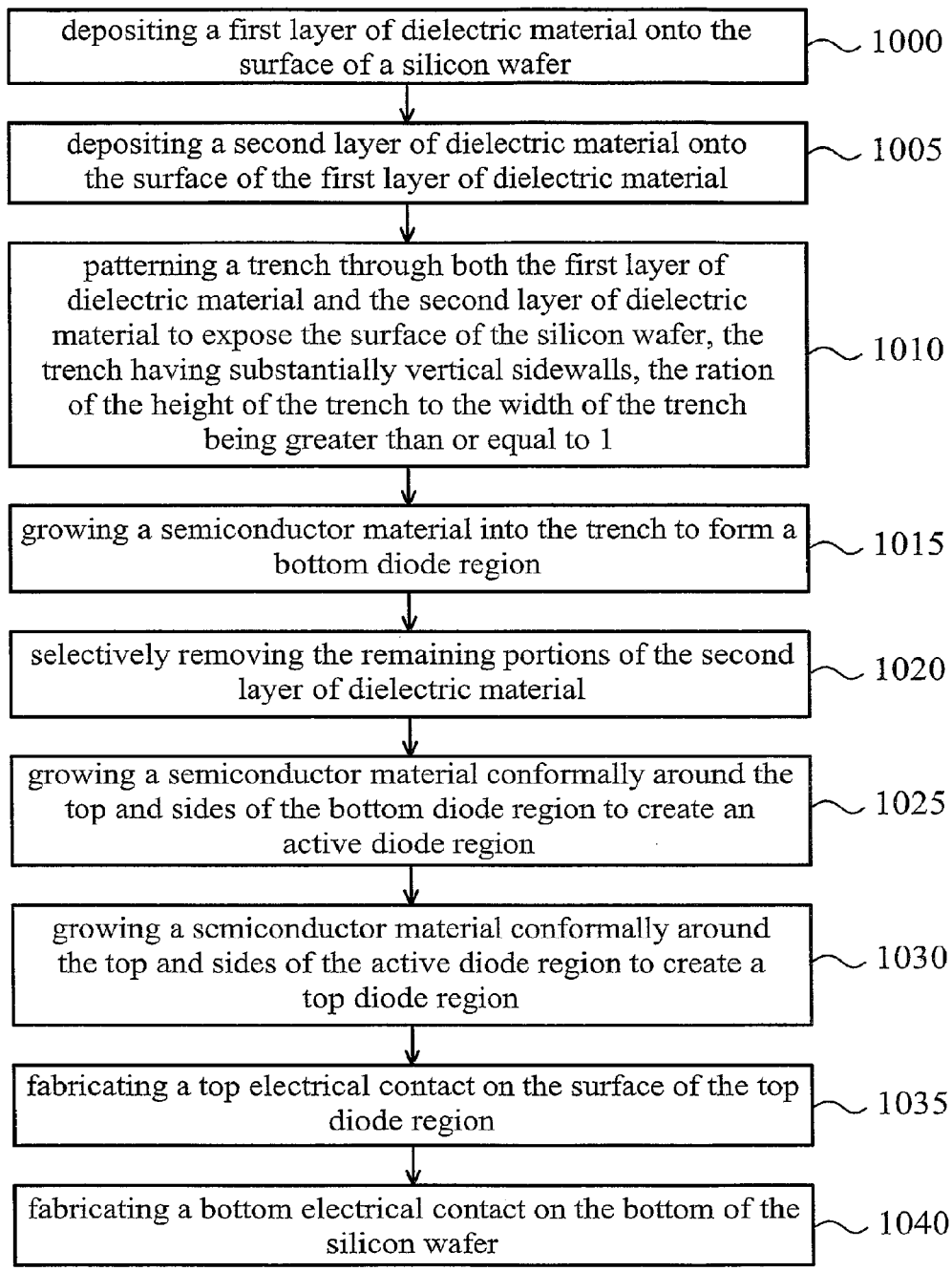
FIG. 11 summarizes a third method according to an embodiment for forming the embodiment of FIG. 3.

FIG. 11 summarizes this alternative method that is depicted, at least partially by FIGS. 9 and 10, which comprises the following steps. Step 1000 includes depositing a first layer of dielectric material, such as first dielectric layer 210, onto the surface of a silicon substrate, such as silicon substrate 155. Step 1005 includes depositing a second layer of dielectric material, such as second dielectric layer 215, onto the surface of the first layer of dielectric material, the second layer of dielectric material having different characteristics than the first layer of dielectric material. Step 1010 includes patterning a trench, such as trench 220, through both the first layer of dielectric material and the second layer of dielectric material to expose the surface of the silicon substrate, the trench having substantially, vertical sidewalls, the ratio of the height of the trench to the width of the trench being equal to or greater than 1 (e.g., in the first layer of dielectric material). Step 1015 includes growing a semiconductor material into the trench to form a bottom diode region, such as bottom diode region 170. Step 1020 includes selectively removing the remaining portions of the second layer of dielectric material. Step 1025 includes growing a semiconductor material conformally around the top and sides of the bottom diode region to create an active diode region, such as active diode region 185. Step 1030 includes growing a semiconductor material conformally around the top and sides of the active diode region to create a top diode region, such as top diode region 195. Step 1035 includes fabricating a top electrical contact, such as top electrical contact 200, on the surface of the top diode region. Step 1040 includes fabricating a bottom electrical contact, such as bottom electrical contact 203 on the bottom of the silicon substrate.

Figure 12:
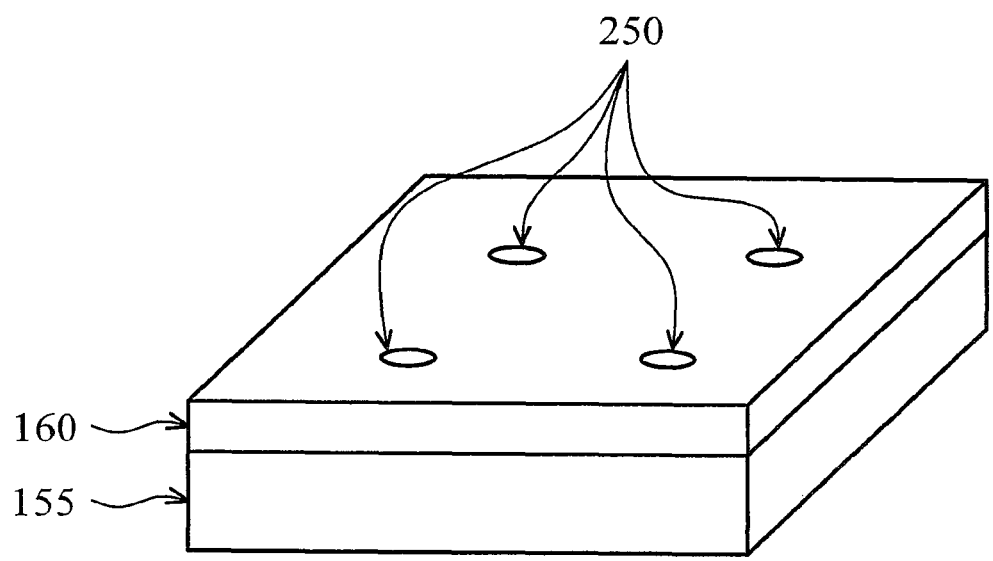
FIGS. 12 through 15 show exemplary stages for forming an embodiment illustrated in FIG. 16.

FIG. 12 shows another embodiment in which the semiconductor diode is configured as a column, rather than as a fin. A layer of dielectric material 160, such as $SiO_2$ or $SiN_x$, is grown onto the surface of an appropriately doped silicon substrate 155.

A hole 250 is patterned with substantially vertical sidewalls in the dielectric material 160 by standard photolithographic or etch techniques. To enable the hole 250 to trap substantially all threading dislocations, the ratio of the depth of the hole 250 to the diameter of the hole 250 is preferably equal to or greater than 1. The hole exposes the surface of the silicon substrate 155.

Figure 13:
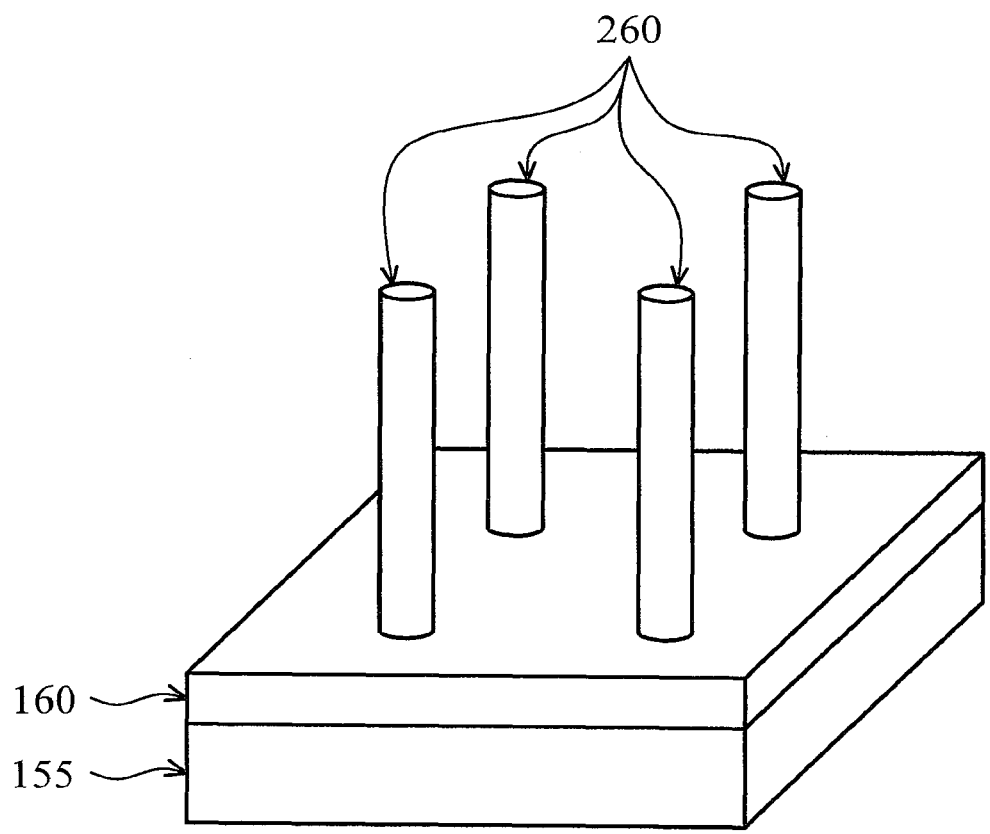

Growth conditions (such as the pressure and the composition of the precursor gases and the temperature of the substrate) are selected that favor growth perpendicular to the plane of the silicon substrate 155 and suppress growth parallel to the plane of the silicon substrate 155, as described in the Noborisaka paper cited above. An appropriately doped semiconductor material is grown that fills the holes and forms free-standing columns above the holes to create the bottom diode region 260, as shown in FIG. 13.

Again, because there is a lattice mismatch between silicon the semiconductor diode material, misfit dislocations may occur at the interface between the bottom diode region 260 and the silicon substrate 155. Threading dislocations may propagate upward from the interface and intersect the curved sidewalls of hole in the dielectric layer 160 and terminate. The trapping region in which the threading dislocations originate and terminate may remain substantially within the hole 250 in the dielectric layer and therefore may not be visible in FIG. 13. The entire portion of the bottom diode region 260 visible in FIG. 13 exists above the trapping region. This upper portion of the bottom diode region 260 may be relatively free of crystalline defects and suitable for creating high-performance devices.

(For the special case in which the bottom diode region 260 is a column with very small diameter, well below 100 manometers, the semiconductor material in the bottom diode region 260 can undergo complete elastic relaxation without the formation of any lattice mismatch defects. In this case, there may be no threading dislocations for the sidewalls of the dielectric layer to trap, and the diode may not contain a "trapping region.")

Figure 14:
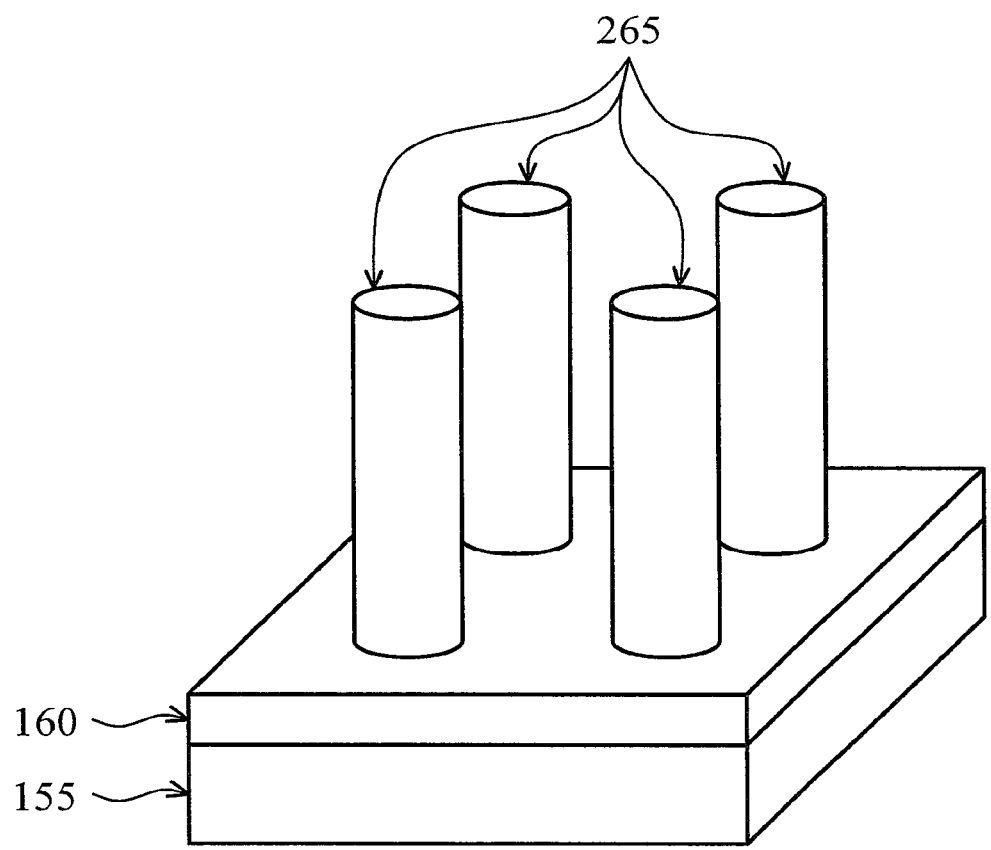

The growth conditions are adjusted so that the material or materials for the active diode region 265 will grow at approximately equal rates on the top and on the sides of the bottom diode region 260. Semiconductor material is conformally grown on the top and the sides of the bottom diode region 260 to create the active diode region 265 shown in FIG. 14.

Figure 15:
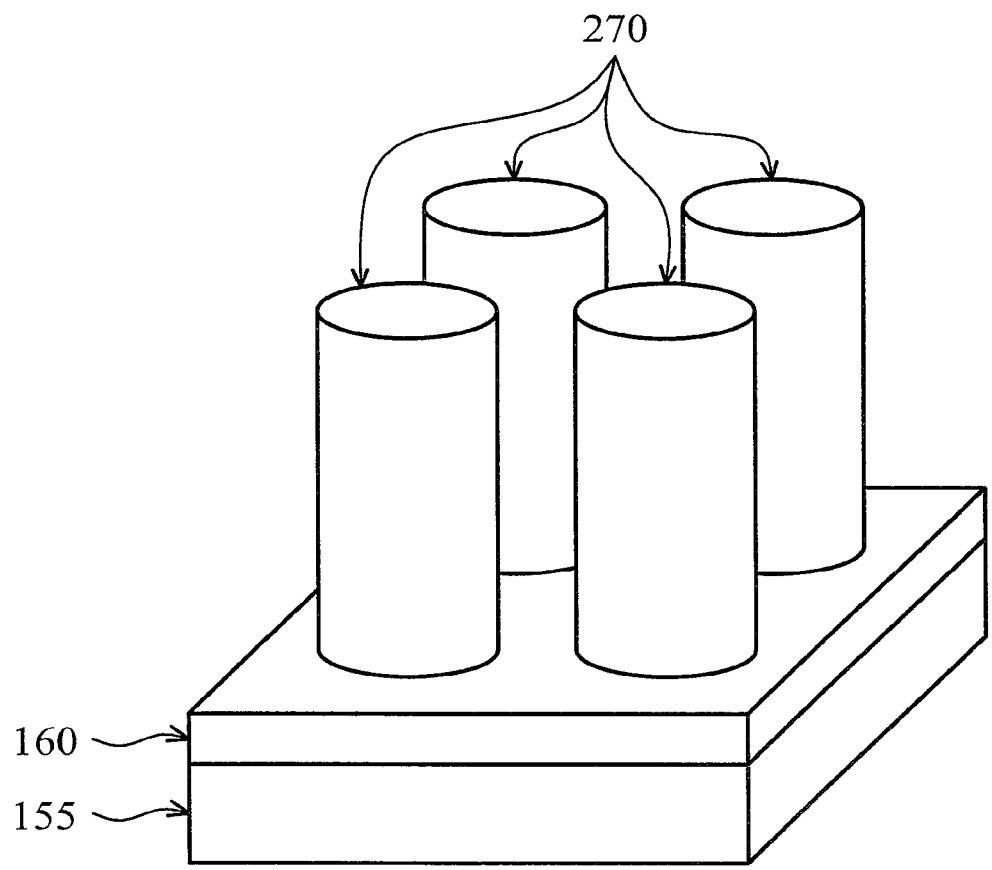

Semiconductor material is conformally grown on the top and sides of the active diode region 265 to create the top diode region 270, as shown in FIG. 15. It may be possible to grow either a discontinuous top diode region 270, so that the semiconductor diodes have the configuration of free-standing columns as shown in FIG. 15, or a continuous top diode region 275 as shown in FIG. 16.

Figure 16:
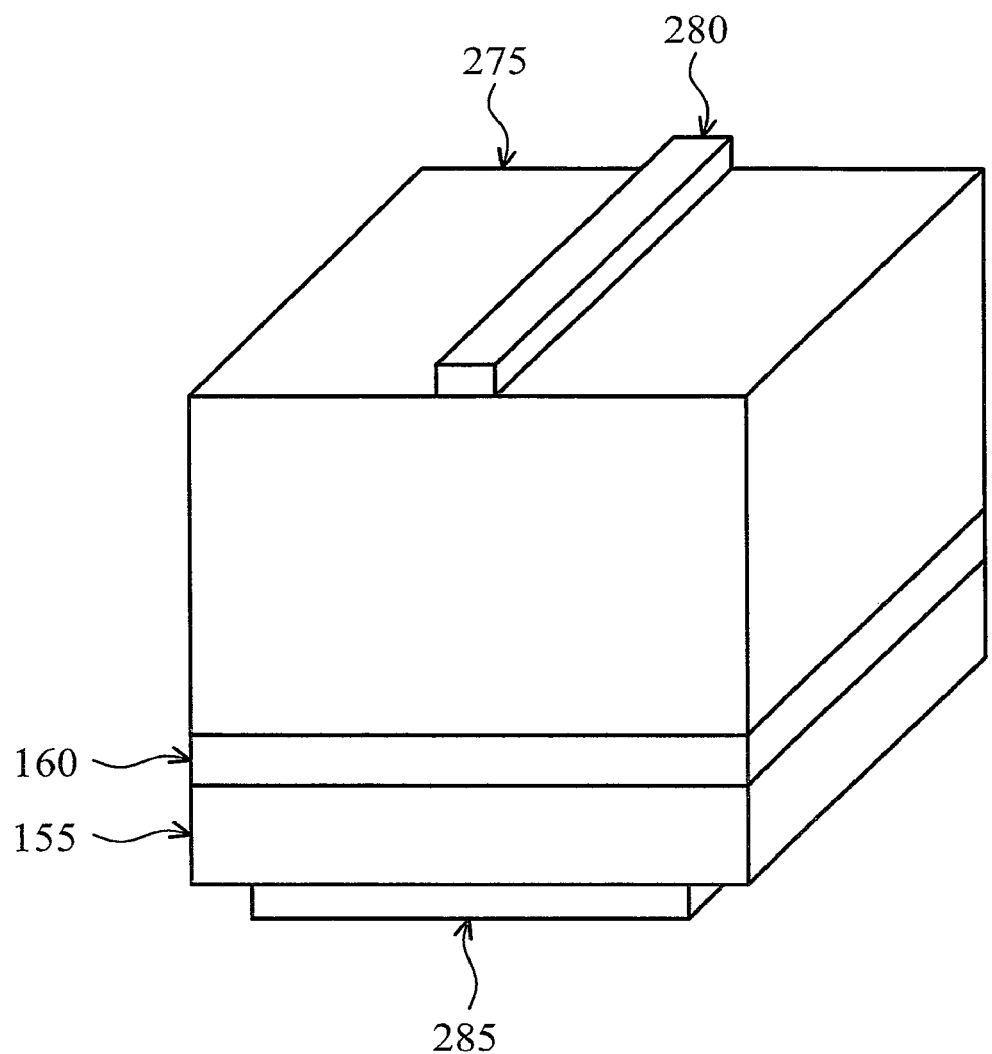
FIG. 16 is an embodiment of a diode configured in the shape of a column.

The top electrical contact 280 is grown on the exposed surface of the top diode region 275, and the bottom electrical contact 285 is grown below the silicon substrate 155, as shown in FIG. 16.

The diode shown in FIG. 16 can comprise a silicon substrate 155; a dielectric layer 160 containing a hole 250 which exposes the surface of the silicon substrate, the hole 250 having substantially vertical sidewalls, the ratio of the depth of the hole 250 to the diameter of the hole 250 being greater than 1; a bottom diode region 260 of semiconductor material filling the hole and extending upward in the shape of a column; a trapping region in the lowest segment of the bottom diode region 260 wherein threading dislocations intersect the curved sidewalls of the hole 250 in the dielectric material 160 and terminate; an active diode region 265 of semiconductor material grown conformally around the bottom diode region 260; a top diode region 275 grown conformally around the active diode region 265; a top electrical contact 280; and a bottom electrical contact 285.

The following methods are two exemplary methods of fabricating the embodiment shown in FIG. 16.

Figure 17:
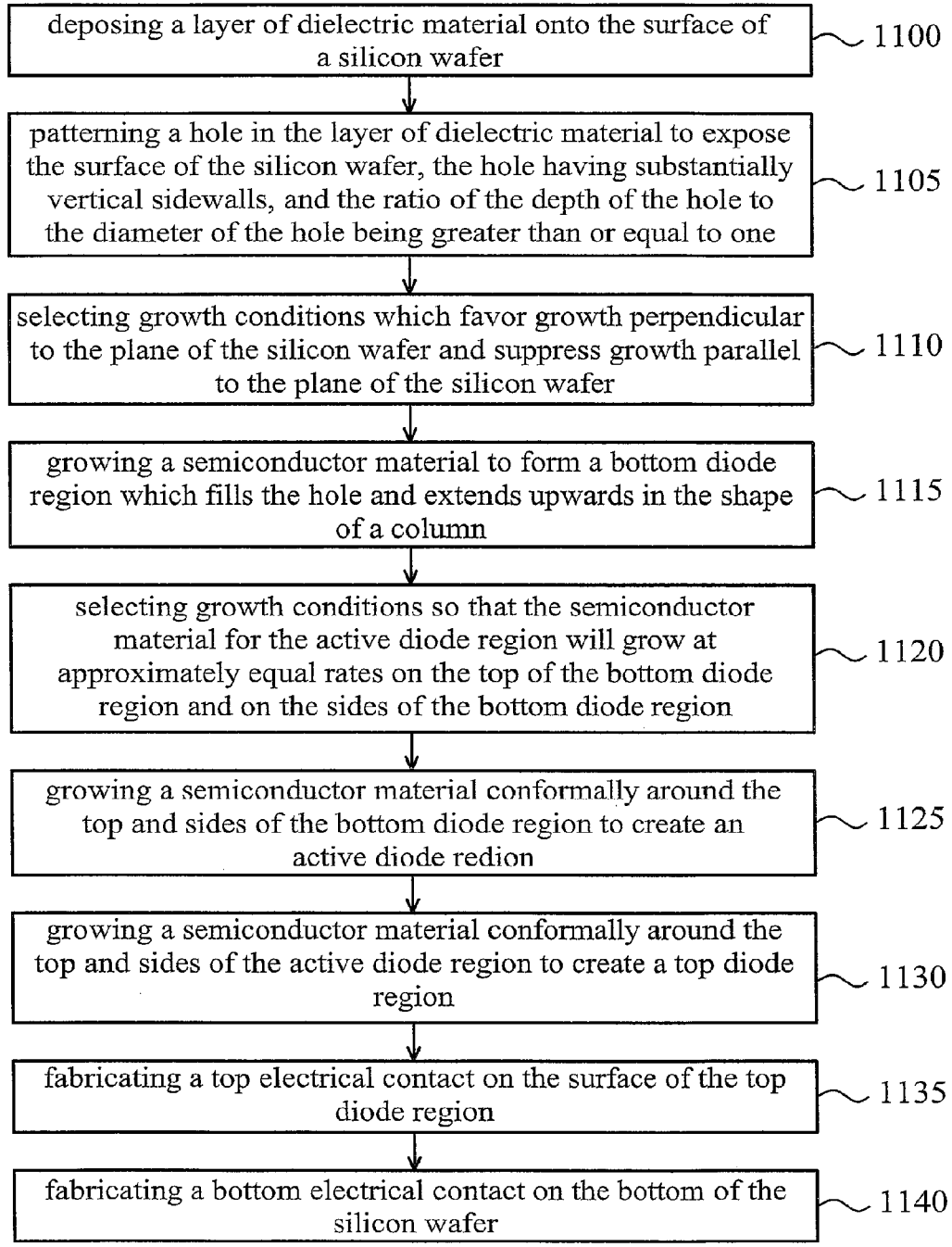
FIG. 17 summarizes a first method according to an embodiment for forming the embodiment in FIG. 16.

FIG. 17 summarizes one method, which comprises the following steps. Step 1100 includes depositing a layer of dielectric material, such as dielectric material 160 onto the surface of a silicon substrate, such as silicon substrate 155. Step 1105 includes patterning a hole, such as hole 250, in the layer of dielectric material to expose the surface of the silicon substrate, the hole having substantially vertical sidewalls, and the ratio of the depth of the hole to the diameter of the hole being greater than or equal to one. Step 1110 includes selecting growth conditions which favor growth perpendicular to the plane of the silicon substrate and suppress growth parallel to the plane of the silicon substrate. Step 1115 includes growing a semiconductor material to form a bottom diode region, such as bottom diode region 260, which fills the hole and extends upwards in the shape of a column. Step 1120 includes selecting growth conditions so that the semiconductor material for the active diode region, such as active diode region 265, will grow at approximately equal rates on the top of the bottom diode region and on the sides of the bottom diode region. Step 1125 includes growing a semiconductor material conformally around the top and sides of the bottom diode region to create an active diode region. Step 1130 includes growing a semiconductor material conformally around the top and sides of the active diode region to create a top diode region, such as top diode region 275. Step 1135 includes fabricating a top electrical contact, such as top electrical contact 280, on the surface of the top diode region. Step 1140 includes fabricating a bottom electrical contact, such as bottom electrical contact 285, on the bottom of the silicon substrate.

Figure 18:
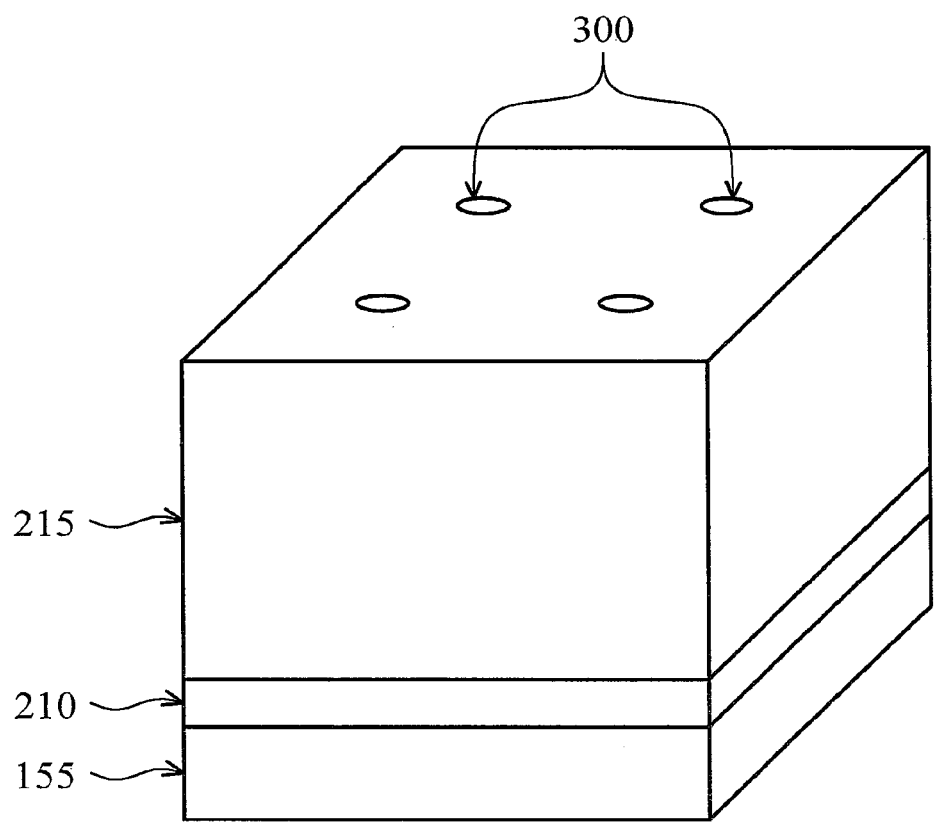
FIGS. 18 and 19 illustrate steps in an alternate method for forming the embodiment in FIG. 16.

Another method does not depend on the ability to grow a free-standing bottom diode region in the shape of a column. It begins with an appropriately doped silicon substrate 155, as shown in FIG. 18. A first dielectric layer 210, such as SiNx, is grown on the surface of the silicon substrate 155.

A second dielectric layer 215 is grown on top of the first dielectric layer 210. In some embodiments, the preferred material for this second dielectric layer 215 is silicon dioxide SiO2.

A hole 300 is patterned with substantially vertical sidewalls through both dielectric layers 210 and 215, exposing the surface of the silicon substrate 155. It is possible to pattern the hole 300 by various techniques such as standard photolithography or reactive ion etch processes.

The thickness of the first dielectric layer 210 may be greater than or equal to than the diameter of the hole 300. Under these conditions, the curved sidewalls of the first dielectric layer 210 may trap substantially all of the threading dislocations.

The surface of the silicon substrate 155 at the bottom of the hole 300 may be cleaned by the cleaning method referred to earlier.

Figure 19:
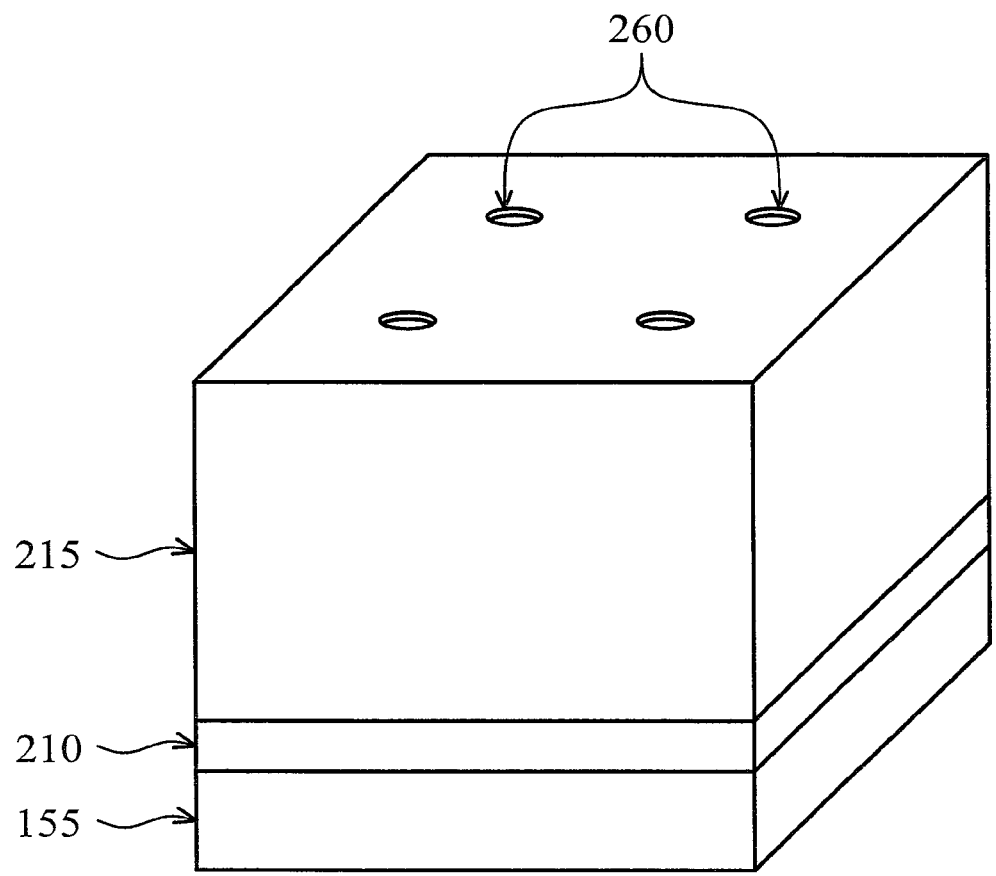

The bottom diode region 260 is grown by filling the hole 300 with a semiconductor material, as shown in FIG. 19.

Misfit dislocations may form at the interface between the silicon substrate 155 and the bottom diode region 260. Threading dislocations may propagate upward and intersect the sidewalls of the first dielectric layer 210, and may terminate within trapping regions, which reside at the bottom of the filled holes 300 and therefore are not visible in FIG. 19. The segment of the bottom diode region 310 above the trapping region may be relatively free of defects and therefore suitable for high-performance devices.

The remaining portions of the second dielectric layer 215 (e.g., the SiO2 layer) are removed by means of a wet etch with hydrofluoric acid and water. This process may selectively remove the second (e.g., SiO2) dielectric layer 215 without attacking either the first (e.g., SiNx) dielectric layer 210 or any of the semiconductor materials that may comprise the bottom diode region 260.

The resultant structure appears in FIG. 13. The process then continues as described in the method described above with respect to FIGS. 14 through 16: deposit the active diode region 265 as shown in FIG. 14, the top diode region 270 or 275 as shown in FIG. 15 or FIG. 16, and the top electrical contacts 280 and bottom electrical contacts 285 as shown in FIG. 16.

Figure 20:
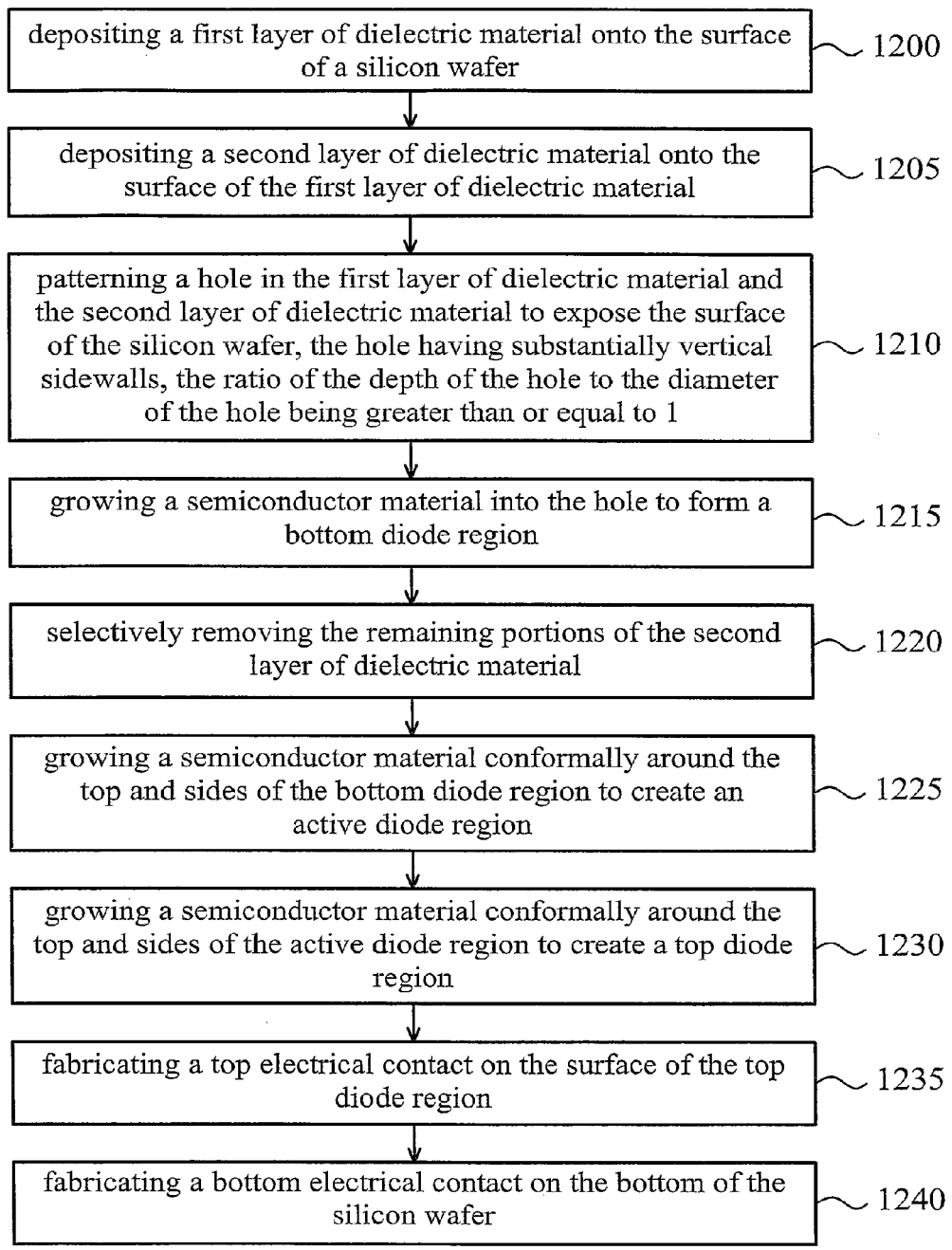
FIG. 20 summarizes the alternate method according to an embodiment for forming the embodiment in FIG. 16.

FIG. 20 summarizes the above described method, which comprises the following steps. Step 1200 includes depositing a first layer of dielectric material, such as first dielectric layer 210, onto the surface of a silicon substrate, such as silicon substrate 155. Step 1205 includes depositing a second layer of dielectric material, such as second dielectric layer 215, onto the surface of the first dielectric layer. Step 1210 includes patterning a hole, such as hole 300, in both the first layer of dielectric material and the second layer of dielectric material to expose the surface of the silicon substrate, the hole having substantially vertical sidewalls, the ratio of the depth of the hole to the diameter of the hole (300) being greater than or equal to 1. Step 1215 includes growing a semiconductor material into the hole to form a bottom diode region, such as bottom diode region 260. Step 1220 includes selectively removing the remaining portions of the second layer of dielectric material. Step 1225 includes growing a semiconductor material conformally around the top and sides of the bottom diode region to create an active diode region, such as active diode region 265. Step 1230 includes growing a semiconductor material conformally around the top and sides of the active diode region to create a top diode region, such as top diode region 270 or 275. Step 1235 includes fabricating a top electrical contact, such as top electrical contact 280, on the surface of the top diode region. Step 1240 includes fabricating a bottom electrical contact, such as bottom electrical contact 285, on the bottom of the silicon substrate.

Some semiconductor materials demonstrate unique behavior when deposited into the round holes 250 and subsequently grow free-standing bottom diode regions 260. Specifically, the free-standing columns can grow out of the round holes to form hexagonal columns; e.g., the columns (element 260 in FIG. 13, element 265 in FIG. 14, and element 270 in FIG. 15) have hexagonal cross sections rather than round cross-sections. Reference is made to a semiconductor diode like in FIGS. 12 through 16, except with columns that have hexagonal cross sections, as discussed.

Figure 21:
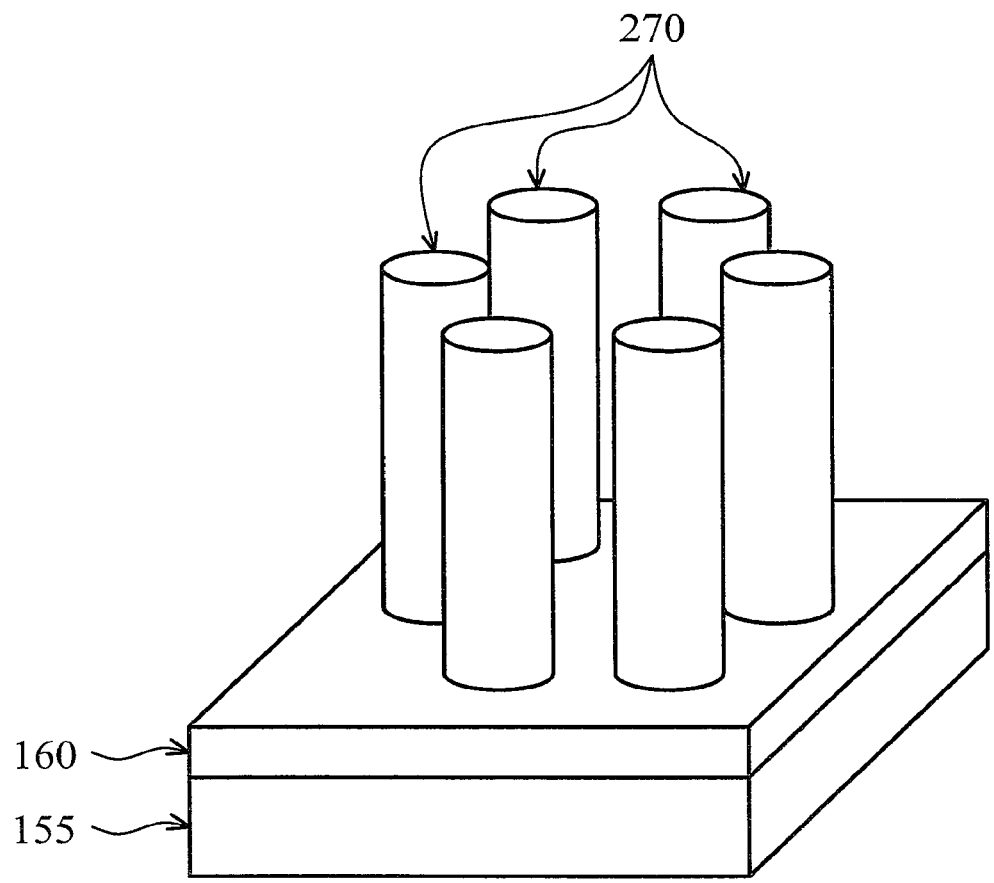
FIG. 21 shows a variation of the embodiment of FIG. 16 in which an array of column-shaped diodes with circular cross sections is arranged in a hexagonal array according to another embodiment.

The hexagonal columns may be advantageously used to increase the packing density of the semiconductor diodes by configuring them in a hexagonal array rather than a square array. FIG. 21 shows several semiconductor diodes, of which only the top diode regions 270 are visible, arranged in a hexagonal array rather than a square array. (Note that in FIG. 21, the columns have a circular cross section rather than a hexagonal cross section). A hexagonal array of holes 250 is created in the dielectric material 160 rather than a square array.

Figure 22:
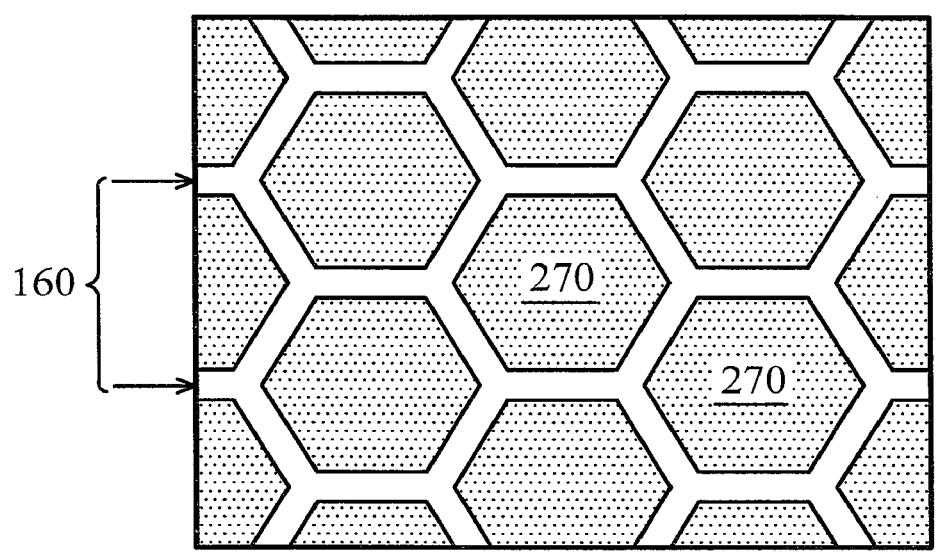
FIG. 22 shows a top view of the embodiment in FIG. 21.

FIG. 22, a top view of the hexagonal array, shows the dense packing of semiconductor diodes which a hexagonal array allows. The hexagonal features in FIG. 22 are the tops of the top diode regions 270 with hexagonal cross sections. The regions between the hexagonal features are the exposed portions of the dielectric material 160. Another embodiment comprises a plurality of diodes such as those described in above, arranged in a hexagonal array with other diodes that also have hexagonal cross sections in order to achieve dense packing.

The diode structure shown in FIG. 3 is suitable for LEDs and other photonic devices. However, in multi-junction solar cells, reflection of light from the dielectric layer 160 may reduce conversion efficiency. Suppose, for example, the silicon substrate 155 contains a p-n junction intended to capture relatively low-energy photons. These relatively low-energy photons would strike the top of the structure, transmit through the top diode region 195 and (depending on their path) perhaps also transmit through the active diode region 185 and the bottom diode region 170, then strike the dielectric layer 160. Some percentage of these photons would reflect from the dielectric layer 160, transmit through the other layers 170, 185, and 195, and exit through the top surface of the device. The solar cell would not absorb them, and they would be lost to the process.

Figure 23:
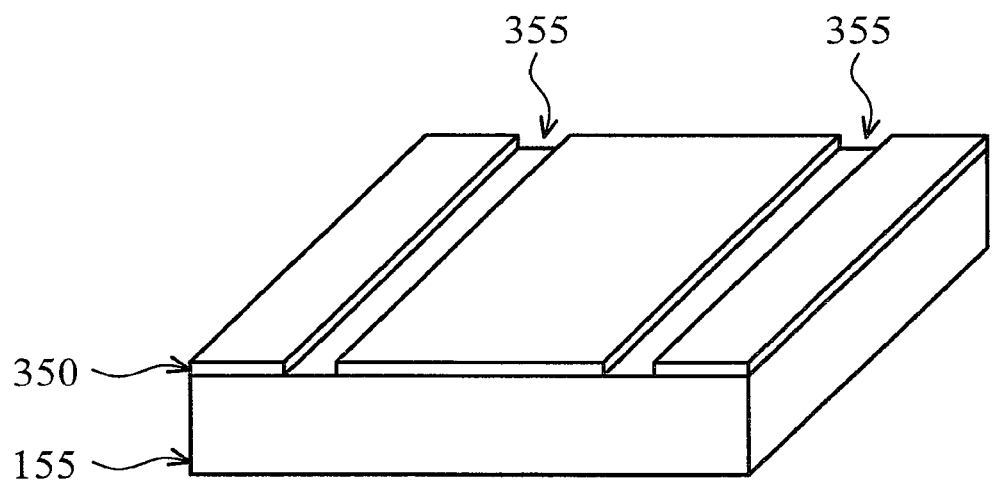
FIGS. 23 and 24 illustrate exemplary stages for forming an embodiment illustrated in FIG. 25.
Figure 25:
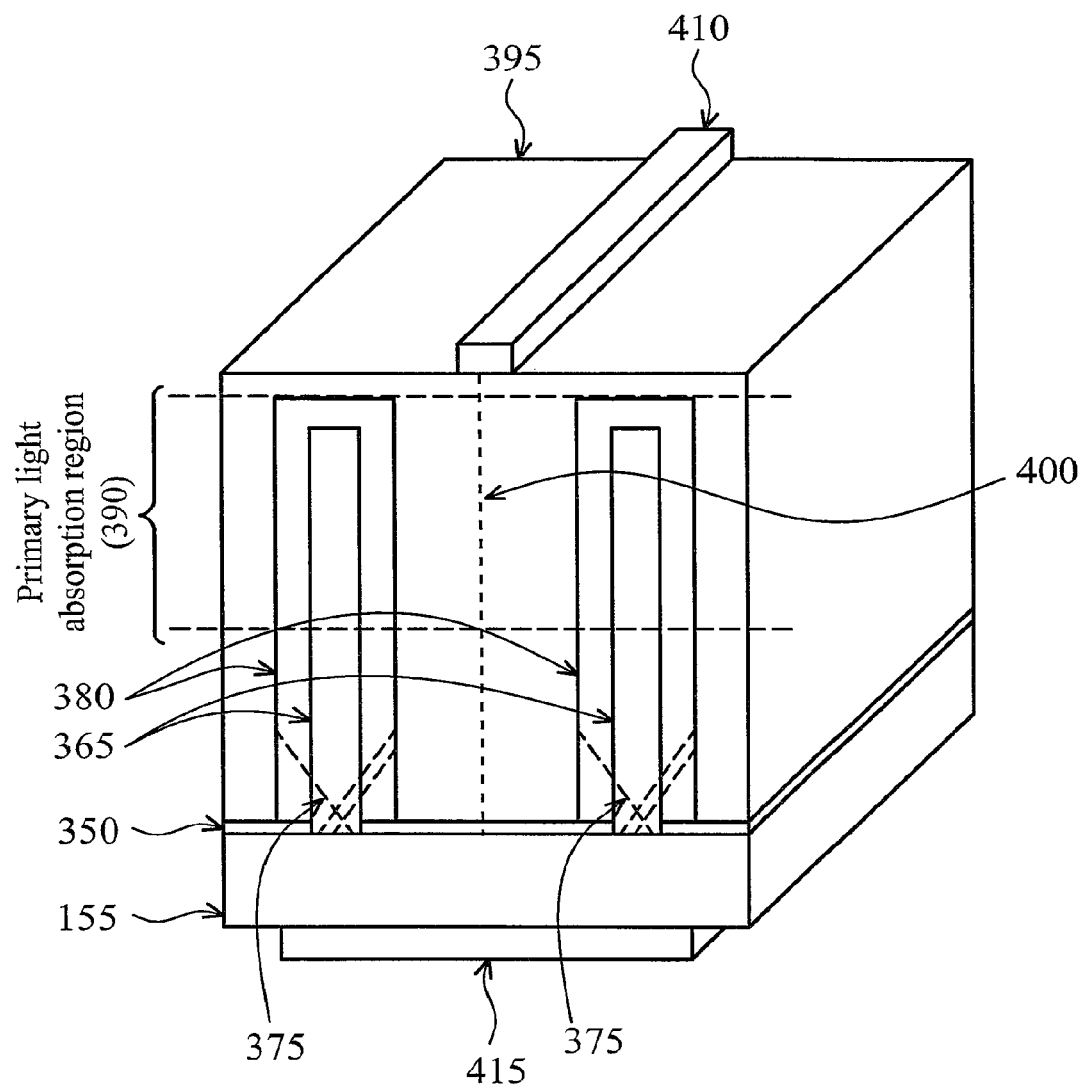
FIG. 25 is an embodiment of a diode in which the dielectric layer is transmissive rather than reflective.

FIG. 25 illustrates one exemplary device architecture. This structure can provide a dielectric layer with a reduced thickness (e.g., less than 20 nanometers)—thin enough to transmit the photons rather than reflecting them. To build this structure, the silicon substrate 155 shown in FIG. 23 is provided. If a multi junction solar cell in which the silicon layer contains one of the junctions were being built, the silicon substrate 155 would be doped appropriately. A dielectric layer 350 is grown on the silicon substrate 155 thin enough (less than 20 nanometers) to transmit substantially all of the incident light. Trenches 355 are patterned in the dielectric layer.

Figure 24:
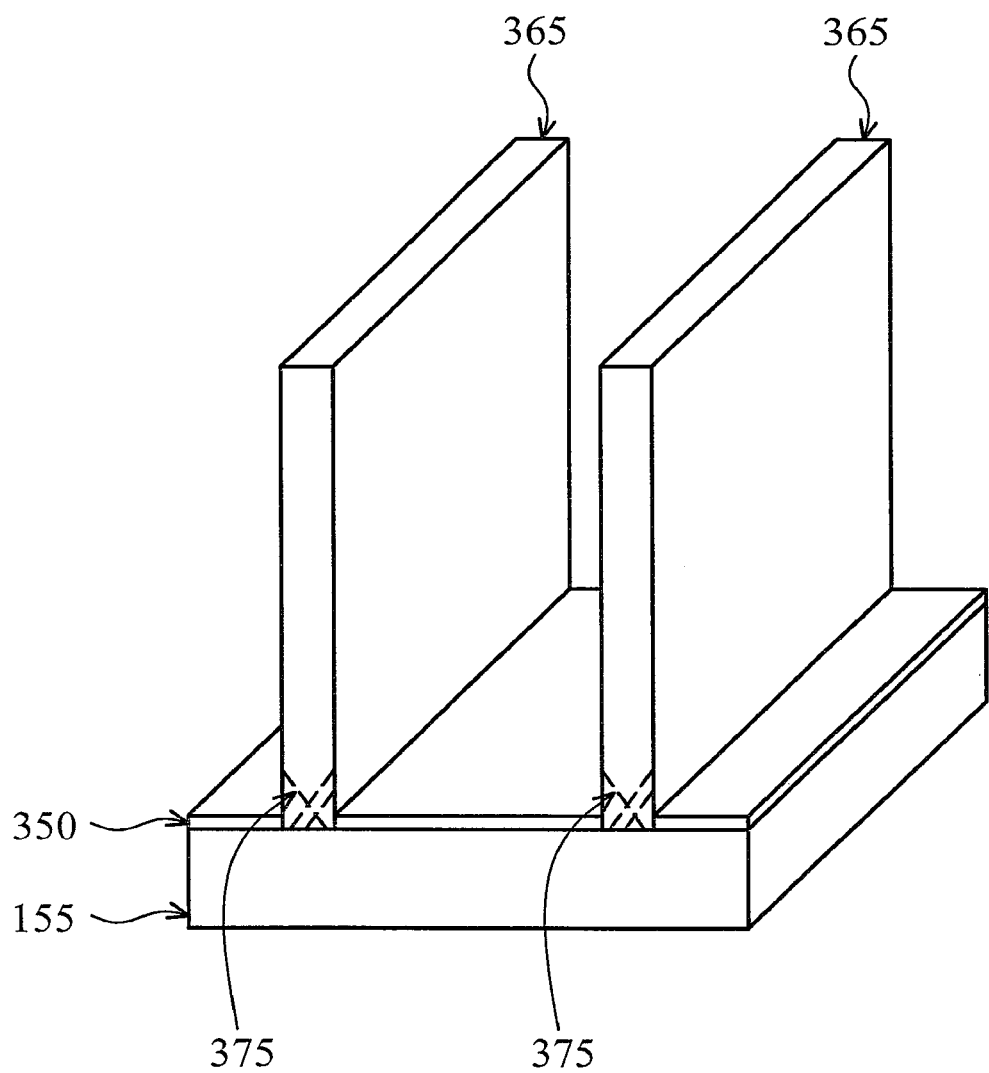

The deposition conditions are adjusted in the reactor to favor vertical growth and to suppress horizontal growth, as described above. The bottom diode region 365 is grown in the shape of a free-standing fin, as shown in FIG. 24.

The deposition conditions are adjusted in the reactor so that vertical growth and horizontal growth occur at approximately the same rates. A semiconductor material is conformally grown around the top and sides of the bottom diode region 365 to create the active diode region 380, as shown in FIG. 25.

Since the dielectric layer is so thin, the aspect ratio of the trenches (the ratio of height to width) 355 is less than 1. As a result, the sidewalls of the dielectric layer 350 may not be able to trap substantially all of the threading dislocations 375. The threading dislocations 375 may continue to propagate into the active diode region 380. Note that electron-hole pairs can recombine when they contact the threading dislocations 375 and reduce the efficiency of the solar cell. However, the structure mitigates this effect because the photons will pass through what a primary light absorption region 390, which resides in the upper portion of the diode, before they can reach the threading dislocations 375. The primary light absorption region 390 may absorb most of the photons because it is relatively large compared with the region occupied by the threading dislocations 375. Recombination of electron-hole pairs at the threading dislocations 375 may therefore be a secondary effect and not significantly reduce solar cell efficiency.

A semiconductor material is conformally grown around the top and sides of the active diode region 380 to create the top diode region 395. Again, coalescence defects 400 may appear in the top diode region 395 where the growth fronts from adjacent fins merge.

A top electrical contact 410 is grown onto the top surface of the top diode region 395 and a bottom electrical contact 415 is grown onto the bottom of the silicon substrate 155. In a solar cell, the influence of the coalescence defects 400 can be mitigated by covering them with the top electrical contact 410.

The embodiment shown in FIG. 25 is a diode made from compound semiconductors or other lattice mismatched semiconductors on a silicon substrate and can comprise a silicon substrate 155; a layer of dielectric material 350 covering the silicon substrate, the layer of dielectric material containing a trench 355 exposing the surface of the silicon substrate 155, the layer of dielectric material 350 having a thickness of less than 20 nanometers; a bottom diode region 365 of semiconductor material filling the trench 355 and extending upward in the shape of a fin; an active diode region 380 of semiconductor material grown conformally around the bottom diode region 365; a top diode region 395 of semiconductor material grown conformally around the active diode region 380; a top electrical contact 410; and a bottom electrical contact 415.

Figure 26:
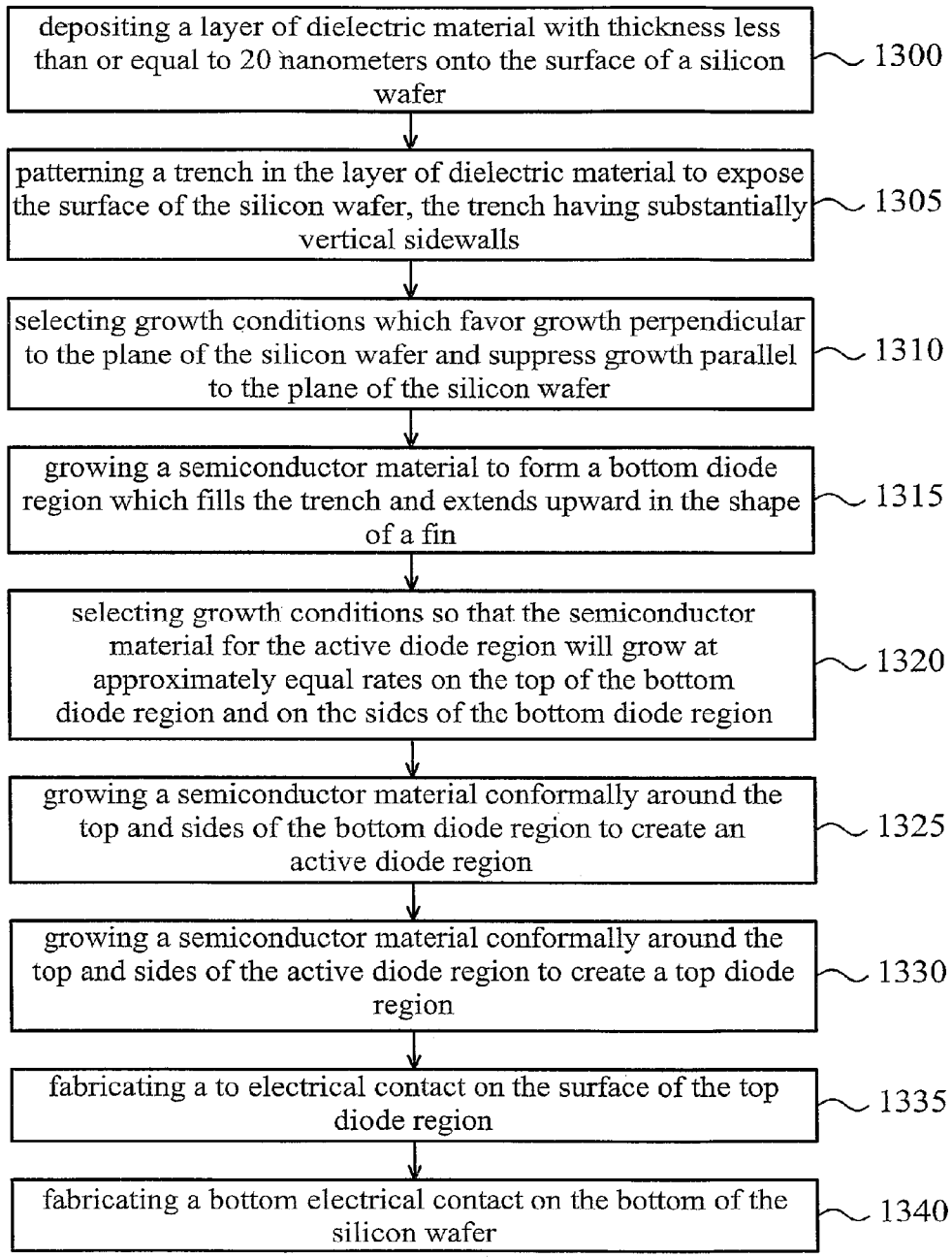
FIG. 26 summarizes a method according to an embodiment for forming the embodiment in FIG. 25.

FIG. 26 illustrates a method of fabricating the embodiment depicted in FIG. 5. The method comprises the following steps. Step 1300 includes depositing a layer of dielectric material, such as dielectric material 350, with thickness less than or equal to 20 nanometers onto the surface of a silicon substrate, such as silicon substrate 155. Step 1305 includes patterning a trench, such as trench 355, in the layer of dielectric material to expose the surface of the silicon substrate, the trench having substantially vertical sidewalls. Step 1310 includes selecting growth conditions which favor growth perpendicular to the plane of the silicon substrate and suppress growth parallel to the plane of the silicon substrate. Step 1315 includes growing a semiconductor material to form a bottom diode region, such as bottom diode region 365, which fills the trench and extends upward in the shape of a fin. Step 1320 includes selecting growth conditions so that the semiconductor material for the active diode region, such as active diode region 380, will grow at approximately equal rates on the top of the bottom diode region and on the sides of the bottom diode region. Step 1325 includes growing a semiconductor material conformally around the top and sides of the bottom diode region to create an active diode region. Step 1330 includes growing a semiconductor material conformally around the top and sides of the active diode region to create a top diode region, such as top diode region 395. Step 1335 includes fabricating a top electrical contact, such as top electrical contact 410, on the surface of the top diode region. Step 1340 includes fabricating a bottom electrical contact, such as bottom electrical contact 415, on the bottom of the silicon substrate.

Figure 27:
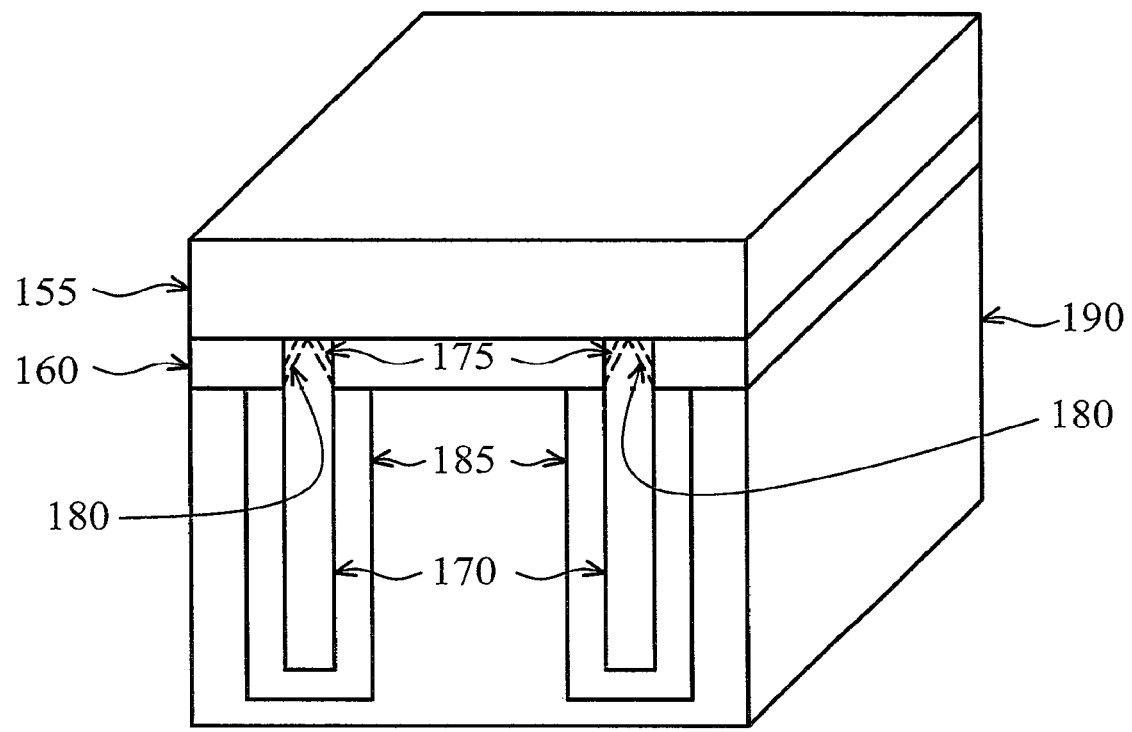
FIG. 27 illustrates steps for forming another embodiment illustrated in FIG. 28.
Figure 28:
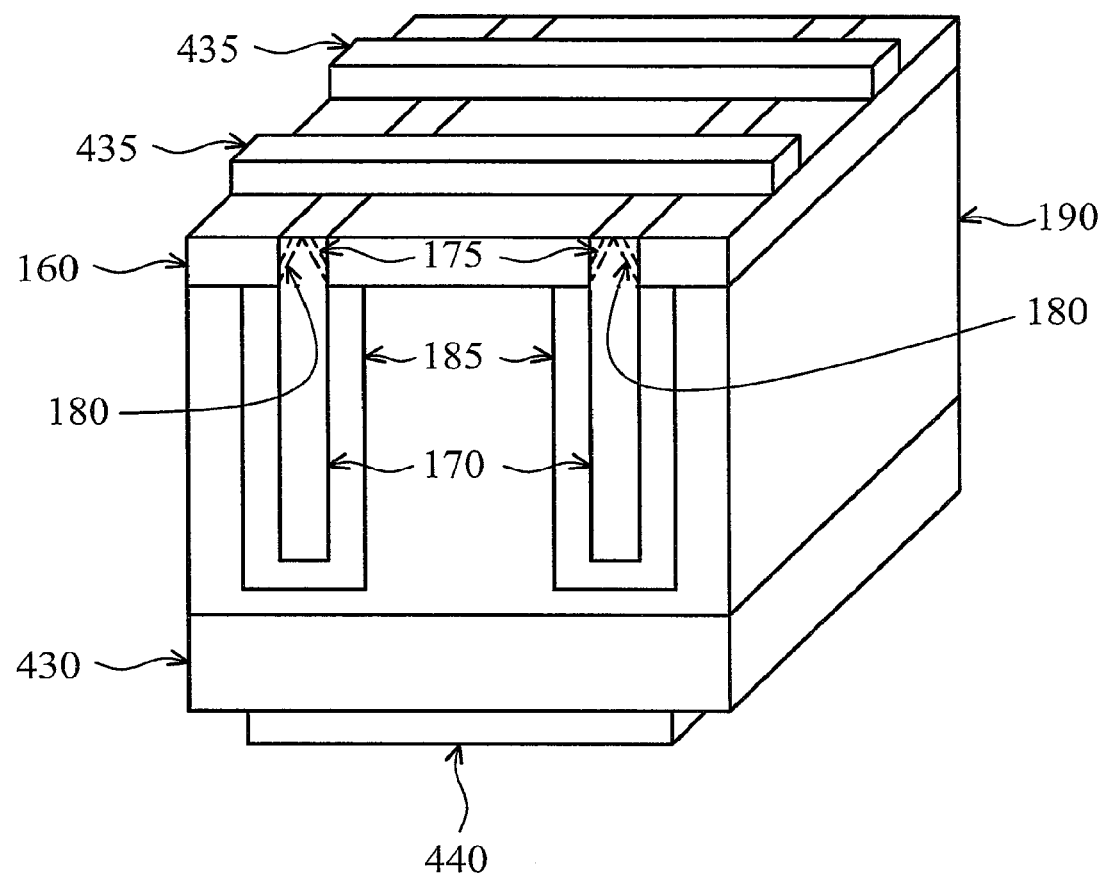
FIG. 28 is an embodiment of a diode in which the silicon substrate has been removed.

In some applications, the presence of the silicon substrate can degrade the performance of the device. For example, for light-emitting diodes emitting in certain wavelength ranges, the silicon may absorb the light. An exemplary device architecture that can remove the silicon substrate is shown in FIG. 28. Steps in the process of making such a device are the steps that lead up to fabrication of the structure in FIG. 3 as shown in FIG. 27, which is simply the structure in FIG. 3 inverted, before application of the electrical contacts 200 and 203.

A "handle" substrate or surface 430 is bonded to the top diode region 195, as shown in FIG. 28. The handle substrate 430 could be part of an LED packaging fixture. It may be necessary to planarize the surface of the top diode region 190, 195 by some suitable technique such as, for example, chemical mechanical planarization in order to bond the handle substrate 430 to it securely.

The handle substrate 430 may be electrically conductive, or it may contain conductor elements which will serve as contacts for the top diode region 195. Bonding methods are well known in the art, including methods used in flip-chip bonding where the "top" portion of an LED is bonded to a surface that is part of an LED package.

The initial silicon substrate 155 is removed by one or more methods such as grinding, etching with a chemical such as tetramethyl ammonium hydroxide, or laser ablation, all of which are well known to those skilled in the art.

As shown in FIG. 28, top electrical contacts 435 and bottom electrical contacts 440 are added by standard techniques. As explained above, the bottom electrical contacts 440 may also reside within the handle substrate 430.

It may be useful to select reflective materials for the contacts 435 and 440 in order to induce light to exit the LED in the most favorable direction.

The embodiment shown in FIG. 28 is a diode made from compound semiconductors or other lattice mismatched semiconductor materials and can comprise a layer of dielectric material 160 containing a trench 165, the trench having substantially vertical sidewalls, and the ratio of the height of the trench to the width of the trench being greater to or equal to 1; a fin-shaped bottom diode region 170 of semiconductor material filling the trench; a trapping region 175 within the bottom diode region 170 wherein threading dislocations 180 intersect the sidewalls of the trench 160 and terminate; an active diode region 185 of semiconductor material grown conformally around the bottom diode region 170; a top diode region 195 of semiconductor material grown conformally around the active diode region; a handle substrate 430; a top electrical contact 435; and a bottom electrical contact 440.

Figure 29:
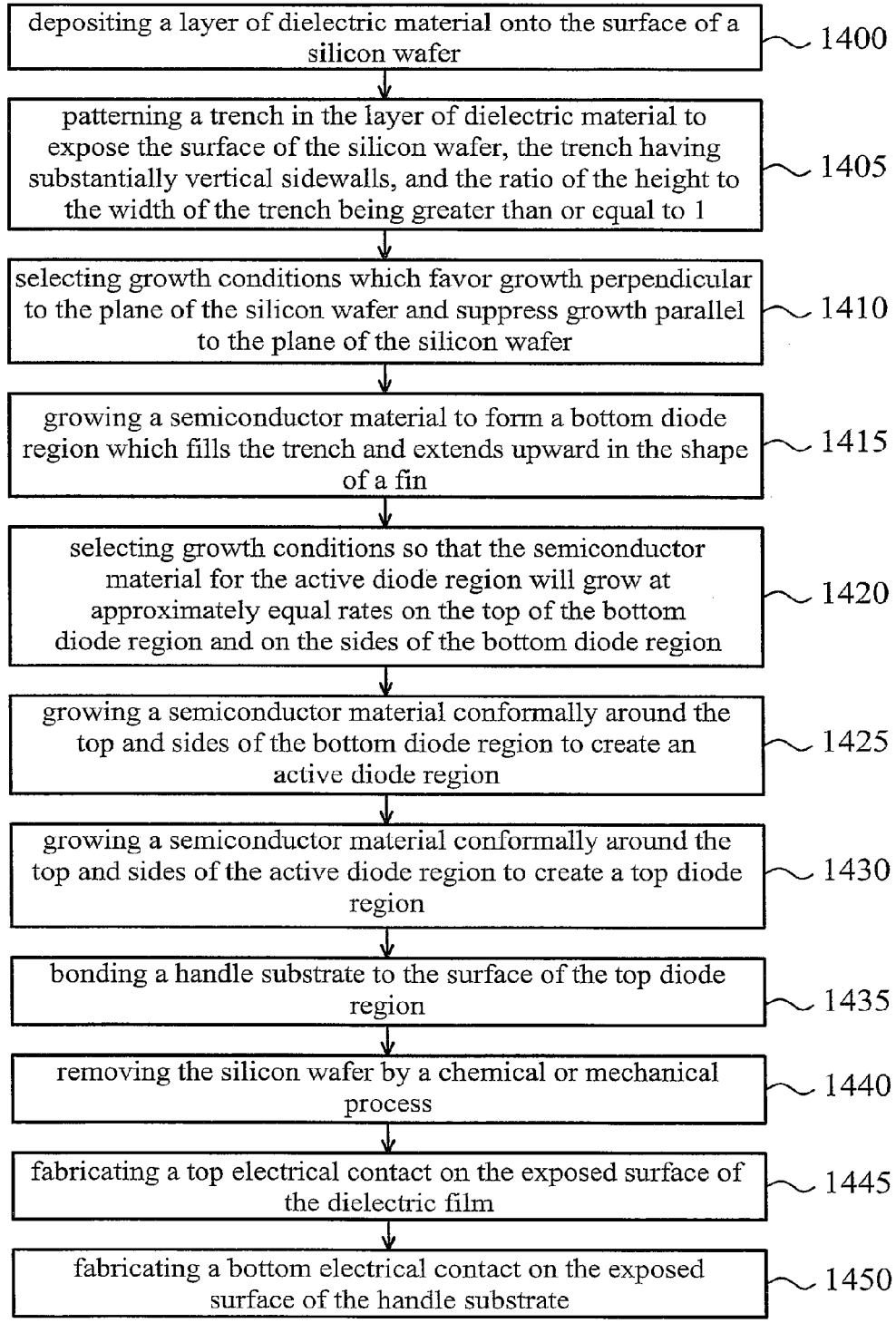
FIG. 29 summarizes a method for forming the embodiment in FIG. 28.

FIG. 29 illustrates a method of fabricating the embodiment of FIG. 28. The method comprises the following steps. Step 1400 includes depositing a layer of dielectric material, such as dielectric material 160, onto the surface of a silicon substrate, such as silicon substrate 155. Step 1405 includes patterning a trench, such as trench 165, in the layer of dielectric material to expose the surface of the silicon, the trench having substantially vertical sidewalls, and the ratio of the height of the trench to the width of the trench being greater than or equal to 1. Step 1410 includes selecting growth conditions which favor growth perpendicular to the plane of the silicon substrate and suppress growth parallel to the plane of the silicon substrate. Step 1415 includes growing a semiconductor material to form a bottom diode region, such as bottom diode region 170, which fills the trench and extends upward in the shape of a fin. Step 1420 includes selecting growth conditions so that the semiconductor material for the active diode region, such as active diode region 185, will grow at approximately equal rates on the top of the bottom diode region and on the sides of the bottom diode region. Step 1425 includes growing a semiconductor material conformally around the top and sides of the bottom diode region to create an active diode region. Step 1430 includes growing a semiconductor material conformally around the top and sides of the active diode region to create a top diode region, such as top diode region 190. Step 1435 includes bonding a handle substrate, such as handle substrate 430, to the surface of the top diode region. Step 1440 includes removing the silicon substrate by a chemical or mechanical process. Step 1445 includes fabricating a top electrical contact, such as top electrical contact 435, on the exposed surface of the dielectric layer. Step 1450 includes fabricating a bottom electrical contact, such as bottom electrical contact 440, on the exposed surface of the handle substrate.

One example of an alternate method of creating the embodiment of FIG. 28 is to create the fin-shaped structure shown in FIG. 9 by the process described in FIG. 11 rather than the process described in FIG. 7.

Figure 32:
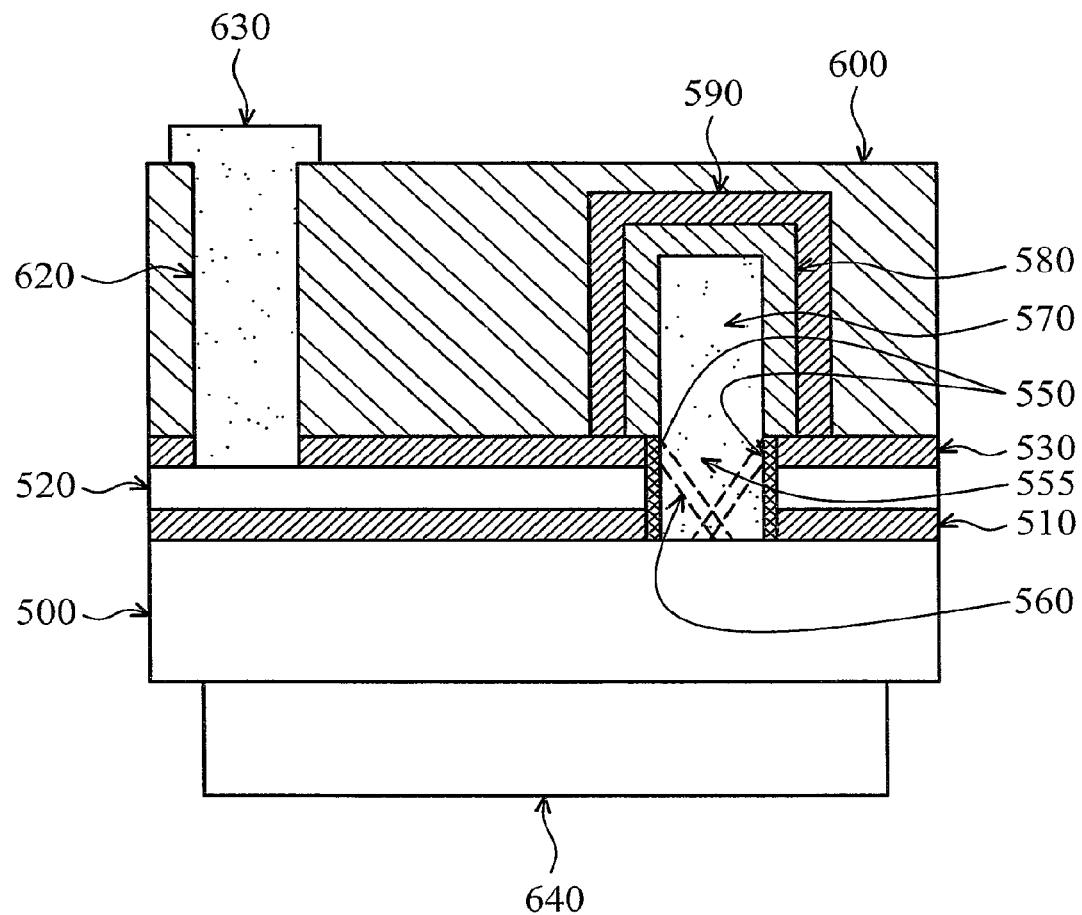
FIG. 32 is an embodiment of a diode in which the top electrical contact also serves as a reflector.

An alternative way to reduce or minimize absorption of light by the silicon substrate is to incorporate a reflector above the silicon substrate. The embodiment shown in FIG. 32 illustrates one way to do this using a diode with a reflector that also serves as the top electrical contact.

Figure 30:
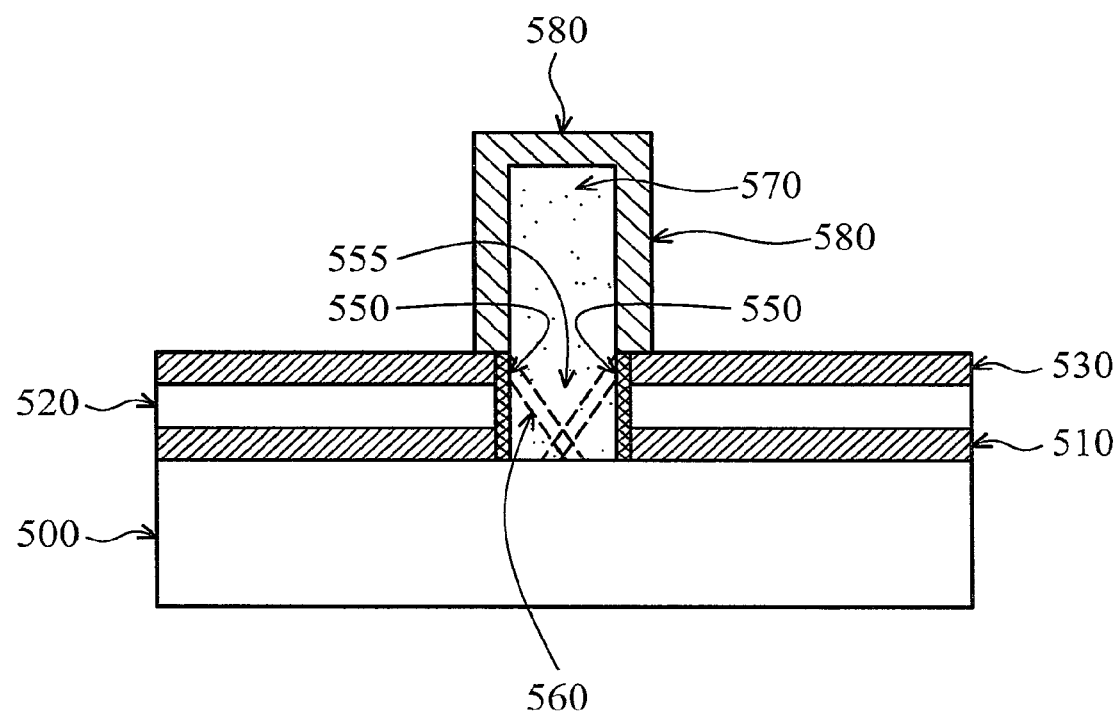
FIGS. 30 and 31 show steps for forming an embodiment in FIG. 32.

To build this structure, a substrate 500 made from a material such as (111)-surface silicon, doped either p-type or n-type, depending on the configuration of the diode device, is provided, as shown in FIG. 30. A first layer of dielectric material 510, such as silicon nitride, a layer of a refractory metal 520, such as tungsten, and a second layer of dielectric material 530 are deposited or grown. A refractory layer/material or refractory metal 520, such as tungsten, is chosen because this layer 520 may withstand the growth temperature of the subsequent layers without melting.

A trench is patterned in the structure by photolithography and/or reactive ion etch.

Dielectric spacers 550 are created on the sidewalls of the trench by conventional methods. In the spacer process, all exposed surfaces (sidewalls of the second layer of dielectric material 530, the refractory metal 520, and the first layer of dielectric material 510, and the exposed surface of the silicon substrate 500 at the bottom of the trench) are conformally coated with a layer of dielectric material, such as SiO2. The dielectric material is subjected to a brief anisotropic reactive ion etch, which selectively removes all the SiO2 coating horizontal surfaces but leaves intact the SiO2 coating vertical surfaces. This process yields dielectric spacers 550. It leaves no metal exposed.

Optionally, the exposed surface of the silicon substrate 500 at the bottom of the trench may be cleaned by methods described above.

Growth conditions which favor growth perpendicular to the plane of the silicon substrate 500 and suppress growth parallel to the plane of the silicon substrate 500 are selected, as described in the paper by Noborisaka and his colleagues cited above. A semiconductor material is grown to form a free-standing bottom diode region 570 which fills the trench and extends upward in the shape of a fin. The growth of the semiconductor material may be performed using MOCVD. The process window (e.g., the conditions of temperature and pressure) for this growth step may be narrow because the semiconductor material for the bottom diode region cannot be allowed to nucleate on either the dielectric spacers 550 or the second dielectric layer 530.

Threading dislocations 560 may propagate upward, e.g., at a 45 degree angle from the interface between the bottom diode region 570 and the silicon substrate 500, intersect the dielectric spacers 550, and terminate within a trapping region 555. In order to trap substantially all of the threading dislocations, it is preferred that the aspect ratio of the trapping region (the ratio of the height of the dielectric spacers 550 to the width of the trench between the spacers 550) be greater than or equal to 1.

Growth conditions are selected so that the semiconductor material for the active diode region 580 will grow at approximately equal rates on the side of the fin and on the top of the fin. A semiconductor material is conformally grown around the top and sides of the bottom diode region to create an active diode region 580.

The sample is removed from the reactor, such as a MOCVD reactor if MOCVD is used, and the second layer of dielectric material 530 is removed from the structure by a wet selective etch. For example, if the dielectric material is silicon nitride, then hot phosphoric acid can be a good etchant.

Figure 31:
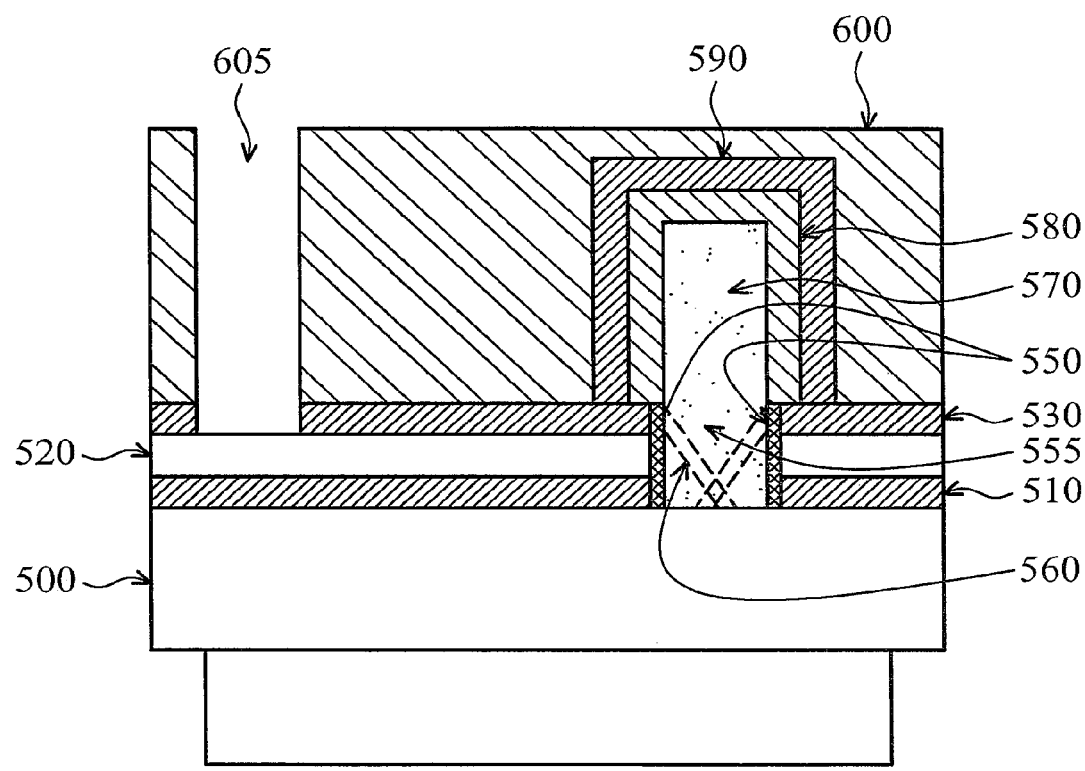

The structure is returned to the reactor. Growth conditions are selected so that the semiconductor material for the top diode region 590, as shown in FIG. 31, will not only grow at approximately equal rates on the top and the sides of the bottom diode region, but also coat the surface of the refractory metal 520. The top diode region 590 is created by growing a semiconductor material to provide a conformal coating around the top and sides of the active diode region 580. (It is not necessary to continue growing the top diode region 590 so that the top diode regions from adjacent diodes merge as in FIG. 3, because the layer of refractory metal 520 will serve as an electrical contact to the top diode region 590.) Simultaneously, a horizontal layer of semiconductor material 595 is created that coats the surface of the refractory metal 520.

Optionally, it can be advantageous to cover the top diode region 590 and the horizontal layer of semiconductor material 595 with a third layer of dielectric material 600 such as silicon dioxide.

Standard techniques are employed to create a via 605 through the third layer of dielectric material 600 and through the horizontal layer of semiconductor material 595, as shown in FIG. 31. For best results, the via 605 may be relatively far from the diode elements 570, 580, 590.

Finally, the via 605 is filled by depositing a suitable material 620, such as a plug of tungsten or another suitable material such as would be known in the art, terminating in the top electrical contact 630, as shown in FIG. 32. The bottom electrical contact 640 is also created.

In the illustrated embodiment of the structure shown in FIG. 32 as a light-emitting diode, the refractory metal layer 520 may serve not only as a top electrical contact but also as a reflector. Some of the light generated within the diode may propagate downward, toward the silicon substrate 500. A high percentage of that light will strike the refractory metal layer 520. For example, tungsten, when used for refractory metal layer 520, may reflect virtually all that light upward. The reflected light may exit the structure and contribute to the brightness of the LED. Only a small percentage of the light generated within the diode may pass through the trapping region 555 into the silicon substrate 500, where it may be absorbed and lost to the process.

One example of an alternative to the embodiment illustrated in FIG. 32 is to pattern a hole in place of the first trench and grow the diodes in the shape of columns rather than fins.

The embodiment shown in FIG. 32 is a diode made from compound semiconductors or other lattice mismatched semiconductor materials and can comprise a silicon substrate 500; a layer of dielectric material 510 covering the silicon substrate 155; a layer of refractory metal 520 covering the dielectric layer; a horizontal layer of semiconductor material 595 covering the layer of refractory metal 520; a first trench opening through the layer of semiconductor material 595, through the layer of refractory metal 520, and through the layer of dielectric material 510 and thereby exposing the surface of the silicon substrate 500, the first trench having substantially vertical sidewalls, and the ratio of the height of the first trench to the width of the first trench being greater than or equal to 1; dielectric spacers 550 covering the sidewalls of the first trench; a bottom diode region 570 of semiconductor material filling the first trench and extending upward in the shape of a fin; a trapping region 555 in the lowest segment of the bottom diode region 570 wherein threading dislocations 560 intersect the dielectric spacers 550 and terminate; an active diode region 580 of semiconductor material grown conformally around the bottom diode region 570; a top diode region 590 of semiconductor material grown conformally around the active diode region 580 and contacting the horizontal layer of semiconductor material 595; a thick layer of dielectric material 600 covering the top diode region 590 and the horizontal layer of semiconductor material 595; a second trench opening through the thick layer of dielectric material 600 and through the horizontal layer of semiconductor material, thereby exposing the surface of the layer of refractory metal 520; a metal plug or conductor 620 filling the second trench and physically contacting the layer of refractory metal 520; a top electrical contact 630 physically contacting the metal plug 620; and a bottom electrical contact 640 physically contacting the silicon substrate 640.

Figure 33A:
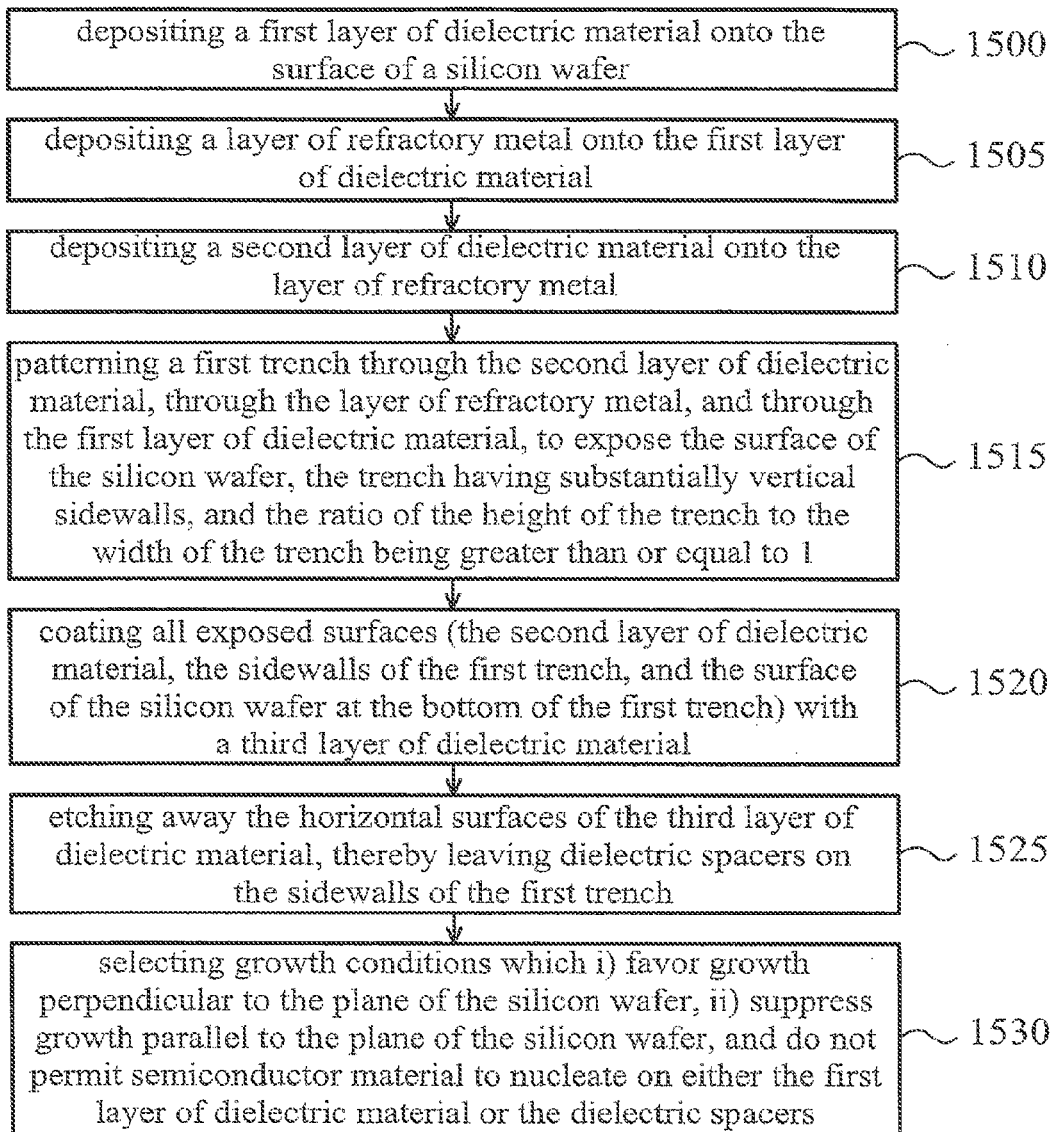
FIGS. 33A and 33B summarize a method according to an embodiment for forming the embodiment in FIG. 32.
Figure 33B:
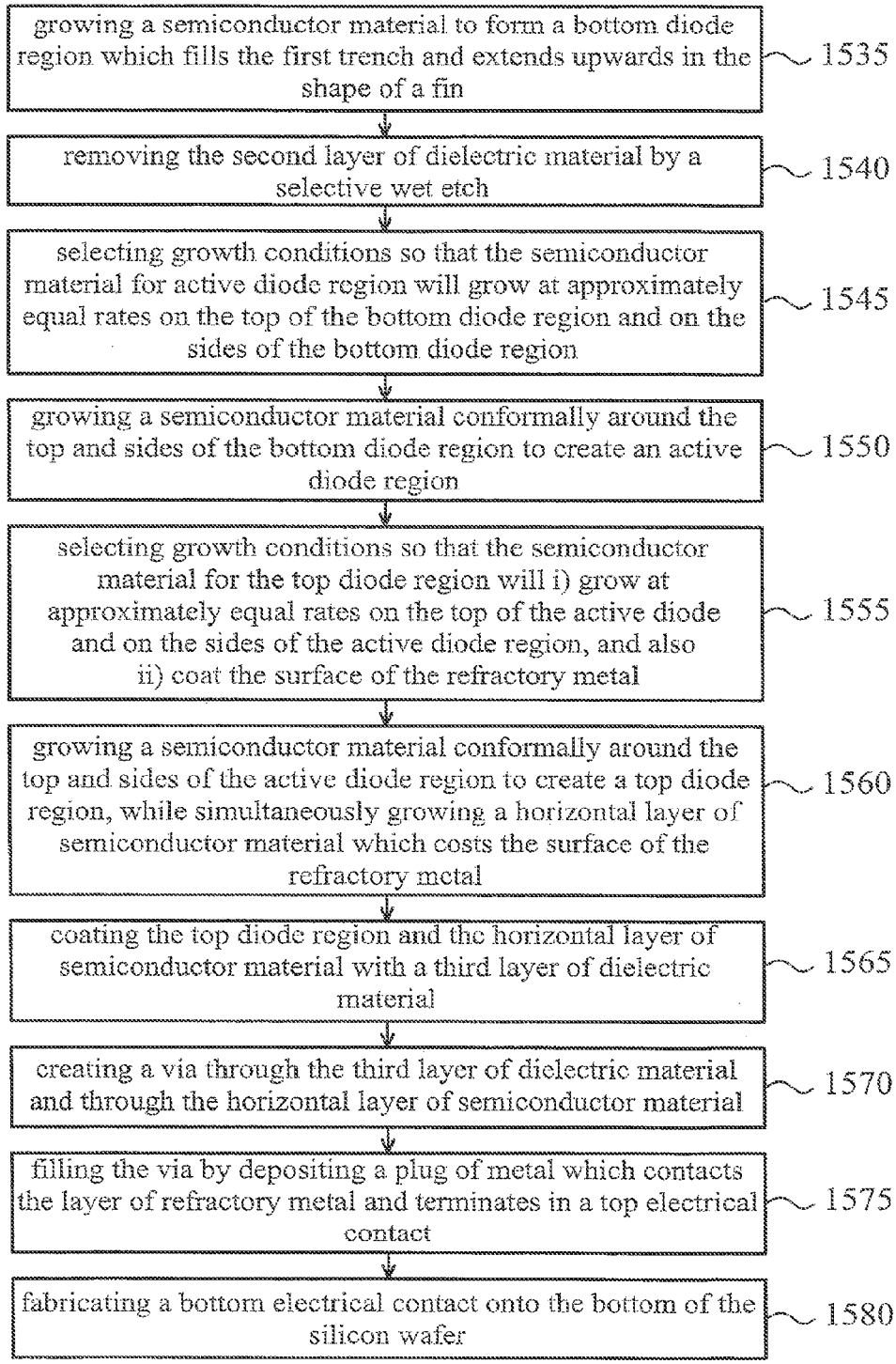

FIGS. 33A and 33B illustrate a method of fabricating the embodiment illustrated in FIG. 32. The method comprises the following steps. Step 1500 includes depositing a first layer of dielectric material, such as dielectric material 510, onto the surface of a silicon substrate, such as silicon substrate 500. Step 1505 includes depositing a layer of refractory metal, such as refractory metal 520, onto the first layer of dielectric material. Step 1510 includes depositing a second layer of dielectric material, such as dielectric material 530, onto the layer of refractory metal. Step 1515 includes patterning a first trench through the second layer of dielectric material, through the layer of refractory metal, and through the first layer of dielectric material, to expose the surface of the silicon substrate, this first trench having substantially vertical sidewalls, and the ratio of height to width of this first trench being greater than or equal to 1. Step 1520 includes coating all exposed surfaces (the second layer of dielectric material, the sidewalls of the first trench, and the surface of the silicon substrate at the bottom of the first trench) with a third layer of dielectric material. Step 1525 includes etching away the horizontal surfaces of the third layer of dielectric material, thereby leaving dielectric spacers, such as spacers 550, on the sidewalls of the first trench. Step 1530 includes selecting growth conditions which i) favor growth perpendicular to the plane of the silicon substrate, ii) suppress growth parallel to the plane of the silicon substrate and iii) do not permit semiconductor material to nucleate on either the first layer of dielectric material or the dielectric spacers. Step 1535 includes growing a semiconductor material to form a bottom diode region, such as bottom diode region 570, which fills the first trench and extends upward in the shape of a fin. Step 1540 includes removing the second layer of dielectric material by a selective wet etch. Step 1545 includes selecting growth conditions so that the semiconductor material for the active diode region will grow at approximately equal rates on the top of the bottom diode region and on the sides of the bottom diode region. Step 1550 includes growing a semiconductor material conformally around the top and sides of the bottom diode region to create an active diode region, such as active diode region 580. Step 1555 includes selecting growth conditions so that the semiconductor material for the top diode region, such as top diode region 590, will i) grow at approximately equal rates on the top of the active diode region and on the sides of the active diode region, and also ii) coat the surface of the refractory metal. Step 1560 includes growing a semiconductor material conformally around the top and sides of the active diode region to create a top diode region, while simultaneously growing a horizontal layer of semiconductor material, such as horizontal layer of semiconductor material 595, which coats the surface of the refractory metal. Step 1565 includes coating the top diode region and the horizontal layer of semiconductor material with a third layer of dielectric material, such as dielectric material 600. Step 1570 includes creating a via, such as via 605, through the third layer of dielectric material and through the horizontal layer of semiconductor material. Step 1575 includes filling the via by depositing a plug of metal, such as metal plug or conductor 620, which contacts the layer of refractory metal and terminates in a top electrical contact, such as top electrical contact 630. Step 1580 includes growing a bottom electrical contact, such as bottom electrical contact 640, on the bottom of the silicon substrate.

Figure 34:
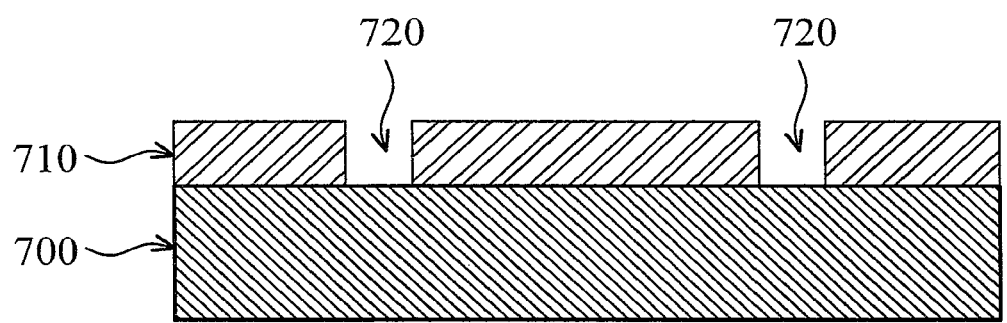
FIG. 34 shows steps for forming an embodiment illustrated in FIG. 35.
Figure 35:
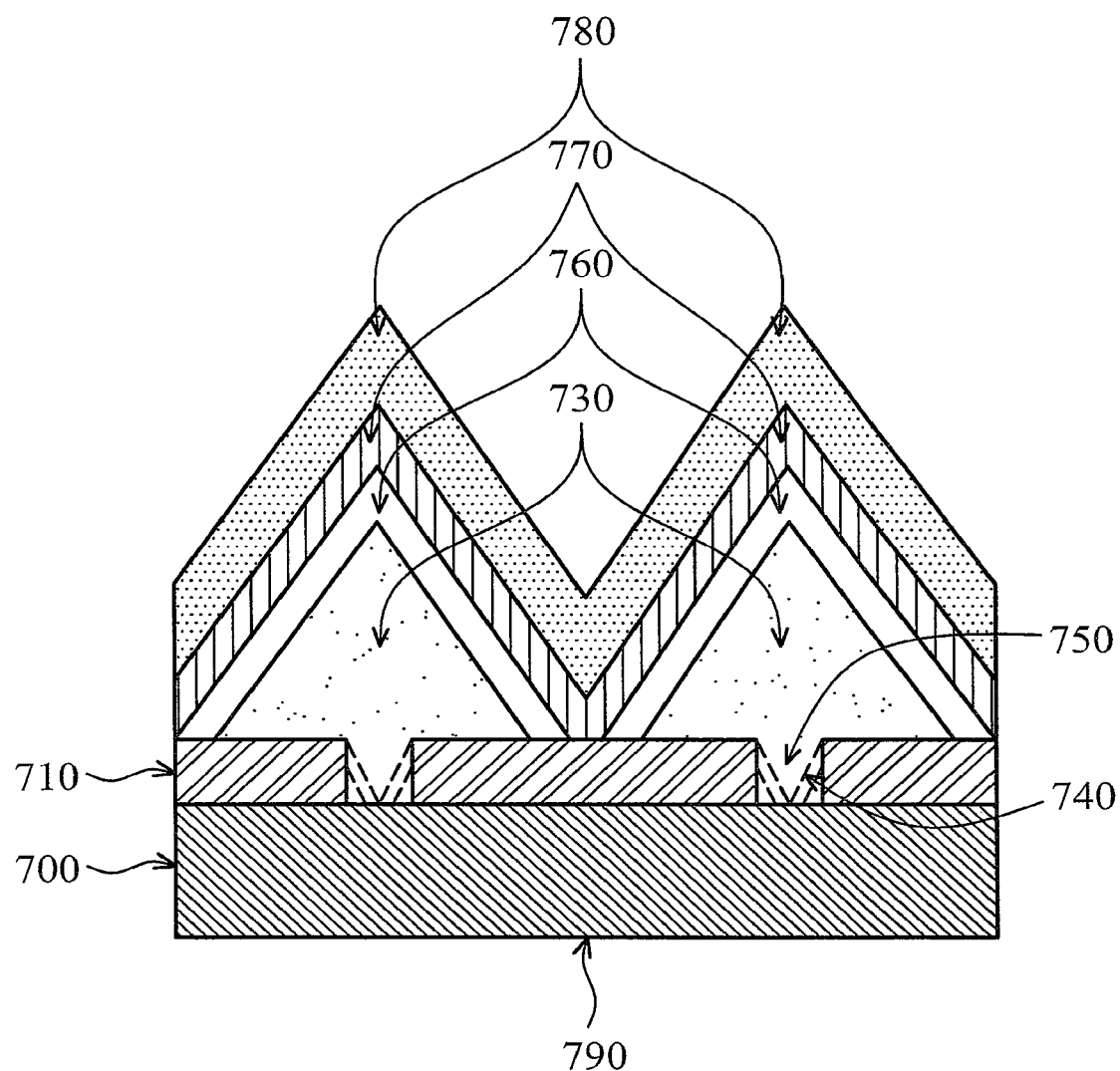
FIG. 35 is an embodiment of a diode which takes advantages of the fact that gallium nitride and other III-nitride semiconductor materials naturally grow in the shape of a six-sided pyramid when they grow out of a hole or a trench in a dielectric layer.

FIG. 35 illustrates a further embodiment intended primarily, but not necessarily, for light-emitting diodes, which takes advantage of the fact that when gallium nitride grows out of a hole or a trench in a dielectric layer, it naturally grows in the shape of a six-sided pyramid as a result of crystal faceting. To create this embodiment, a silicon substrate 700 is provided, as shown in FIG. 34. A layer of dielectric material 710 is deposited. A hole 720 is created in the dielectric material by a lithography process and/or an etch process, thereby exposing a portion of the surface of the silicon substrate. As an option, the surface of the silicon substrate 700 at the bottom of the hole may be cleaned by the process cited earlier.

A semiconductor material is grown to create the bottom diode region 730, as shown in FIG. 35. (In this embodiment, all the semiconductor materials may be III-nitride materials, such as gallium nitride.) The semiconductor material for the bottom diode region 730 fills the hole 720 and naturally grows upward out of the hole in the form of a six-sided pyramid.

As in other embodiments, the ratio of the depth to the hole 720 to the diameter of the hole 720 is preferably greater than or equal to 1 in order for the structure to be able to trap threading dislocations. Threading dislocations 740 may form at the interface between the bottom diode region 730 and the silicon substrate 700. These threading dislocations may propagate upward at an angle, intersect the sidewalls of the dielectric layer 710, and terminate within the trapping region 750, such that there may be relatively defect-free gallium nitride in the upper portion of the bottom diode region 730.

A semiconductor material is conformally grown around the pyramidal bottom diode region 730 to form the active diode region 760.

A semiconductor material is conformally grown around the pyramidal active diode region 760 to create the top diode region 770. As an option, it may be possible to grow the semiconductor material for the top diode region 770 in such a way that the top diode regions 770 on adjacent diodes merge. The advantage of this strategy may be that a single strip of metal serving as a top electrical contact 780 provides current for multiple diodes because current can flow through the top diode region 770 from one diode to the next.

Finally, top electrical contact 780 and a bottom electrical contact 790 are created. The top electrical contact 780 can be, for example, a strip of metal or a film of transparent conductor such as indium tin oxide. It may be useful to reduce or minimize the area devoted to the top electrical contact 780 because the top electrical contact 780 blocks the light emitted by the device. Even a "transparent" contact typically will not be 100% transmissive.

The structure shown in FIG. 35 offers various advantages. It can be simpler to grow than the other embodiments described in this disclosure because the gallium nitride naturally grows in six-sided pyramids. The surface area of the p-n diode is larger than the surface area of the silicon substrate 700. This advantage is important because it increases the photon output per unit surface area of the footprint of the device. The bottom diode region is not constrained to be a narrow pillar or fin, as in the above-described embodiments. This could potentially be an advantage over those embodiments, where a narrow bottom diode region might lead to a deleterious series resistance penalty at high current operation. The crystal surfaces of gallium nitride at the interface between the bottom diode region 730 and the active diode region 760, as well as the crystal surfaces of gallium nitride at the interface between the active diode region 760 and the top diode region 770, are semi-polar planes, which means the internal quantum efficiency of the LED will be higher than it would be if the crystal surfaces at those interfaces were polar c-planes.

As an alternate architecture, the embodiment illustrated in FIG. 35 may be configured by creating ART openings in the dielectric layer other than holes, such as, for example trenches.

Following are examples of process parameters to form the bottom, active, and top diode regions according to embodiments in this disclosure. First, a substrate and a patterned dielectric layer as known in the art are provided. Exemplary process parameters of growth conditions (e.g., CVD) for bottom, active, and top diode regions, for a GaN and InGaN-based LED, according to the embodiment of FIG. 35 are as follows. In this example, the bottom diode region can have two layers. Growth conditions for a first GaN layer as a low-temp buffer (e.g., 30 nm thick) include i) pressure: 100 Torr., ii) precursors: TMG and NH3, diluted in H2, iii) temperature: 530 C and iv) dopant: N-type dopant is silicon. Growth conditions for a second GaN layer as a hi-temp buffer (e.g., 500 nm thick) include i) pressure: 100 Torr., ii) precursors: TMG and NH3, diluted in H2, iii) temperature: 1030 C and iv) dopant: Ntype doping with silicon. In this example, the active diode region can have two layers. Growth conditions for a first layer of InGaN as a quantum well for emission (e.g., 2 nm thick) include i) pressure: 100 Torr., ii) precursors: TMG+TMI (Trimethylindium)+NH3, diluted in N2, iii) temperature: 740 C and iv) dopant: no doping. Growth conditions for a second layer of GaN as a barrier layer for carrier confinement (e.g., 15 nm thick) include i) pressure: 100 Torr., ii) precursors: TMG and NH3, diluted in H2, iii) temperature: 860 C and iv) dopant: N-type doping with silicon. In this example, the top diode region is at the active diode layer. Growth conditions for a layer of GaN (e.g., 100 nm thick) include i) pressure: 100 Torr., ii) precursors: TMG and NH3, diluted in H2, iii) temperature: 950 C and iv) dopant: P-type: dopant is magnesium. The top diode region can operate as a p contact layer.

The embodiment shown in. FIG. 35 is a semiconductor diode from III-nitride semiconductor materials such as gallium nitride on a silicon substrate that can comprise a silicon substrate 700; a dielectric layer 710 containing a hole 720 which exposes the surface of the silicon substrate, the hole 720 having substantially vertical sidewalls, the ratio of the depth of the hole 720 to the diameter of the hole 720 being greater than 1; a bottom diode region 730 of semiconductor material filling the hole and extending upward in the shape of a six-sided pyramid; a trapping region 750 in the lowest segment of the bottom diode region 730 wherein threading dislocations 740 intersect the curved sidewalls of the dielectric material 710 and terminate; an active diode region 760 of semiconductor material grown conformally around the bottom diode region 730; a top diode region 770 of semiconductor material grown conformally around the active diode region 760; a top electrical contact 780; and a bottom electrical contact 790.

Figure 36:
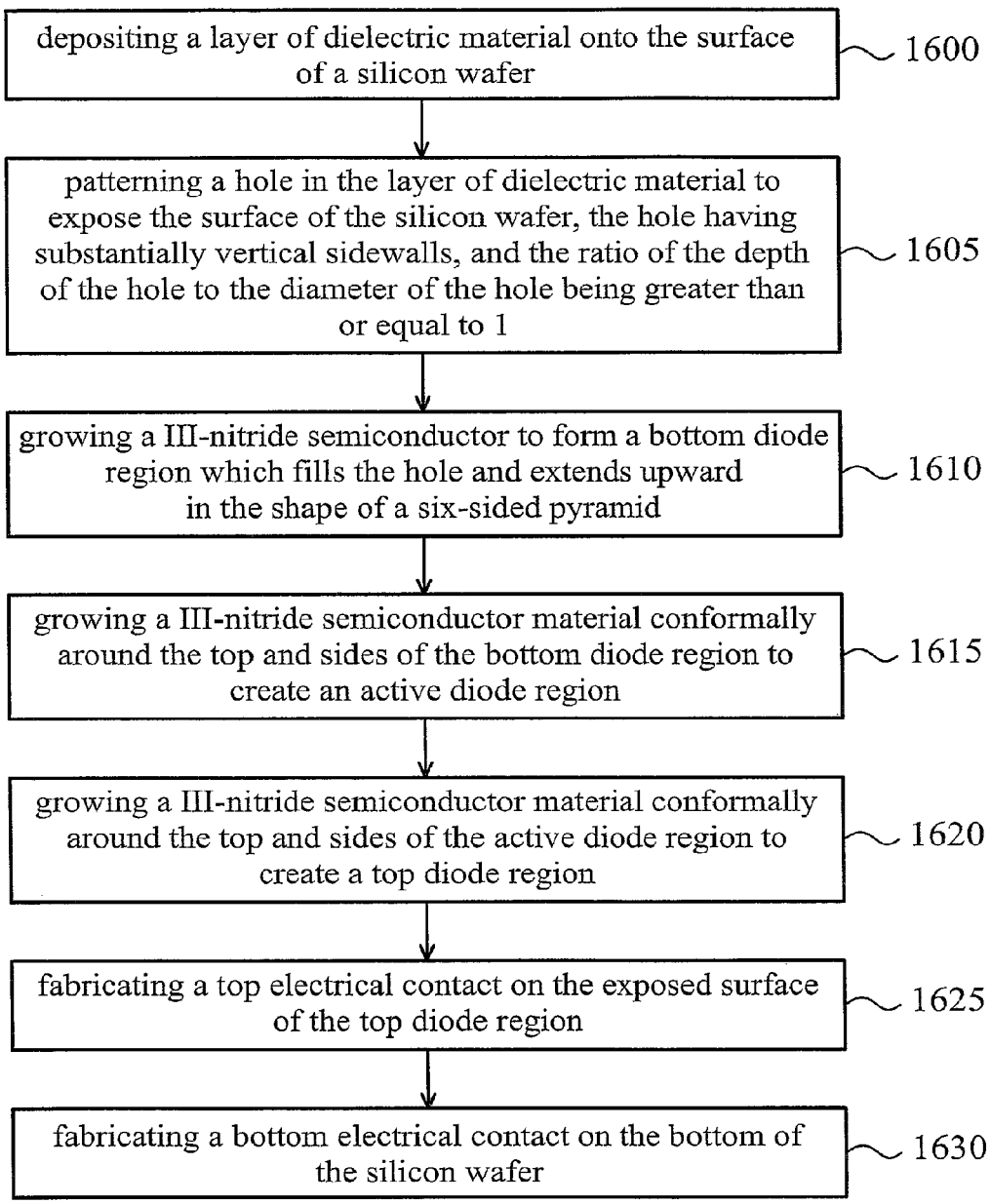
FIG. 36 summarizes a method according to an embodiment for forming the embodiment in FIG. 35.

FIG. 36 illustrates a method of fabricating the embodiment of FIG. 35. It is a method of creating a light-emitting diode made from III-nitride semiconductors on a silicon substrate comprising the following steps. Step 1600 includes depositing a layer of dielectric material, such as dielectric material 710, onto the surface of a silicon substrate, such as silicon substrate 700. Step 1605 includes patterning a hole, such as hole 720, in the layer of dielectric material to expose the surface of the silicon substrate, the hole having substantially vertical sidewalls, and the ratio of the depth of the hole to the diameter of the hole being greater than or equal to one. Step 1610 includes growing a III-nitride semiconductor material to form a bottom diode region, such as bottom diode region 730, which fills the hole and extends upwards in the shape of a six-sided pyramid. Step 1615 includes growing a III-nitride semiconductor material conformally around the top and sides of the bottom diode region to create an active diode region, such as active diode region 760. Step 1620 includes growing a III-nitride semiconductor material conformally around the top and sides of the active diode region to create a top diode region, such as top diode region 770. Step 1625 includes fabricating a top electrical contact, such as top electrical contact 780, on the exposed surface of the top diode region. Step 1630 includes fabricating a bottom electrical contact, such as bottom electrical contact 790, on the bottom of the silicon substrate.

Figure 37:
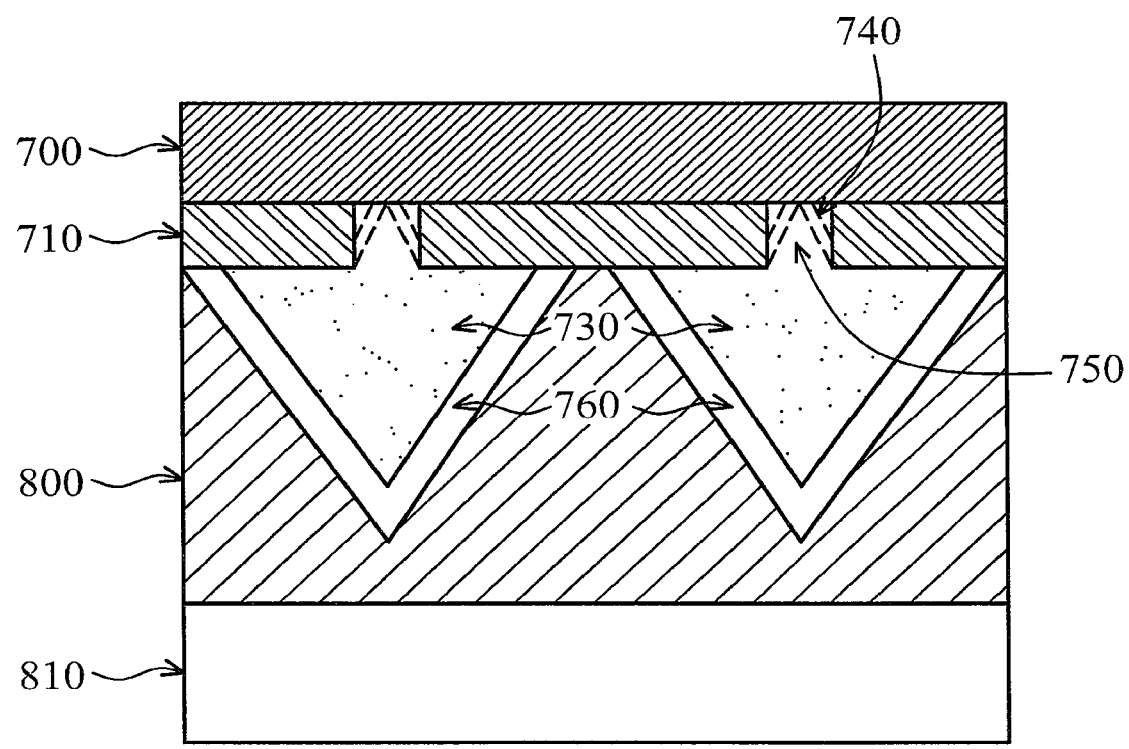
FIG. 37 illustrate steps for forming the embodiment in FIG. 38.
Figure 38:
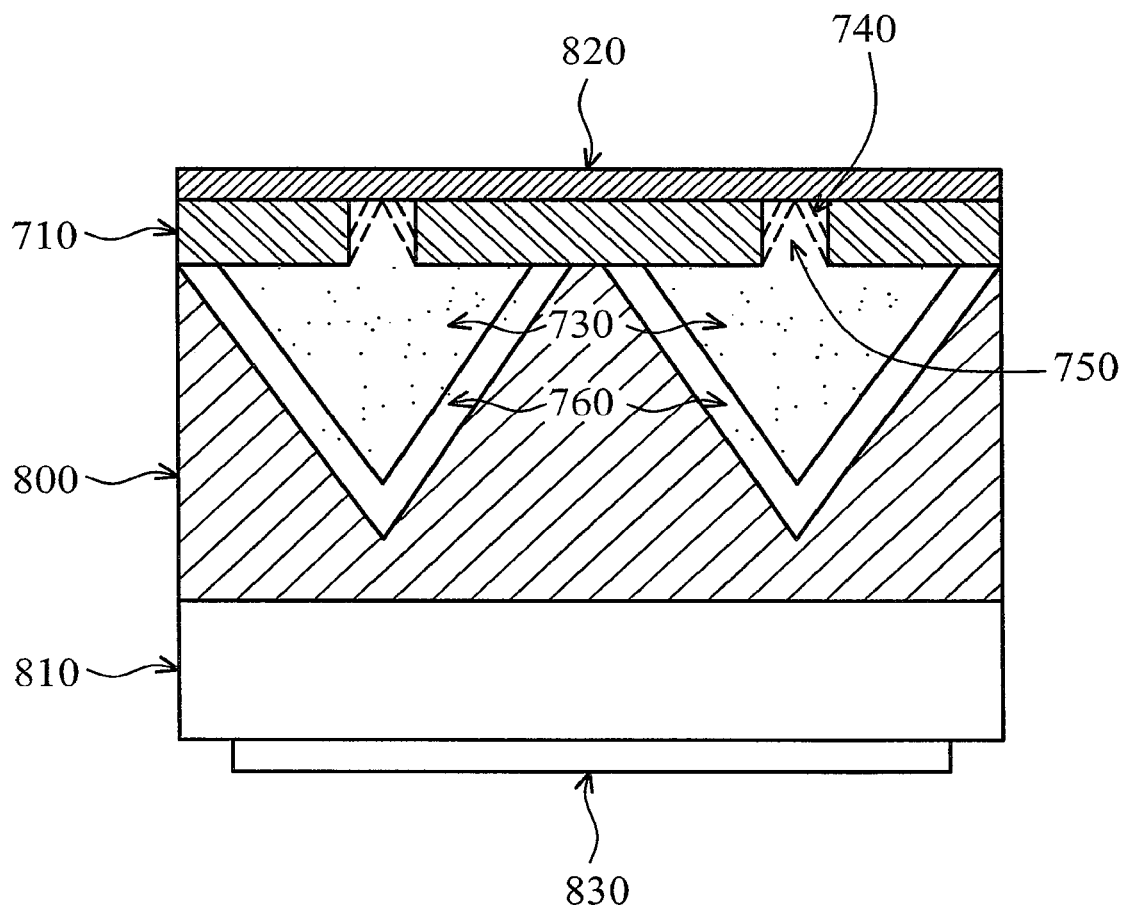
FIG. 38 is an embodiment of a variation of the embodiment in FIG. 35 in which the silicon substrate has been removed.

The embodiment shown in FIG. 38 is a variation of the embodiment of FIG. 35 in which the silicon substrate is removed to eliminate the possibility that it will absorb light generated in a light-emitting diode. The structure shown in FIG. 34 is first provided. A semiconductor material is grown to create the bottom diode region 730, as shown in FIG. 37. The semiconductor material for the bottom diode region 730 fills the hole 710 and grows in the form of a six-sided pyramid.

A III-nitride semiconductor material is conformally grown around the top and sides of the bottom diode region 730 to create an active diode region 760.

A III-nitride semiconductor material is conformally grown around the top and sides of the active diode region 760 to form a top diode region 800. In this case, the top diode region 800 continues to grow until the growth fronts from adjacent diodes coalesce. An optional step is to planarize the resultant surface of the top diode region 800, which can be preferable depending on the quality of that surface.

The structure is inverted, and a handle substrate 810 is bonded to the surface of the top diode region 800 (which is now on the bottom of the structure), as shown in FIG. 38. The handle substrate 810 can be part of an LED packaging fixture. In some embodiments the handle substrate 810 is electrically conductive, and in others it contains conductor elements which will serve as contacts for the top diode region 800.

The initial silicon substrate 700 is removed by one or more methods such as grinding, etching with a chemical such as tetramethyl ammonium hydroxide, or laser ablation.

Top electrical contact 820 and bottom electrical contact 830 are created to generate the completed structure shown in FIG. 38.

The embodiment of FIG. 38 may offer the same advantages as the embodiment of FIG. 35 and may additionally offers greater extraction efficiency as a light-emitting diode because it contains no silicon substrate 700 to absorb any of the internally generated light.

The embodiment shown in FIG. 38 can include a semiconductor diode from III-nitride semiconductor materials such as gallium nitride on a silicon substrate comprising a layer of dielectric material 710 containing a hole 720, the hole 720 having substantially vertical sidewalls, and the ratio of the depth of the hole 720 to the diameter of the hole 720 being greater to or equal to 1; a bottom diode region 730 of semiconductor material which fills the hole 720 and then takes the configuration of a six-sided pyramid; a trapping region 750 within the bottom diode region 730 wherein threading dislocations 740 intersect the sidewall of the hole (160 and terminate; an active diode region 760 of semiconductor material grown conformally around the bottom diode region 730; a top diode region 800 of semiconductor material grown conformally around the active diode region; a handle substrate 810; top electrical contacts 820; and bottom electrical contacts 830.

Figure 39:
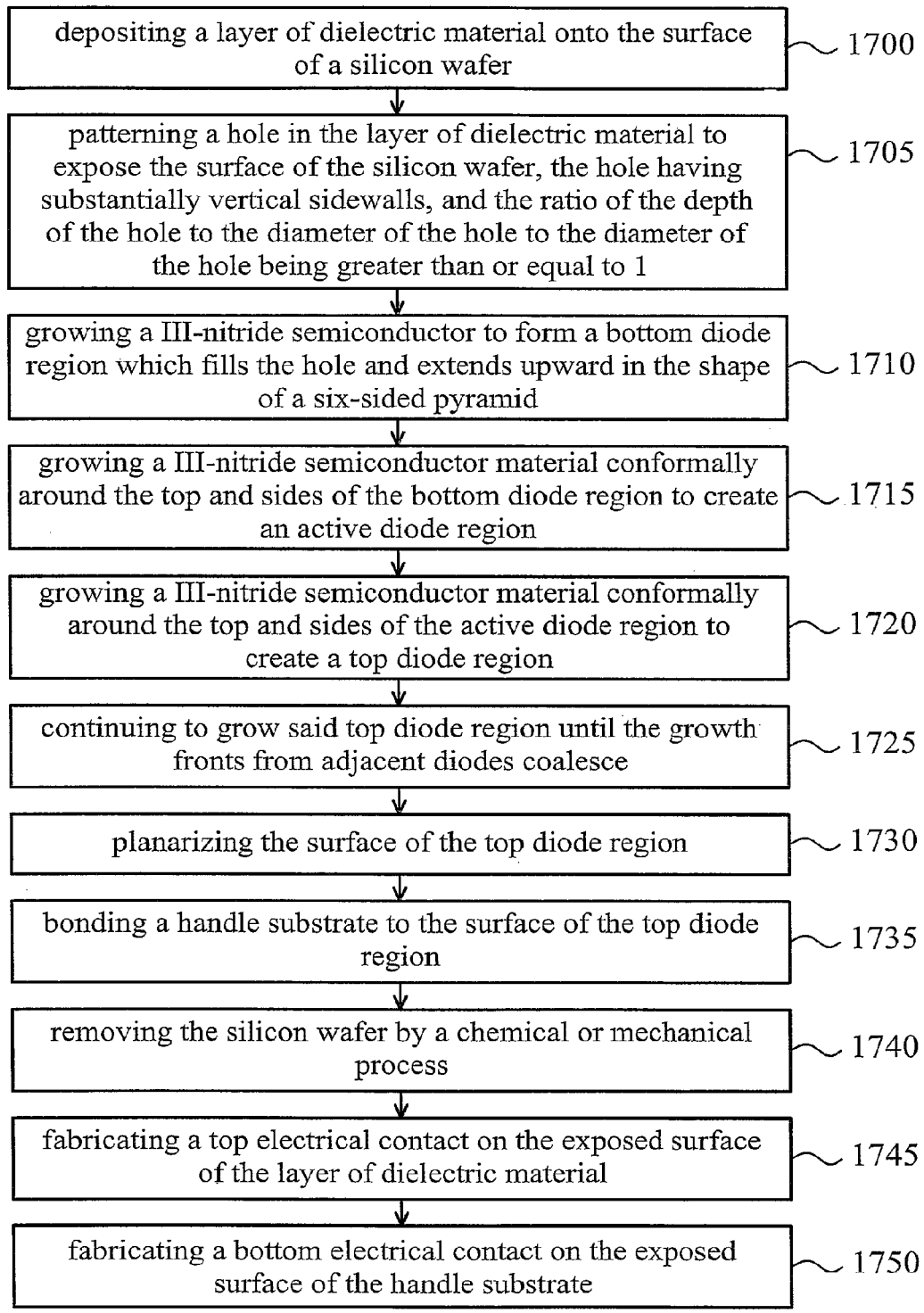
FIG. 39 summarizes a method according to an embodiment for forming the embodiment in FIG. 38.

FIG. 39 illustrates a method of fabricating the embodiment of FIG. 38. It is a method of creating a light-emitting diode made from III-nitride semiconductors on a silicon substrate comprising the following steps. Step 1700 includes depositing a layer of dielectric material, such as dielectric material 710, onto the surface of a silicon substrate, such as silicon substrate 700. Step 1705 includes patterning a hole, such as hole 720, in the layer of dielectric material to expose the surface of the silicon substrate, the hole having substantially vertical sidewalls, and the ratio of the depth of the hole to the diameter of the hole being greater than or equal to 1. Step 1710 includes growing a III-nitride semiconductor material to form a bottom diode region, such as bottom diode region 730, which fills the hole and extends upward in the shape of a six-sided pyramid. Step 1715 includes growing a III-nitride semiconductor material conformally around the top and sides of the bottom diode region to create an active diode region, such as active diode region 760. Step 1720 includes growing a III-nitride semiconductor material conformally around the top and sides of the active diode region to create a top diode region, such as top diode region 800. Step 1725 includes continuing to grow the top diode region until the growth fronts from adjacent diodes coalesce. Step 1730 includes planarizing the surface of the top diode region. Step 1735 includes bonding a handle substrate, such as handle substrate 810, to the surface of the top diode region. Step 1740 includes removing the silicon substrate by a chemical or mechanical process. Step 1745 includes fabricating a top electrical contact, such as top electrical contact 820, on the exposed surface of the layer of the dielectric material. Step 1750 includes fabricating a bottom electrical contact, such as bottom electrical contact 830, on the exposed surface of the handle substrate.

Embodiments of the disclosure provide novel and useful architectures for diodes made from compound semiconductors or other non-lattice-matched semiconductors deposited on silicon substrates by Aspect Ratio Trapping. The semiconductor diode is the fundamental building block of solar cells, light-emitting diodes, resonant tunneling diodes, semiconductor lasers, and other devices.

One aspect of the present disclosure is to reduce the costs of solar cells, light-emitting diodes, and other compound semiconductor devices by creating them on high-quality, large-area, low-cost silicon wafers instead of smaller, more expensive substrates.

Another aspect of the present disclosure is to improve the extraction efficiency and the internal quantum efficiency of light-emitting diodes by exploiting non-polar planes of III-nitride semiconductors.

As such, one embodiment of the present disclosure is directed to a diode comprising a substrate, a dielectric material including an opening that exposes a portion of the substrate, the opening having an aspect ratio of at least 1, a bottom diode material disposed in and above the opening, the bottom diode material comprising a semiconductor material that is lattice mismatched to the substrate, a top diode material proximate the upper region of the bottom diode material, and an active diode region between the top and bottom diode materials, the active diode region including a surface extending away from the top surface of the substrate.

The substrate may be selected from the group consisting of silicon, sapphire, and silicon carbide. The substrate may be a single crystal silicon wafer, and may have a crystal orientation of (111) or (100). The dielectric material may comprise silicon dioxide or silicon nitride. The semiconductor material may comprise a Group IIIV compound, a Group II-VI compound, a Group IV alloy, or combinations thereof.

The active diode region may comprise a p-n junction formed by a junction of the top and bottom diode materials. The active diode region may comprise a material different from the top and bottom diode materials, and the active diode region may form an intrinsic region of a p-i-n junction formed between the top and bottom diode materials. The active diode region may comprise multiple quantum wells formed between the top and bottom diode materials.

The opening may be a trench or may be a hole having an aspect ratio of at least 1 in two perpendicular axes.

The bottom diode material may include an n-type dopant, and the top diode material may include a p-type dopant.

The upper region of the bottom diode material may form a fin above the opening. The upper region of the bottom diode material may form a pillar above the opening.

The diode may further comprises a contact formed over the top diode region. The contact may comprise a transparent conductor. The diode may further comprise a second contact formed adjacent the substrate.

Another embodiment of the present disclosure is directed to a diode comprising a substrate, a dielectric material including an opening that exposes a portion of the substrate, a bottom diode material including a lower region disposed at least partly in the opening and an upper region extending above the opening, the lower region including a plurality of misfit dislocations that terminate below the upper region, the bottom diode material comprising a semiconductor material that is lattice mismatched to the substrate, a top diode material proximate the upper region of the bottom diode material, and an active light emitting diode region between the top and bottom diode materials, the active diode region including a surface extending away from the top surface of the substrate.

The active light emitting diode region may comprise a p-n junction formed by a junction of the top and bottom diode materials. The active light emitting diode region may comprise a material different from the top and bottom diode materials, and the active light emitting diode region may form an intrinsic region of a p-i-n junction formed between the top and bottom diode materials. The active light emitting diode region may comprise multiple quantum wells formed between the top and bottom diode materials.

The substrate may be selected from the group consisting of silicon, sapphire, and silicon carbide. The substrate may be a single crystal silicon wafer. The single crystal silicon wafer may have a crystal orientation of (111) or (100). The dielectric material may comprise silicon dioxide or silicon nitride. The semiconductor material may comprise a Group IIIV compound, a Group II-VI compound, a Group IV alloy, or combinations thereof.

The opening may be a trench or may be a hole having an aspect ratio of at least 1 in two perpendicular axes.

The bottom diode material may include an n-type dopant and the top diode material includes a p-type dopant. The upper region of the bottom diode material may form a fin above the opening. The upper region of the bottom diode material may form a pillar above the opening.

The diode may further comprises a contact formed over the top diode region. The contact may comprises a transparent conductor. The diode may further comprise a second contact formed adjacent the substrate.

Another embodiment of the present disclosure is directed to a diode comprising a substrate, a dielectric layer having a thickness of no more than about 20 nm above the substrate, the dielectric layer including an opening that exposes a portion of the substrate, a bottom diode material including a lower region disposed at least partly in the opening and an upper region extending above the opening, the bottom diode material comprising a semiconductor material that is lattice mismatched to the substrate, a top diode material proximate the upper region of the bottom diode material, and an active diode region between the top and bottom diode materials, the active diode region including a surface extending away from the top surface of the substrate.

The active diode region may comprise a p-n junction formed by a junction of the top and bottom diode materials. The active diode region may comprise a material different from the top and bottom diode materials, and the active diode region may form an intrinsic region of a p-i-n junction formed between the top and bottom diode materials. The active diode region may comprise multiple quantum wells formed between the top and bottom diode materials.

The substrate may be selected from the group consisting of silicon, sapphire, and silicon carbide. The substrate may be a single crystal silicon wafer. The single crystal silicon wafer may have a crystal orientation of (111) or (100). The dielectric material may comprise silicon dioxide or silicon nitride. The semiconductor material may comprise a Group IIIV compound, a Group II-VI compound, a Group IV alloy, or combinations thereof.

The opening may be a trench or may be a hole having an aspect ratio of at least 1 in two perpendicular axes.

The bottom diode material may include an n-type dopant and the top diode material may include a p-type dopant. The upper region of the bottom diode material may form a fin above the opening. The upper region of the bottom diode material may form a pillar above the opening.

The diode may further comprise a contact formed over the top diode region. The contact may comprise a transparent conductor. The diode may further comprise a second contact formed adjacent the substrate.

Another embodiment of the present disclosure is directed to a diode comprising a substrate, a dielectric material disposed above the substrate, the dielectric material including a plurality of openings that each expose a portion of the substrate, a plurality of bottom diode sections comprising a bottom diode material, each section including a lower region disposed in an opening and an upper region extending above the opening, the bottom diode material comprising a semiconductor material that is lattice mismatched to the substrate, a contiguous top diode section proximate the upper regions of the bottom diode section, the top diode section comprising a top diode material, and a plurality of active diode regions between the top and bottom diode materials, the active diode regions each including a surface extending away from the top surface of the substrate.

The plurality of active diode regions may comprise a p-n junction formed by a junction of the contiguous top and plurality of bottom diode materials. The plurality of active diode regions may comprise a material different from the contiguous top and plurality of bottom diode materials, and the plurality of active diode regions may form an intrinsic region of a p-i-n junction formed between the contiguous top and plurality of bottom diode materials. The plurality of active diode regions may comprise multiple quantum wells formed between the contiguous top and plurality of bottom diode materials.

The substrate may be selected from the group consisting of silicon, sapphire, and silicon carbide. The substrate may be a single crystal silicon wafer. The single crystal silicon wafer may have a crystal orientation of (111) or (100). The dielectric material may comprise silicon dioxide or silicon nitride. The semiconductor material may comprise a Group IIIV compound, a Group II-VI compound, a Group IV alloy, or combinations thereof.

The opening may be a trench or may be a hole having an aspect ratio of at least 1 in two perpendicular axes.

The bottom diode material may include an n-type dopant and the top diode material may include a p-type dopant. The upper regions of the plurality of bottom diode materials may form a fin above the opening. The upper regions of the plurality of bottom diode materials may form a pillar above the opening.

The diode may further comprise a contact formed over the contiguous top diode region. The contact may comprise a transparent conductor. The diode may further comprise a second contact formed adjacent the substrate.

Another embodiment of the present disclosure is directed to a diode comprising a substrate, a bottom diode material that is lattice mismatched to the substrate extending above the top surface and including a bottom diode section having a width across the top surface and a height above the top surface, the height being greater than the width, a top diode material proximate the bottom diode material, and an active light emitting diode region between the top and bottom diode materials, the active diode region including a surface extending away from the top surface of the substrate.

The active light emitting diode region may comprise a p-n junction formed by a junction of the top and bottom diode materials. The active light emitting diode region may comprise a material different from the top and bottom diode materials, and the active light emitting diode region may form an intrinsic region of a p-i-n junction formed between the top and bottom diode materials. The active light emitting diode region may comprise multiple quantum wells formed between the top and bottom diode materials.

The substrate may be selected from the group consisting of silicon, sapphire, and silicon carbide. The substrate may be a single crystal silicon wafer. The single crystal silicon wafer may have a crystal orientation of (111) or (100). The dielectric material may comprise silicon dioxide or silicon nitride.

The bottom diode material may include an n-type dopant and the top diode material may include a p-type dopant.

The diode may further comprise a contact formed over the top diode region. The contact may comprise a transparent conductor. The diode may further comprise a second contact formed adjacent the substrate.

Another embodiment of the present disclosure is directed to a method of making a diode, the method comprising depositing a layer of a dielectric material onto a substrate, patterning first and second openings in the dielectric material to expose portions of the substrate, each of the openings having an aspect ratio of at least 1, forming a first bottom diode region by growing a compound semiconductor material that is lattice mismatched to the substrate in and above the first opening, forming a second bottom diode region by growing a compound semiconductor material that is lattice mismatched to the substrate in and above the second opening, forming a first active diode region adjacent the first bottom diode region, forming a second active diode region adjacent the second bottom diode region, and forming a single top diode region adjacent the first active diode region and the second active diode region.

The first and second active diode regions may contain multiple quantum wells.

The substrate may be selected from the group consisting of silicon, sapphire, and silicon carbide. The substrate may be a single crystal silicon wafer. The substrate may have a crystal orientation of (111) or (100). The dielectric material may comprise silicon dioxide or silicon nitride.

The first and second openings may be trenches or may be holes. The semiconductor material may comprise a Group III-V compound, a Group IIVI compound, a Group IV alloy, or combinations thereof.

Another embodiment of the present disclosure is directed to a diode comprising a substrate, a dielectric material above the substrate, the dielectric material including an array of openings, a plurality of bottom diode sections formed in and above the array of openings, each bottom diode section including at least one sidewall that extends away from the dielectric material, the bottom diode sections comprising a semiconductor material that is lattice mismatched to the substrate, a plurality of top diode sections proximate the bottom diode sections, and a plurality of active diode regions between the top and bottom diode sections, the active diode regions each including a surface extending away from the top surface of the substrate.

Each opening may have an aspect ratio of at least 0.5, at least 1, at least 2 or greater than 3. Each bottom diode section may include at least one sidewall that extends substantially vertically upward above the dielectric material. Each bottom diode section may have an hexagonal cross-section. The openings may be arranged in an hexagonal array. The top diode sections may be formed from a single, contiguous layer of material. The diode may be a light emitting diode.

Another embodiment of the present disclosure is directed to a diode comprising a substrate, a first dielectric layer above the substrate, a layer of a refractory metal above the first dielectric layer, an opening through the first dielectric layer and the layer of refractory metal, the opening having dielectric sidewalls, a bottom diode region comprising a compound semiconductor material that is lattice mismatched to the substrate, the bottom diode region disposed in and above the opening, a top diode region proximate the bottom diode region, and an active diode region between the top diode region and a top portion of the bottom diode region.

The opening may have an aspect ratio of at least 1, and may be a trench. The diode may further comprise a second dielectric layer covering at least a portion of the top diode region. The diode may further comprise a second opening extending through the second dielectric layer and a first contact comprising a metal plug, the metal plug filling the second opening and contacting the layer of refractory metal. The diode may further comprise a second contact at the bottom of the substrate.

Another embodiment of the present disclosure is directed to a method of making a diode, the method comprising depositing a first layer of dielectric material above a substrate, depositing a layer of a refractory metal above the first layer of dielectric material, depositing a second layer of dielectric material above the layer of refractory material, forming a first opening defined by sidewalls extending through the first layer of dielectric material, layer of refractory metal, and second layer of dielectric material to expose a surface of the substrate, forming a layer of dielectric material on the sidewalls of the opening, forming a bottom diode region by growing a compound semiconductor material that is lattice mismatched to the substrate in and above the opening, removing the second dielectric layer, forming an active diode region adjacent a portion of the bottom diode region, and forming a top diode region that adjacent the active diode region.

The method may further comprise depositing a third layer of dielectric material on the top diode region that conformally covers the active diode region and the refractory metal, creating a via through the third layer of dielectric material and a portion of the top diode region that covers the refractory metal, filling the via with a plug a metal such that the plug is in contact with the layer of refractory metal, and fabricating a bottom electrical contact.

Another embodiment of the present disclosure is directed to a diode comprising a substrate, a dielectric layer above the substrate, the dielectric layer including an opening having an aspect ratio of at least 1, a bottom diode region disposed in and above the opening, the bottom diode region comprising a compound semiconductor material having an hexagonal crystal lattice, the bottom diode region including sidewalls defined by non-polar planes of the compound semiconductor material, a top diode region proximate the bottom diode region, and an active diode region between the top and bottom diode regions.

The substrate may be a crystalline substrate having a cubic lattice. The non-polar plane may be an a-plane or may be an m-plane. The opening may be a trench or may be a hole.

Another embodiment of the present disclosure is directed to a diode comprising a substrate, a dielectric layer above the substrate including an opening, a semiconductor material that is lattice mismatched to the substrate disposed in the opening, and a pyramidal diode comprising a pyramidal p-n junction disposed above the opening.

The pyramidal diode may further include a top diode material, an active diode material, and a bottom diode material. The pyramidal diode may have a height of greater than about 3 microns or may have a height of greater than about 5 microns. The pyramidal diode may include a top contact layer having a thickness of less than about 2 microns, or a top contact layer having a thickness of less than about 0.5 microns. The pyramidal diode may include a bottom contact layer.

The diode may further comprise multiple pyramidal diodes having the respective top diode materials coalesced together. The diode may further include a transparent top contact layer. The diode may further include a handle substrate.

The substrate may be selected from the group consisting of silicon, sapphire, and silicon carbide. The semiconductor material may be selected from the group consisting of a Group III-V compound, a Group II-VI compound, and a Group IV alloy.

Another embodiment of the present disclosure is directed to a method of forming a diode comprising providing a substrate, providing a dielectric including an opening having an aspect ratio of at least 1 above the substrate, forming a compound semiconductor material that is lattice mismatched to the substrate in the opening, forming a diode comprising a p-n junction above the opening, forming a dielectric material having a substantially planar surface above the diode, bonding a handle wafer to the substantially planar surface, and removing the substrate.

The opening may be a trench or may be a hole. The diode may include a top diode region, a bottom diode region, and an active diode region. The diode may include a plurality of top diode regions, a plurality of bottom diode regions, and a plurality of active diode regions. The plurality of top diode regions may be coalesced together.

Another embodiment of the present disclosure is directed to a diode comprising a substrate, a dielectric layer above the substrate including an array of openings, the openings having a width less than 100 nm, a plurality of nanostructures comprising a semiconductor material that is lattice mismatched to the substrate disposed in and above the array of openings, the nanostructures having a substantially uniform height extending at least 100 nm above the dielectric layer, and a plurality of diode junctions formed on the nanostructures, the diode junctions including active regions using the nanostructure sidewalls.

The nanostructures may be in the form of a fin or pillar. The width of the nanostructure may be selected from the group consisting of about 5 nm, about 10 nm, about 20 nm, and about 50 nm. The height of the nanostructure may be selected from the group consisting of about 100 nm, about 200 nm, about 500 nm, and about 1000 nm.

Another embodiment of the present disclosure is directed to a diode comprising a first diode material comprising a substantially planar bottom surface and a top surface having a plurality of cavities, a second diode material comprising a substantially planar top surface and a bottom surface extending into the plurality of cavities in the first diode material, and an active diode region between the first and second diode materials.

The diode may further comprise a substrate having a substantially planar surface adjacent the bottom surface of the first diode material or the top surface of the second diode material.

The active diode region may comprise a p-n junction formed by a junction of the first and second diode materials. The active diode region may comprise a material different from the first and second diode materials, and the active diode region may form an intrinsic region of a p-i-n junction formed between the first and second diode materials. The active diode region may comprise multiple quantum wells formed between the first and second diode materials.

A first diode material may comprise a III-V material. The first diode material may comprise GaN. The cavities may include a polar GaN surface.

The cavities may define trenches or may define holes having an aspect ratio of at least 1. The surface area of the cavities may exceed the surface area of the bottom surface of the first diode material. The surface area of the cavities may be at least 150% of the surface area of the bottom surface of the first diode material, or may be at least 200% of the surface area of the bottom surface of the first diode material.

Embodiments of the application provide methods, structures or apparatus described with respect to "fin" configured structures based on growth control from trench orientations. As would be recognized by one skilled in the art based on the disclosure herein, the trench orientation could be another shaped opening such as a hole, recess, square or ring, for example, which would result in other three-dimensional semiconductor structures or apparatus.

Embodiments of the application provide methods, structures or apparatus that may use and/or form by epitaxial growth or the like. For example, exemplary suitable epitaxial growth systems may be a single-wafer or multiple-wafer batch reactor. Various CVD techniques may be used. Suitable CVD systems commonly used for volume epitaxy in manufacturing applications include, for example, an Aixtron 2600 multi-wafer system available from Aixtron, based in Aachen, Germany; an EPI CENTURA single-wafer multi-chamber systems available from Applied Materials of Santa Clara, Calif.; or EPSILON single-wafer epitaxial reactors available from ASM International based in Bilthoven, The Netherlands.

Any reference in this specification to "one embodiment," "an embodiment," "example embodiment," "another embodiment," "other embodiments," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc. In addition, exemplary diagrams illustrate various methods in accordance with embodiments of the present disclosure. Such exemplary method embodiments are described herein using and can be applied to corresponding apparatus embodiments, however, the method embodiments are not intended to be limited thereby.

Although few embodiments of the present invention have been illustrated and described, it would be appreciated by those skilled in the art that changes may be made in these embodiments without departing from the principles and spirit of the invention. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are intended to be embraced therein. As used in this disclosure, the term "preferably" is non-exclusive and means "preferably, but not limited to." Terms in the claims should be given their broadest interpretation consistent with the general inventive concept as set forth in this description. For example, the terms "coupled" and "connect" (and derivations thereof) are used to connote both direct and indirect connections/couplings. As another example, "having" and "including", derivatives thereof and similar transitional terms or phrases are used synonymously with "comprising" (i.e., all are considered "open ended" terms)—only the phrases "consisting of" and "consisting essentially of" should be considered as "close ended". Claims are not intended to be interpreted under 112 sixth paragraph unless the phrase "means for" and an associated function appear in a claim and the claim fails to recite sufficient structure to perform such function.

What is claimed is:

1. A method comprising:
depositing a first dielectric layer above a substrate, the substrate comprising a crystalline semiconductor material;
depositing a refractory metal layer above the first dielectric layer;
depositing a second dielectric layer above the refractory metal layer;
forming an opening defined by sidewalls extending through the first dielectric layer, the refractory metal layer, and the second dielectric layer, the opening exposing a surface of the substrate;
forming a dielectric material on the sidewalls of the opening;
forming a bottom diode region by growing a compound semiconductor material in and above the opening, the compound semiconductor material being lattice mismatched to the crystalline semiconductor material;
removing at least a portion of the second dielectric layer;
forming an active diode region adjacent a portion of the bottom diode region; and
forming a top diode region adjacent the active diode region.

2. The method of claim 1 further comprising:
depositing a third dielectric layer on the top diode region that covers the active diode region and the refractory metal layer;
creating a via through the third dielectric layer and a portion of the top diode region that covers the refractory metal layer;
filling the via with a plug such that the plug is in contact with the refractory metal layer; and
fabricating a bottom electrical contact on the substrate.

3. The method of claim 1, wherein the top diode region is formed to contact the refractory metal layer.

4. The method of claim 1, wherein the forming the dielectric material on the sidewalls of the opening comprises:
conformally depositing a layer of the dielectric material above the second dielectric layer and in the opening; and
anisotropically etching the layer of the dielectric material such that the dielectric material remains on the sidewalls of the opening.

5. The method of claim 1, wherein the refractory metal layer comprises tungsten.

6. The method of claim 1, wherein substantially all of threading dislocations in the compound semiconductor material arising from the lattice mismatch with the crystalline semiconductor material terminating at the dielectric material on the sidewalls of the opening.

7. The method of claim 1, wherein the growing the compound semiconductor material in and above the opening forms a fin of the compound semiconductor material above the opening.

8. The method of claim 1, wherein the growing the compound semiconductor material in and above the opening forms a column of the compound semiconductor material above the opening.

9. A method comprising:
forming a multi-layer structure on a substrate, the substrate comprising a first crystalline semiconductor material, the multi-layer structure comprising a first dielectric layer over the substrate, a refractory metal layer over the first dielectric layer, and a second dielectric layer over the refractory metal layer, an opening being through the multi-layer structure to expose the first crystalline semiconductor material;
forming a dielectric spacer along a sidewall of the opening;
forming a bottom diode region by growing a second crystalline semiconductor material in and above the opening;
forming an active diode region adjacent a portion of the bottom diode region; and
forming a top diode region adjacent the active diode region, the top diode region being electrically coupled to the refractory metal layer.

10. The method of claim 9, wherein the second crystalline semiconductor material is lattice mismatched to the first crystalline semiconductor material, threading dislocations in the second crystalline semiconductor material arising from the lattice mismatch with the first crystalline semiconductor material terminating in the opening.

11. The method of claim 9 further comprising:
forming a third dielectric layer over the top diode region; and
forming a plug through the third dielectric layer and contacting the refractory metal layer.

12. The method of claim 9 further comprising removing at least a portion of the second dielectric layer, the top diode region being formed to contact the refractory metal layer.

13. The method of claim 9, wherein the second crystalline semiconductor material forms a fin extending above the opening.

14. The method of claim 9, wherein the second crystalline semiconductor material forms a column extending above the opening.

15. A method comprising:
forming a dielectric layer on a first substrate, the first substrate comprising a first crystalline semiconductor material, a first opening and a second opening each being through the dielectric layer and exposing the first crystalline semiconductor material;
forming a first bottom diode region by growing a first portion of a second crystalline semiconductor material in and extending out of the first opening;
forming a second bottom diode region by growing a second portion of a second crystalline semiconductor material in and extending out of the second opening;
forming a first active diode region on the first bottom diode region, and a second active diode region on the second bottom diode region, the first active diode region being physically separated from the second active diode region, a surface of the first portion of the second crystalline semiconductor material at an interface between the first active diode region and the first bottom diode region being a semi-polar plane, a surface of the second portion of the second crystalline semiconductor material at an interface between the second active diode region and the second bottom diode region being a semi-polar plane; and
forming a continuous top diode region on the first active diode region and the second active diode region.

16. The method of claim 15, wherein the each of the first portion and the second portion of the second crystalline semiconductor material has a pyramidal shape extending out of the first opening and the second opening, respectively.

17. The method of claim 15, wherein second crystalline semiconductor material is lattice mismatched to the first crystalline semiconductor material, threading dislocations in the first portion of the second crystalline semiconductor material arising from the lattice mismatch with the first crystalline semiconductor material terminating in the first opening, threading dislocations in the second portion of the second crystalline semiconductor material arising from the lattice mismatch with the first crystalline semiconductor material terminating in the second opening.

18. The method of claim 15 further comprising:
forming a first contact on the top diode region; and
forming a second contact on the first substrate.

19. The method of claim 15 further comprising:
bonding a second substrate to the continuous top diode region; and
removing the first substrate.

20. The method of claim 19 further comprising:
forming a first contact on the second substrate; and
forming a second contact on the dielectric layer and the second crystalline semiconductor material.

* * * * *